(12) United States Patent
Facchetti et al.

(10) Patent No.: US 9,035,287 B2
(45) Date of Patent: May 19, 2015

(54) POLYMERIC MATERIALS FOR USE IN METAL-OXIDE-SEMICONDUCTOR FIELD-EFFECT TRANSISTORS

(71) Applicant: Polyera Corporation, Skokie, IL (US)

(72) Inventors: Antonio Facchetti, Chicago, IL (US); Daniel Batzel, Skokie, IL (US); Jing Chen, Skokie, IL (US); Chun Huang, Skokie, IL (US); Shaofeng Lu, Skokie, IL (US); William Christopher Sheets, Chicago, IL (US); Jingqi Wang, Evanston, IL (US); Yu Xia, Skokie, IL (US)

(73) Assignee: Polyera Corporation, Skokie, IL (US)

( * ) Notice: Subject to any disclaimer, the term of this patent is extended or adjusted under 35 U.S.C. 154(b) by 260 days.

(21) Appl. No.: 13/844,129

(22) Filed: Mar. 15, 2013

(65) Prior Publication Data
US 2014/0217395 A1    Aug. 7, 2014

Related U.S. Application Data

(60) Provisional application No. 61/759,406, filed on Feb. 1, 2013.

(51) Int. Cl.
*H01L 29/786* (2006.01)
*H01L 51/30* (2006.01)
*H01L 51/05* (2006.01)

(52) U.S. Cl.
CPC ........ *H01L 29/7869* (2013.01); *H01L 51/0545* (2013.01); *H01L 51/052* (2013.01)

(58) Field of Classification Search
CPC .............. H01L 51/052; H01L 51/0545; H01L 29/7869

USPC ........................ 257/43, 60, E29.273; 437/487
See application file for complete search history.

(56) References Cited

U.S. PATENT DOCUMENTS

| | | | |
|---|---|---|---|
| 4,837,256 A | 6/1989 | Gardner et al. | 524/141 |
| 7,696,298 B2 | 4/2010 | Hay et al. | 528/211 |
| 2005/0065278 A1 | 3/2005 | Mercado et al. | 524/606 |
| 2006/0155096 A1 | 7/2006 | Matsumoto et al. | 528/76 |
| 2008/0067503 A1* | 3/2008 | Kim et al. | 257/40 |
| 2008/0081205 A1 | 4/2008 | Agata et al. | 428/500 |
| 2008/0161524 A1* | 7/2008 | Yan et al. | 526/321 |
| 2010/0234479 A1 | 9/2010 | Lalgudi et al. | 521/30 |
| 2010/0237337 A1* | 9/2010 | Kamura et al. | 257/40 |
| 2010/0252112 A1* | 10/2010 | Watson | 136/263 |
| 2011/0180784 A1* | 7/2011 | Shukla et al. | 257/40 |
| 2011/0284849 A1* | 11/2011 | Marks et al. | 257/57 |
| 2012/0056183 A1* | 3/2012 | Mueller et al. | 257/57 |
| 2012/0267621 A1* | 10/2012 | Chen et al. | 257/43 |

FOREIGN PATENT DOCUMENTS

JP    2010-108986    5/2010
WO   WO 2010136385 A1 * 12/2010

* cited by examiner

*Primary Examiner* — Marvin Payen
*Assistant Examiner* — Jeremy Joy
(74) *Attorney, Agent, or Firm* — Karen K. Chan

(57) ABSTRACT

Disclosed are polysulfone-based materials that can be used as active and/or passive components in various electronic, optical, and optoelectronic devices, particularly, metal-oxide-semiconductor field-effect transistors. For example, various metal-oxide-semiconductor field-effect transistors can include a dielectric layer and/or a passivation layer prepared from such polysulfone-based materials and exhibit good device performance.

20 Claims, 6 Drawing Sheets a)

b)

POLYMERIC MATERIALS FOR USE IN METAL-OXIDE-SEMICONDUCTOR FIELD-EFFECT TRANSISTORS

CROSS-REFERENCE TO RELATED APPLICATIONS

This application claims priority to and the benefit of U.S. Provisional Patent Application Ser. No. 61/759,406, filed on Feb. 1, 2013, the disclosure of which is incorporated by reference herein in its entirety.

BACKGROUND

There has been a growing interest in developing electronic devices using amorphous metal oxides as the semiconductor component. These devices can offer advantages such as structural flexibility, potentially much lower manufacturing costs, and the possibility of low-temperature ambient manufacturing processes on large areas. For example, amorphous oxide semiconductors can be used to enable new devices such as electronic paper, flexible organic light-emitting diodes (OLEDs), ultra-high resolution displays, radio-frequency identification (RFID) technologies, and transparent displays and circuits.

One of the key benefits to using amorphous oxides is the potential to use both vapor-phase and solution-phase deposition techniques to deposit the semiconductor as well as other materials needed to fabricate the devices. Yet, to further realize the processing advantages of amorphous metal oxide semiconductors, all active components of the device should be mechanically flexible and preferably, most of the components of the device should be compatible with, if not processable by, solution-phase deposition fabrication.

For example, thin-film transistors (TFTs) based upon various solution-processed or vapor-deposited metal oxide semiconductors have been developed. However, a critical component in TFTs is the gate dielectric layer, which comprises an electrical insulator material and prevents leakage currents from flowing into the channel when a voltage is applied to the gate. In addition to exhibiting low-gate leakage properties, a good dielectric material also needs to be air and moisture-stable, and should be robust enough to withstand various conditions that are common in device fabrication processes, with properties that are tunable depending on the type of semiconductor employed in the TFT channel. Furthermore, to enable a robust fabrication process and stable device operation, optimization of the multilayer TFT structure by using appropriate material combinations is necessary. Thus, the substrate surface may have to be treated or coated to be compatible with the overlying layers fabricated on top of it. In addition, after the device is completed, a top layer may be needed to protect the TFT stack from the environment during operation.

Although some polymers have been employed as dielectrics for metal-oxide-semiconductor field-effect transistors (MOSFETs), several limitations of current-generation polymeric dielectric have yet to be overcome. First, the leakage current densities of conventional polymeric dielectric films are relatively high (usually >$1 \times 10^{-7}$ A/cm$^2$ at 2 MV/cm, >>$1 \times 10^{-5}$ A/cm$^2$ at 4 MV/cm) especially after thermal annealing at temperatures of about 250° C. or higher. Second, very few polymeric dielectric materials are sufficiently soluble to be solution-processed, especially via inexpensive printing techniques. Among those that are solution-processable, they often cannot survive the conditions used in subsequent processing steps, which significantly limits their application in device fabrication. For example, for TFT device fabrication, the deposition of overlying layers such as the semiconductor layer, the conductor layer, and other passive layers by solution-phase process may require solvents that compromise the integrity of the dielectric materials. Similarly, most known solution-processable dielectric materials cannot survive vapor-phase deposition methods (e.g., sputtering), which are commonly used to process metals and metal oxides. Third, currently available polymeric dielectric materials often fail to achieve high surface smoothness, which is a prerequisite for stable TFT performance and operation.

Accordingly, there is a desire in the art to identify appropriate organic materials and/or design and synthesize new organic materials that are compatible with diverse substrates, conductor, and/or semiconductor materials such that they could be employed in the whole TFT fabrication process to meet one or more device requirements including low current leakage densities, high thermal stability, resistance to harsh chemicals used in patterning steps, tuned surface energies, good adhesion, good solution-processability, and/or low permeation to water.

SUMMARY

In light of the foregoing, the present teachings provide polymeric materials that can possess one or more desirable properties and characteristics which make them suitable as active (e.g., dielectric) and/or passive (e.g., passivation or surface-modifying) materials in an electronic device such as a thin film field-effect transistor, particularly, a metal-oxide-semiconductor field-effect transistor ("MOSFET").

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

DETAILED DESCRIPTION

Figure 1:
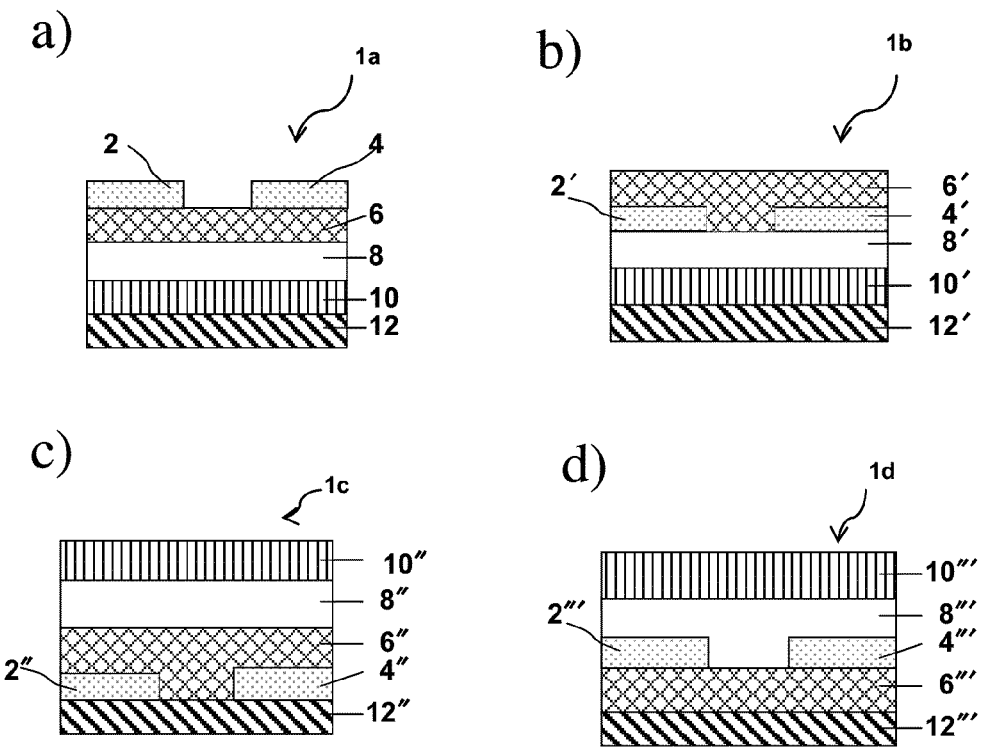
FIG. 1 illustrates four different configurations of thin film transistors: a) bottom-gate top contact, b) bottom-gate bottom-contact, c) top-gate bottom-contact, and d) top-gate top-contact; each of which can be used to incorporate one or more polymers of the present teachings as active and/or passive materials.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

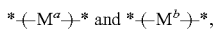

where $M^a$ and $M^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

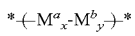

can be used to represent a copolymer of $M^a$ and $M^b$ having x mole fraction of $M^a$ and y mole fraction of $M^b$ in the copolymer, where the manner in which comonomers $M^a$ and $M^b$ is repeated can be alternating, random, regiorandom, regioregular, or in blocks. In addition to its composition, a polymeric compound can be further characterized by its degree of polymerization (n) and molar mass (e.g., number average molecular weight $(M_n)$ and/or weight average molecular weight $(M_w)$ depending on the measuring technique(s)). A polymer typically comprises a backbone with optional pendant groups.

As used herein, a "pendant group" refers to a moiety that is substituted on the backbone of a polymer.

As used herein, a "crosslinkable" group refers to a functional group which is capable of reacting irreversibly. The crosslinking reaction can be effected by thermal, chemical, or radiative means. For example, a compound having a crosslinkable group can be crosslinked by heat (in the case of a compound having a thermally crosslinkable group) or by UV (in the case of a compound having a photo-crosslinkable group), microwave, X-ray or electron radiation. In some embodiments, a compound (e.g., a polymer) can be capable of self-crosslinking, that is, no auxiliary reagents are required. In some embodiments, a compound can form crosslinks upon reaction with another reagent (e.g., a photoacid generator or a free radical initiator). In some embodiments, a compound can be crosslinked via more than one mechanism.

As used herein, a "photopolymer" is a polymer having at least one crosslinkable group that can be cured (via photocrosslinking) by flood exposure to light or by exposure to irradiation at selective wavelengths, often in the H (404.7 nm), G (435.8 nm) or I (365.4 nm) line of the spectrum, or other types of radiation.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1\text{-}40}$ alkyl group), for example, 1-20 carbon atoms (i.e., $C_{1\text{-}20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1\text{-}40}$ haloalkyl group), for example, 1 to 20 carbon atoms (i.e., $C_{1\text{-}20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1\text{-}40}$ haloalkyl group can have the formula —$C_sH_{2s+1-t}X^0{}_t$, where $X^0$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S-alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2\text{-}40}$ alkenyl group), for example, 2 to 20 carbon atoms (i.e., $C_{2\text{-}20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2\text{-}40}$ alkynyl group), for example, 2 to 20 carbon atoms (i.e., $C_{2\text{-}20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8\text{-}24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly $\pi$-conjugated and optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3\text{-}14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

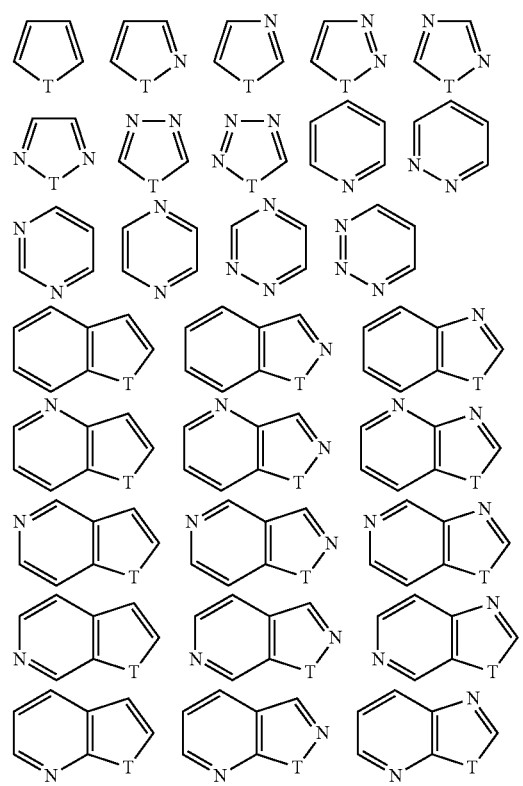

where T is O, S, NH, N-alkyl, N-aryl, N-(arylalkyl) (e.g., N-benzyl), $SiH_2$, SiH(alkyl), $Si(alkyl)_2$, SiH(arylalkyl), $Si(arylalkyl)_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuryl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

In one aspect, the present teachings relate to metal-oxide-semiconductor field-effect transistors having one or more organic layers and their fabrication methods. The present transistors generally include a substrate, a gate electrode, a gate dielectric layer, a metal oxide semiconductor as the active channel layer, source and drain electrodes, and one or more optional passivation and/or interfacial layers, where either the gate dielectric layer and/or one or more of the optional passivation and/or interfacial layers, if present, comprises a polysulfone-based material. As known in the art, the gate electrode, and the source and drain electrodes can be arranged in different configurations relative to the gate dielectric layer and the active channel layer to provide, for example, a top-gate top-contact structure, a top-gate bottom-contact structure, a bottom-gate top-contact structure, or a bottom-gate bottom-contact structure.

The metal oxide semiconductor active channel layer can be prepared from an oxide of indium, gallium, and zinc (IGZO). IGZO offers various advantages including high field-effect mobility and optical transparency. However, IGZO thin film transistors (IGZO TFTs) also suffer from unreliable device operation due to its sensitivity to the environment. Specifically, adsorption/desorption of small molecular species present in ambient air onto the exposed back channel layer as well as light sensitivity (subgap photoresponse) can change the carrier concentration in the IGZO films. This results in a shift of the TFT threshold voltage ($V_{TH}$), which over time leads to a nonuniformity problem. Identifying and/or designing an organic gate dielectric material that can alleviate some of the known problems in IGZO TFTs while maintaining their advantages such as high mobility has proven difficult.

Furthermore, state-of-the-art methods for fabricating IGZO TFTs typically involve both depositing the IGZO channel layer and processing the IGZO channel layer post-deposition at high temperatures (for example, an "activating" step after deposition often is necessary to repair any defects introduced when the IGZO is patterned to form the channel). Therefore, for an organic dielectric material to be useful in current IGZO TFTs, it must be thermally stable at about 250° C. or higher. Polymers having rigid backbones, for example, those incorporating (poly)cyclic (hetero)aromatic groups, tend to have good thermal stability. However, these polymers also have poor leakage properties due to their extended pi-conjugated system, and therefore non-negligible electrical conductivity.

Unexpectedly, the inventors have found that polysulfone-based materials offer a satisfactory combination of low leakage density and high thermal stability, in addition to good solution-processability and interfacial properties with metal oxide semiconductors. Accordingly, MOSFETs such as IGZO TFTs which incorporate such polysulfone-based materials as the gate dielectric layer were found to exhibit excellent device performance.

More specifically, the polysulfone as incorporated into an IGZO transistor according to the present teachings can be represented by the formula:

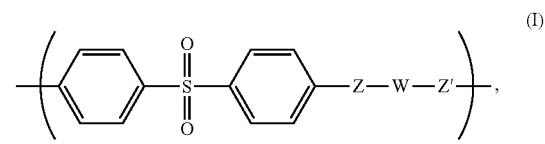

wherein:

W can be —Ar[—Y—Ar]$_q$—, wherein:
  Ar, at each occurrence, independently can be a divalent $C_{6-18}$ aryl group;
  Y, at each occurrence, independently can be selected from the group consisting of —O—, —S—, —(CR'R")$_r$—, —C(O)—, and a covalent bond, wherein R' and R", at each occurrence, independently can be selected from the group consisting of H, a halogen, CN, a $C_{1-10}$ alkyl group, and a $C_{1-10}$ haloalkyl group; and r is selected from the group consisting of 1, 2, 3, 4, 5, 6, 7, 8, 9 and 10; and
  q is selected from the group consisting of 0, 1, 2, 3, 4, 5, 6, 7, 8, 9 and 10; and Z and Z' independently can be selected from the group consisting of —O—, —S—, and —Se—; wherein the polysulfone can have a molecular weight ($M_w$) ranging from about 1,000 to about 50,000.

In some embodiments, W can be selected from the group consisting of —Ar—, —Ar[—O—Ar]$_q$—, —Ar—S—Ar—, —Ar—CH$_2$—Ar—, —Ar—C(CH$_3$)$_2$—Ar—, —Ar—C(CF$_3$)$_2$—Ar—, —Ar—C(O)—Ar—, and —Ar[—Ar]$_q$—, wherein q is 1, 2, 3 or 4, and each Ar independently can be a divalent phenyl group or a divalent naphthalenyl group.
Accordingly, in certain embodiments, W can be one of the following groups:
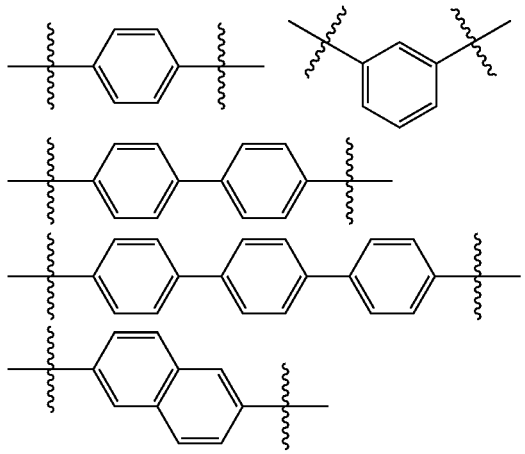
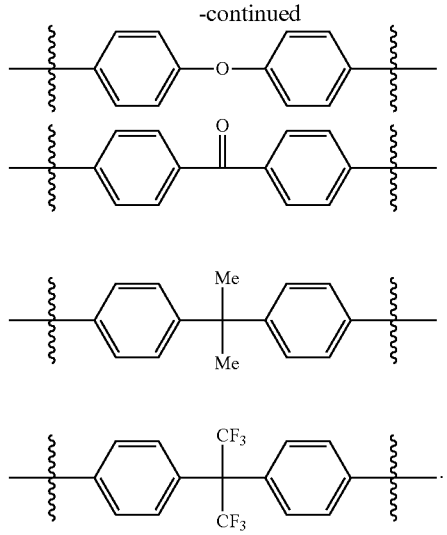
To illustrate, examples of polysulfones according to formula (I) can include:
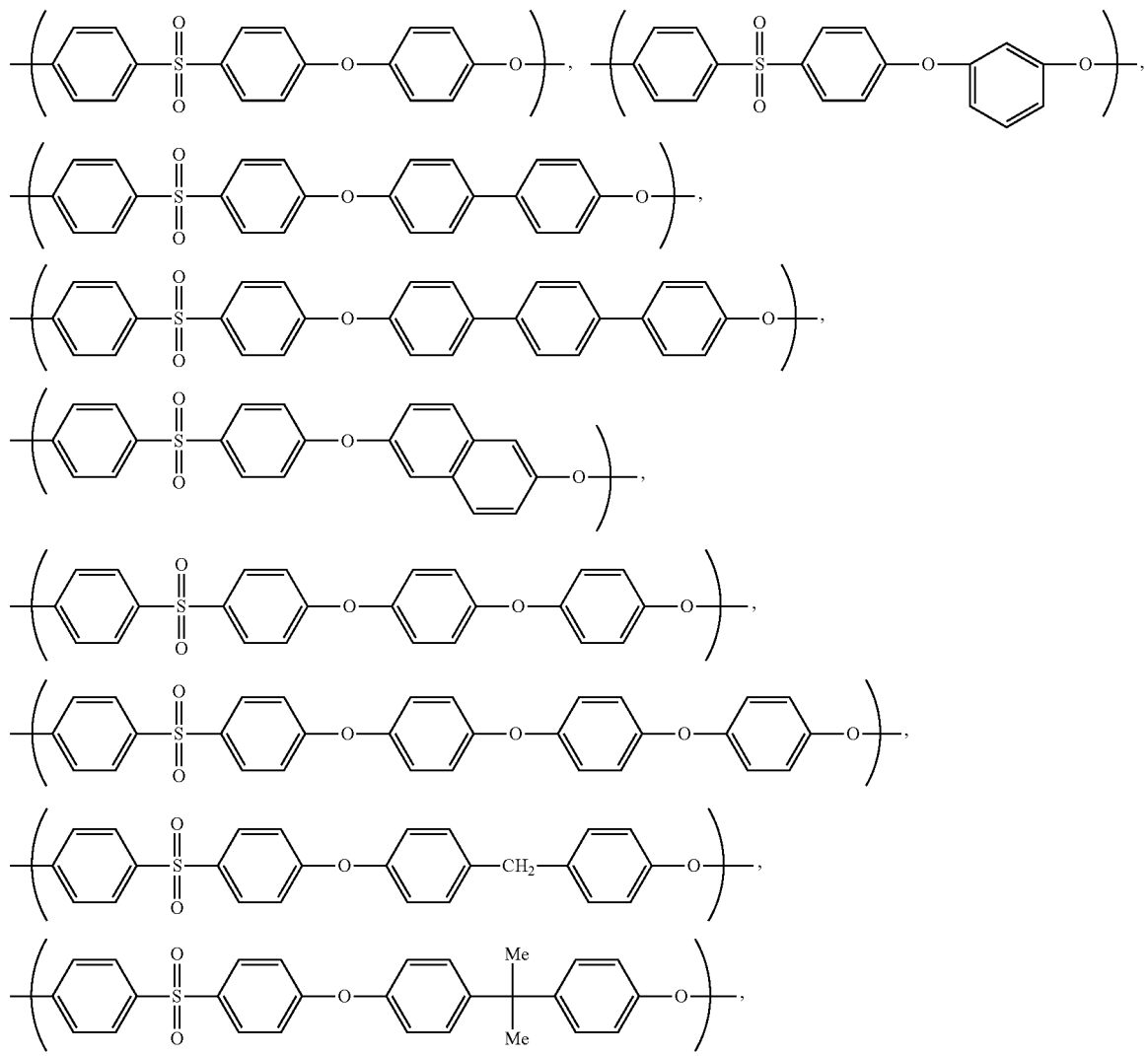

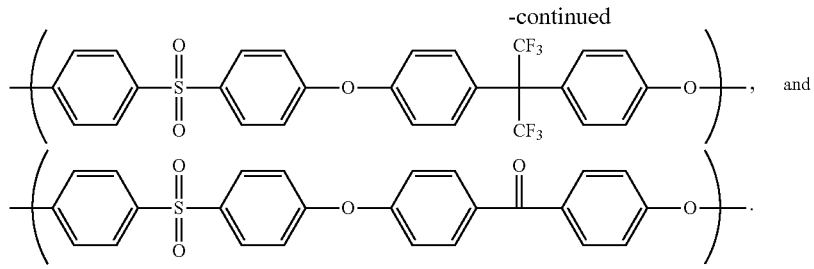

In certain embodiments, W can include one or more substituted $C_{6-18}$ aryl groups. For example, W can include one or more $C_{6-18}$ aryl groups optionally substituted with one or more (e.g., 1, 2, 3 or 4) organic groups such as a $C_{1-10}$ alkyl group, a $C_{1-10}$ alkoxy group, or a $C_{1-10}$ haloalkyl group. In particular embodiments, W can include two or more substituted $C_{6-18}$ aryl groups where the substitution induces twisting between the two or more $C_{6-18}$ aryl groups. As described above, better thermal stability is observed with rigid polymers such as those having extended aryl groups in the backbone. However, the presence of the extended aryl groups in the backbone makes the polymer conductive. Without wishing to be bound by any particular theory, it is believed that the conductivity of the polymer can be significantly reduced if the extended aryl groups are not in the same plane, that is, if the aryl groups are twisted relative to each other. This can be achieved, for example, by substituting the aryl groups with various chemical groups to introduce steric hindrance.

Accordingly, in certain embodiments, the gate dielectric in the present IGZO transistor can comprise a polysulfone represented by the formula:

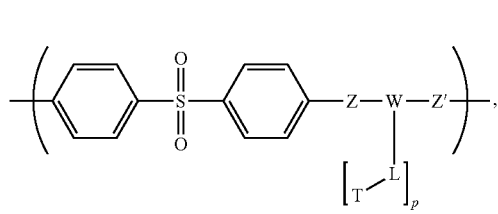

(II)

wherein:

L, at each occurrence, independently can be selected from the group consisting of —O—, —S—, a divalent $C_{1-10}$ alkyl group, a divalent $C_{6-18}$ aryl group, and a covalent bond;

T can be R, wherein R, at each occurrence, is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;

p is 1, 2, 3 or 4;

and W, Z and Z' are as defined herein.

Accordingly, in embodiments where all the Ar groups in W are unsubstituted, each L can be a covalent bond, and each T can be H. In embodiments where W includes at least one substituted Ar group, L and T can be as defined herein, provided that when T is H, L is not a covalent bond. For example, W can include one or more Ar groups substituted with 1, 2, 3 or 4-L-T groups, where L, for example, can be —O— or a covalent bond, and T can be a methyl group.

To illustrate, examples of W including one or more substituted $C_{6-18}$ aryl groups can include:

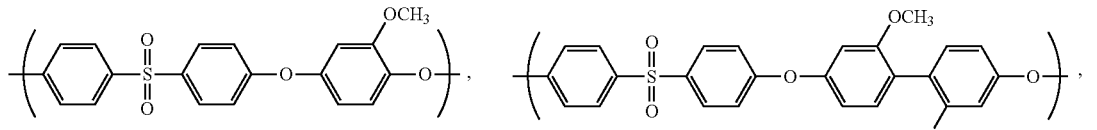

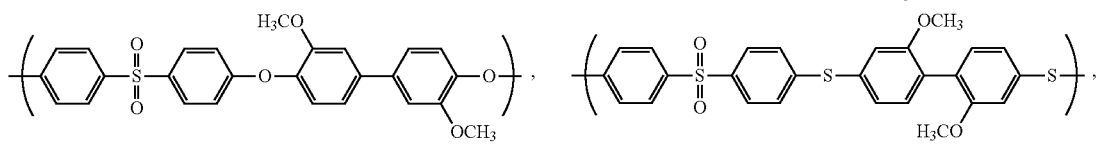

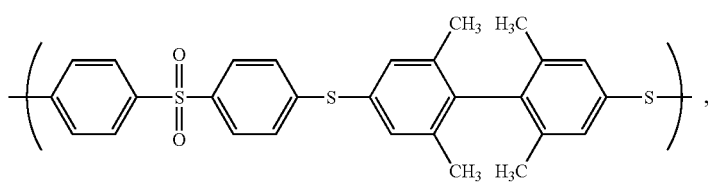

-continued
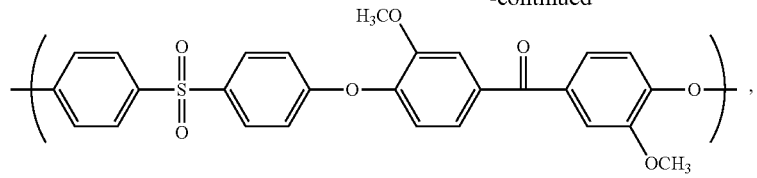
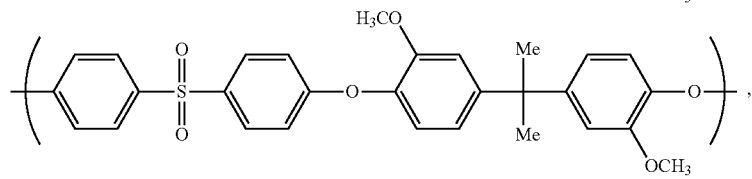
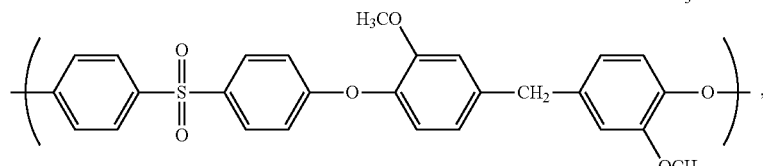
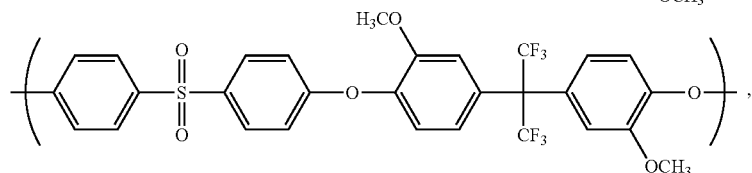
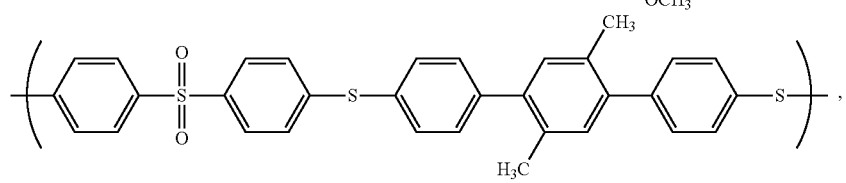
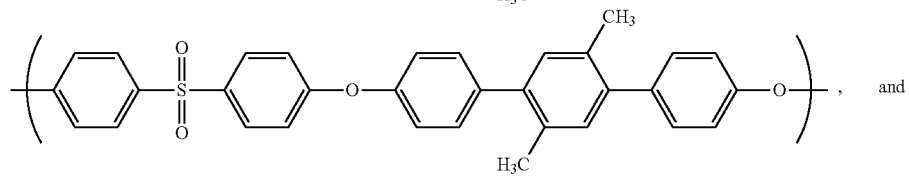
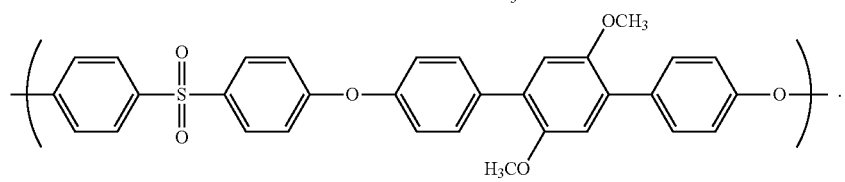
In particular embodiments of the polysulfone represented by formula (II), W can be a divalent diphenyl group including at least one substituted phenyl group. Examples of these embodiments include:
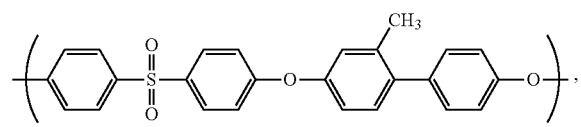
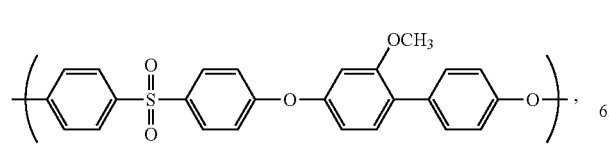
-continued
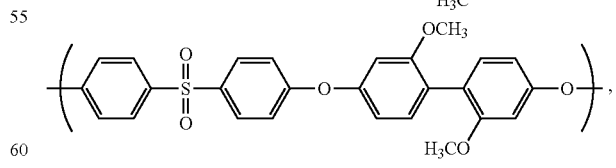
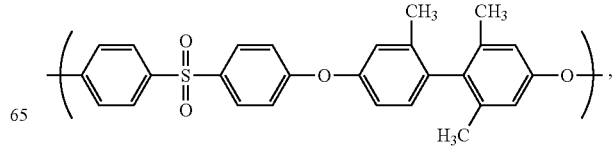

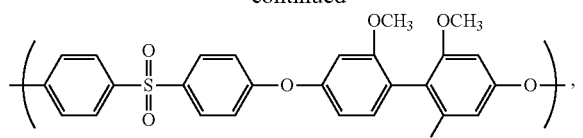

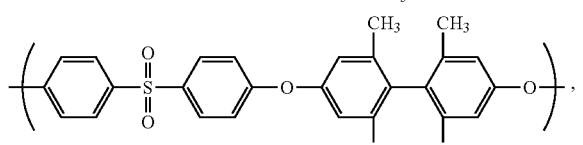

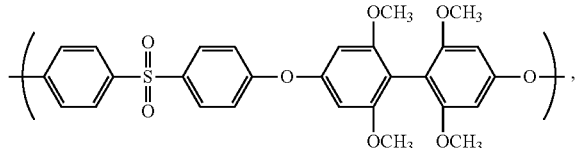

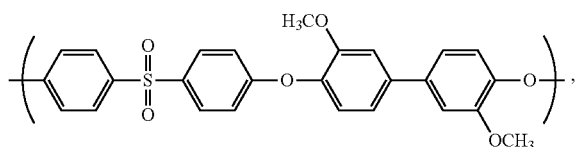

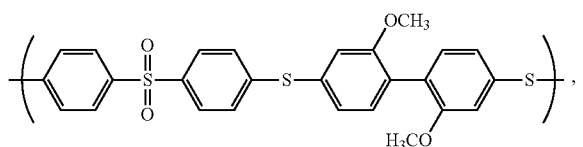

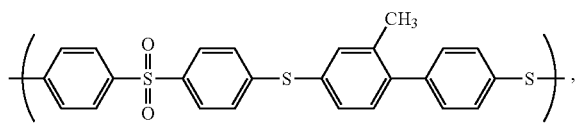

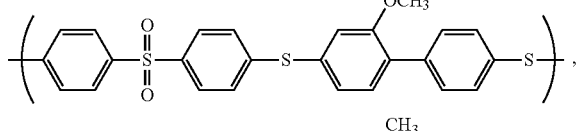

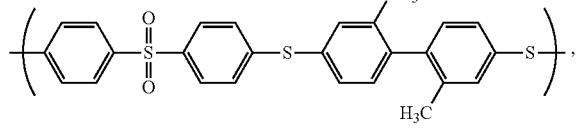

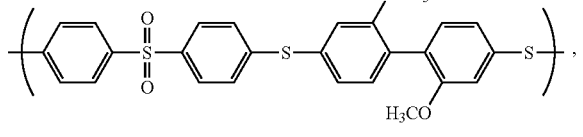

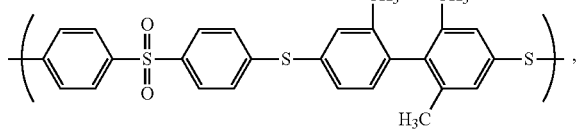

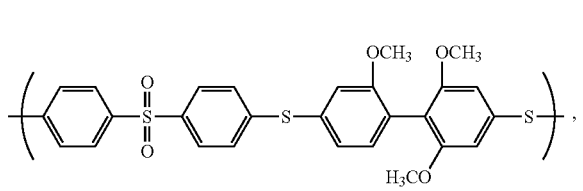

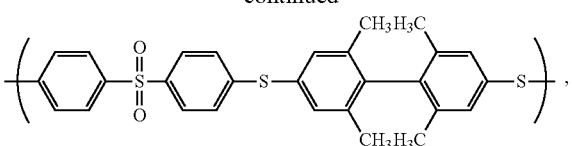

and

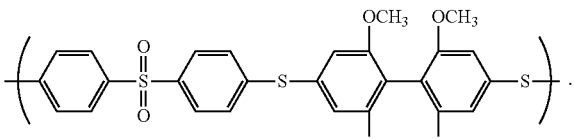

In certain embodiments, W can include at least one $C_{6-18}$ aryl group substituted with one or more thermally and/or photochemically crosslinkable groups. Accordingly, in certain embodiments, the gate dielectric in the present IGZO transistor can comprise a polysulfone represented by the formula:

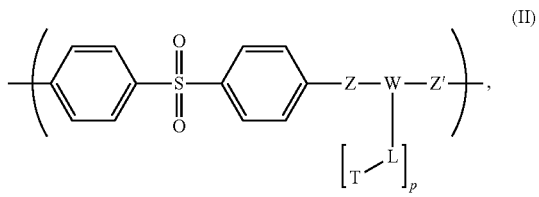

(II)

wherein:

L, at each occurrence, independently can be selected from the group consisting of —O—, —S—, a divalent $C_{1-10}$ alkyl group, a divalent $C_{6-18}$ aryl group, and a covalent bond;

T, at each occurrence, can be Q or R, wherein Q is a crosslinkable group;

p is 1, 2, 3 or 4;

and R, W, Z and Z' are as defined herein, provided, for example, that at least one of the -L-T groups is an -L-Q group.

Examples of crosslinkable groups Q are functional groups which include a double bond, a triple bond, a precursor which is capable of in-situ formation of a double or triple bond, or a heterocyclic addition-polymerizable radical. In certain embodiments, Q can be a functional group that comprises an ethenyl moiety, an ethynyl moiety, a dienyl moiety, an acrylate moiety, a coumarinyl moiety, or a cyclic ether moiety (e.g., epoxy, oxetane, etc.). The crosslinkable groups Q can be provided by various reactions to the polymer backbone in which W can be unsubstituted or substituted with one or more -L-R groups. In some embodiments, the reaction by which the crosslinkable group is attached to the polymer backbone can involve an -L-R group substituted on the W group. Therefore, depending on the conversion rate of the reaction, certain embodiments in which the polysulfone includes a W group substituted with one or more crosslinkable groups can be represented by:

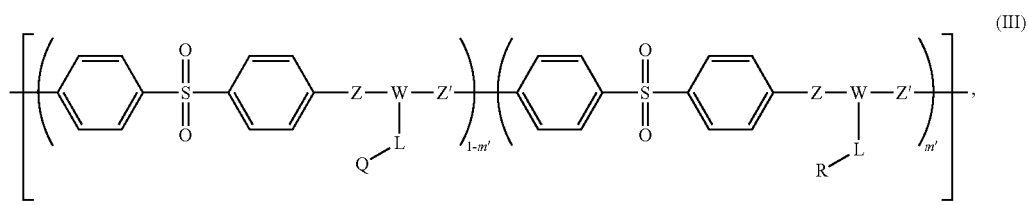
where m' represents the mole fraction of the repeat unit in the polymer backbone having the unreacted -L-R group and can be as high as about 0.75 and as low as about 0 (100% conversion).
In various embodiments, Q can be any one of the following illustrative groups:
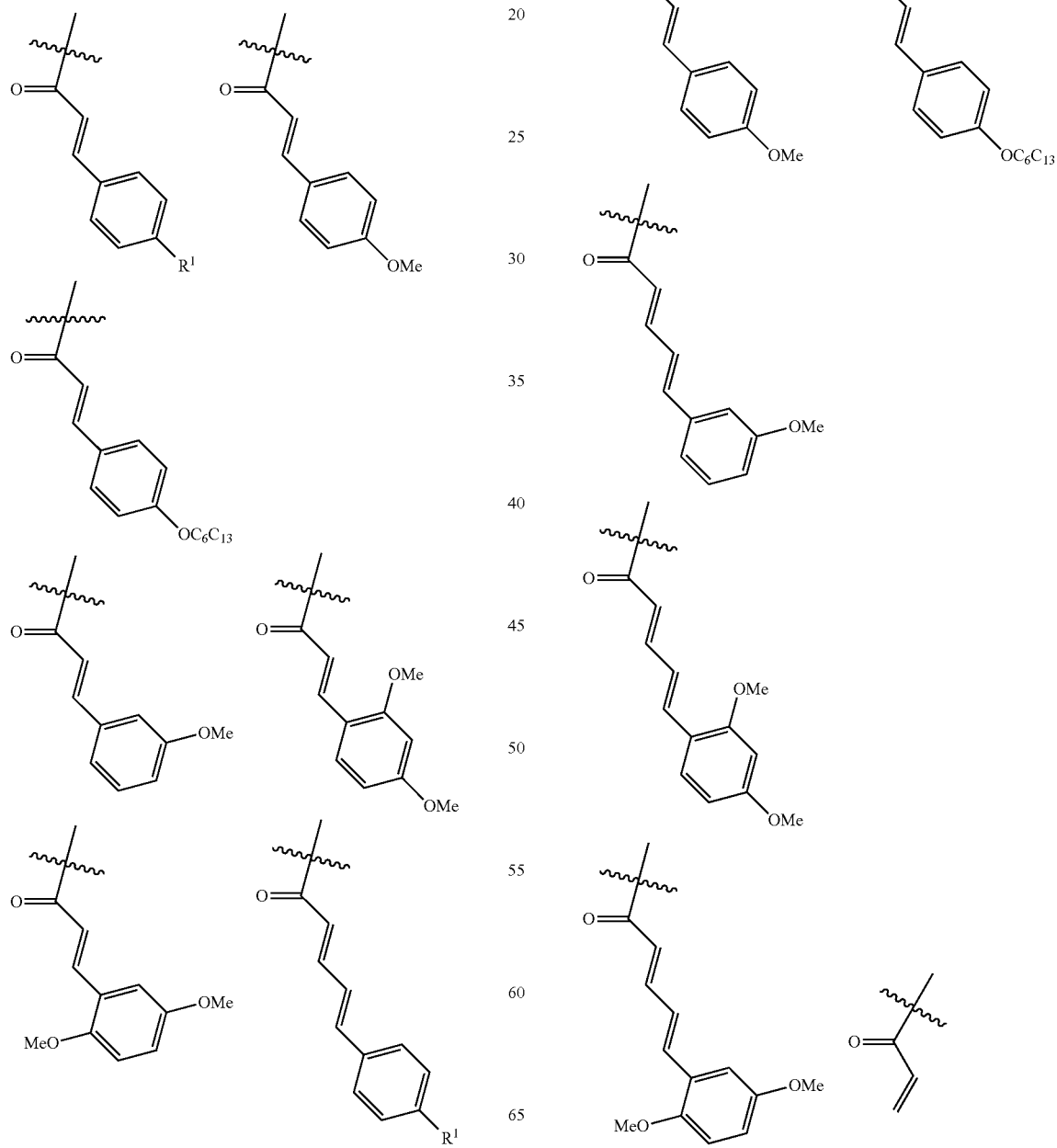

-continued

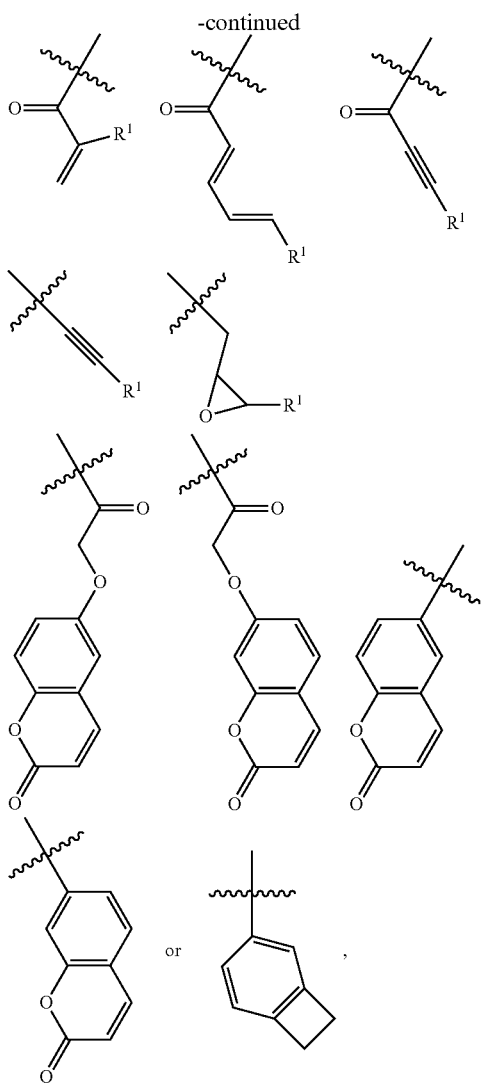

where $R^1$ is H, F, CN, a $C_{1-10}$ alkyl group, a $C_{1-10}$ haloalkyl group, and a $C_{1-10}$ alkoxy group.

In other embodiments, the gate dielectric in the present IGZO transistor can comprise a polysulfone represented by the formula:

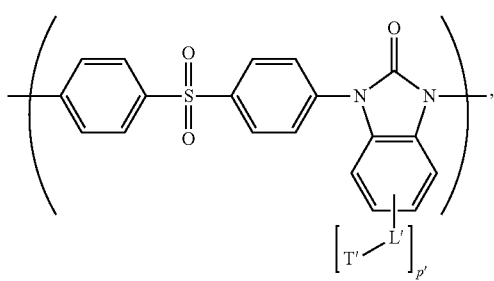

(IV)

wherein:

L', at each occurrence, independently can be selected from the group consisting of —O—, —S—, a divalent $C_{1-10}$ alkyl group, a divalent $C_{6-18}$ aryl group, and a covalent bond;

T', at each occurrence, independently can be Q or R, wherein:

Q is a crosslinkable group; and

R, at each occurrence, is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN; and p' is 1, 2, 3 or 4.

In certain embodiments, the benzimidazolonyl group can be unsubstituted, that is, each L' can be a covalent bond, and each T' can be H. In certain embodiments, the benzimidazolonyl group can be substituted with at least one -L'-R group, where L' and R can be as defined herein, but provided that when R is H, L' is not a covalent bond. For example, L' can be —O— or a covalent bond, and R can be a methyl group.

In certain embodiments, the benzimidazolonyl group can be substituted with 1, 2, 3 or 4 crosslinkable groups (-L'-Q). Examples of crosslinkable groups Q are functional groups which include a double bond, a triple bond, a precursor which is capable of in-situ formation of a double or triple bond, or a heterocyclic addition-polymerizable radical. In certain embodiments, Q can be a functional group comprising an ethenyl moiety, an ethynyl moiety, a dienyl moiety, an acrylate moiety, a coumarinyl moiety, or a cyclic ether moiety (e.g., epoxy, oxetane, etc.). In various embodiments, L' can be —O— or a covalent bond; and Q can be any one of the following illustrative groups:

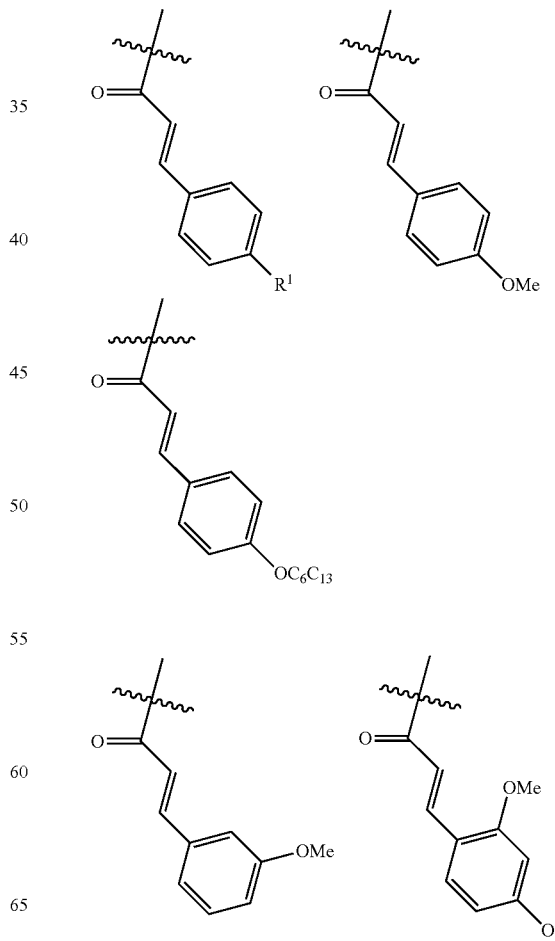

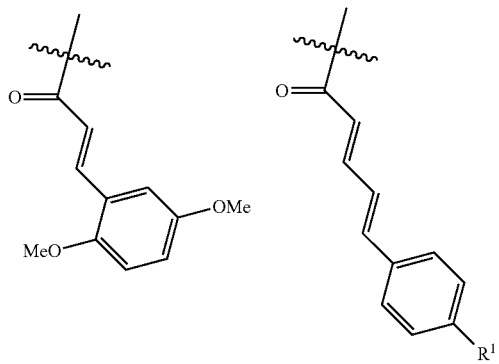
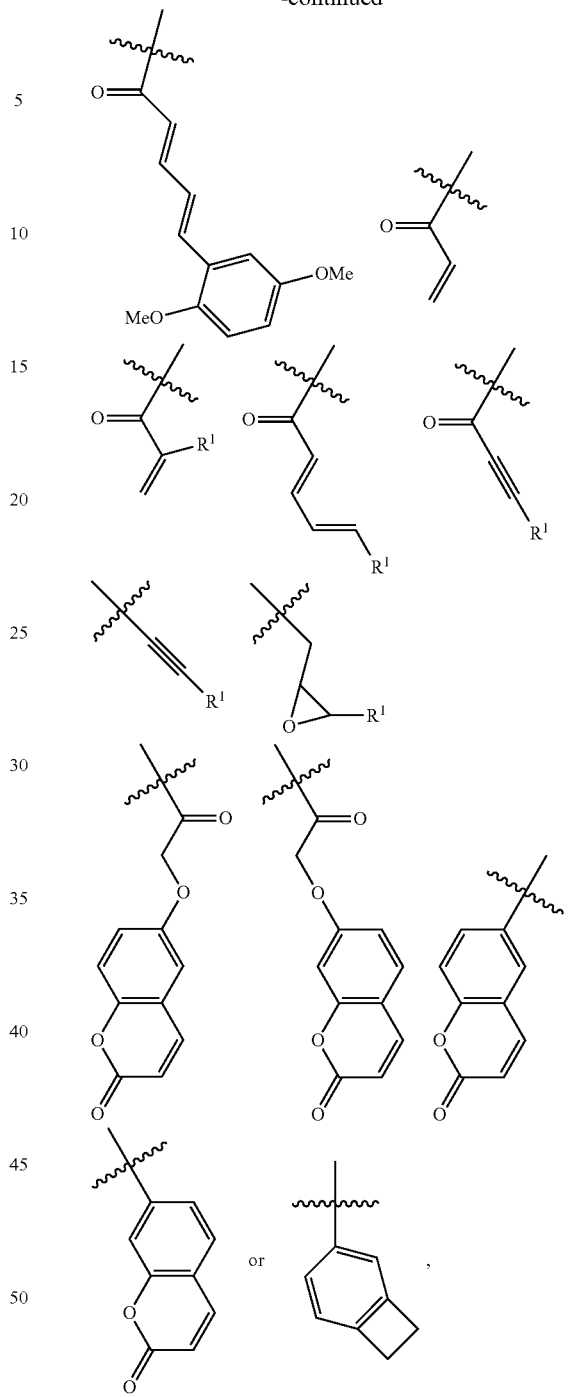

where $R^1$ is H, F, CN, a $C_{1-10}$ alkyl group, a $C_{1-10}$ haloalkyl group, and a $C_{1-10}$ alkoxy group.

The crosslinkable groups can be provided by various reactions to the backbone of the polymer of formula (IV) backbone in which the benzimidazolonyl group can be unsubstituted or substituted with one or more -L'-R groups which is not H. In some embodiments, the reaction by which the crosslinkable group is attached to the polymer backbone can involve an -L'-R group substituted on the benzimidazolonyl group. Therefore, depending on the conversion rate of the reaction, certain embodiments in which the polysulfone includes a benzimidazolonyl group substituted with one or more crosslinkable groups can be represented by:

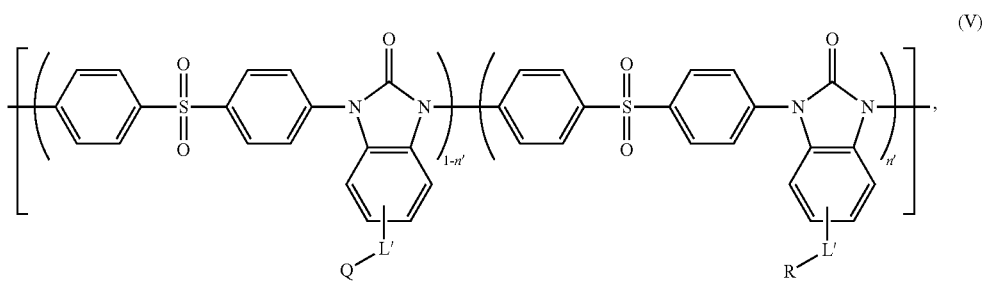

where n' represents the mole fraction of the repeat unit in the polymer backbone having the unreacted -L'-R group and can be as high as about 0.75 and as low as about 0 (100% conversion).

In some embodiments, the gate dielectric in the present IGZO transistor can comprise a copolymer of a first repeat unit of formula (II) and a second repeat unit of formula (IV). In one embodiment, neither W nor the benzimidazolonyl group is substituted. Accordingly, the copolymer can be represented by the formula:

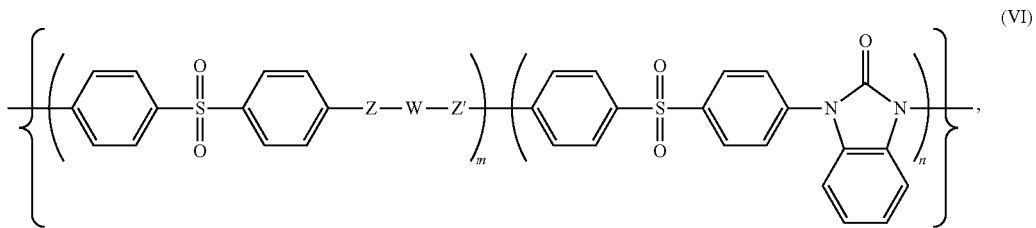

where m and n are real numbers representing mole fractions, provided that the sum of m and n is about 1. For example, each of m and n can be less than 1 but greater than 0 (i.e., 0<m<1 and 0<n<1), preferably, each of m and n is less than or equal to 0.9 but greater than or equal to 0.1 (i.e., $0.1 \leq m \leq 0.9$ and $0.1 \leq n \leq 0.9$), more preferably, each of m and n is less than or equal to 0.8 but greater than or equal to 0.2 (i.e., $0.2 \leq m \leq 0.8$ and $0.2 \leq n \leq 0.8$), even more preferably, each of m and n is less than or equal to 0.7 but greater than or equal to 0.3 (i.e., $0.3 \leq m \leq 0.7$ and $0.3 \leq n \leq 0.7$). In certain embodiments, n can be greater than m (i.e., n>m, provided that m+n=1. For example, m can be about 0.4, and n can be about 0.6; or m can be about 0.3, and n can be about 0.7; or m can be about 0.2, and n can be about 0.8; or m can be about 0.1, and n can be about 0.9. Embodiments of the present copolymers having a higher mole fraction of the second repeat unit of formula (IV) than the first repeat unit of formula (II) can be more thermally stable and more chemically resistant (for example, against etchants and/or strippers used with various commercially available positive or negative photoresists) than those copolymers where n is either the same or less than m.

In some embodiments, either W and/or the benzimidazolonyl group can be substituted. Such embodiments can be represented by the formula:

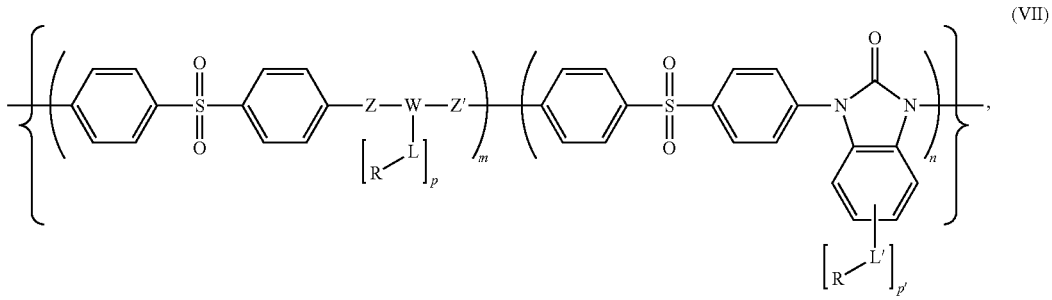

where L, L', R, W, Z and Z' are as defined herein, but provided that at least one -L-R group or at least one -L'-R group is not H; p and p' independently are 1, 2, 3 or 4; and m and n are real numbers representing mole fractions, provided that each of m and n can be less than 1 but greater than 0 (i.e., 0<m<1 and 0<n<1) and the sum of m and n is about 1. For example, the benzimidazolonyl group can be substituted with an -L'-R group and the polysulfone copolymer can be represented by the formula:

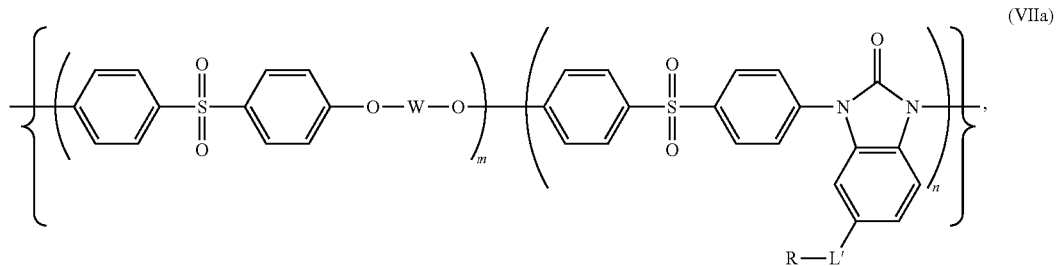

(VIIa)

where L', R, W, m and n are as defined herein, provided that L' is not a covalent bond when R is H. As another example, W can include one or more Ar groups substituted with 1, 2, 3 or 4 -L-R groups and the polysulfone copolymer can be represented by the formula:

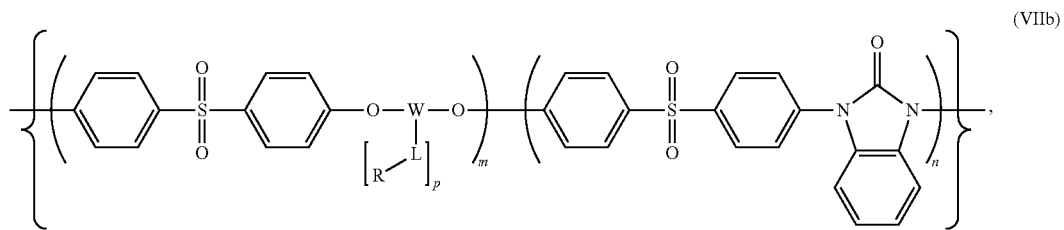

(VIIb)

where L, R, W, m, n, and p are as defined herein, provided that L is not a covalent bond when R is H. As yet another example, both W and the benzimidazolonyl group can be substituted and the polysulfone copolymer can be represented by the formula:

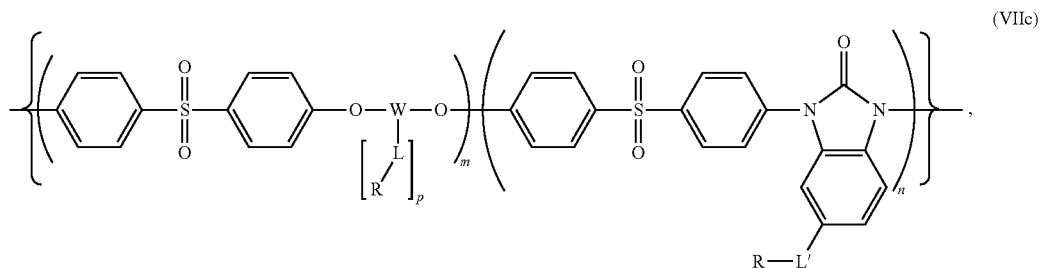

(VIIc)

where L, L', R, W, m, n and p are as defined herein, provided that L and L' do not represent a covalent bond when R is H. To illustrate, at least W and/or the benzimidazolonyl group can be substituted with 1-4 methoxy and/or methyl groups.

In certain embodiments, either W and/or the benzimidazolonyl group can be substituted with one or more crosslinkable groups. To illustrate, embodiments of copolymers having W substituted with one or more crosslinkable groups can be represented by the formula:

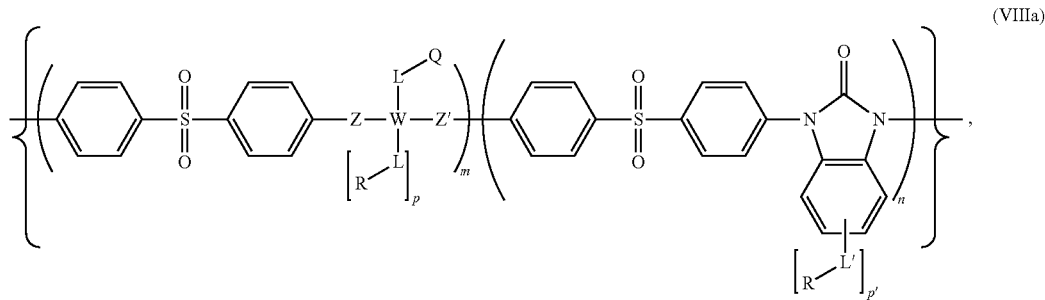

(VIIIa)

where L, L', Q, R, W, Z, Z' and p' are as defined herein, each of m and n can be less than 1 but greater than 0 (i.e., 0<m<1 and 0<n<1) and the sum of m and n is about 1, and p is 1, 2 or 3. Where the reaction by which the crosslinkable group is attached to the polymer backbone can involve an -L-R group substituted on the W group, depending on the conversion rate of the reaction, certain embodiments in which the polysulfone copolymer includes a W group substituted with one or more crosslinkable groups can be represented by:

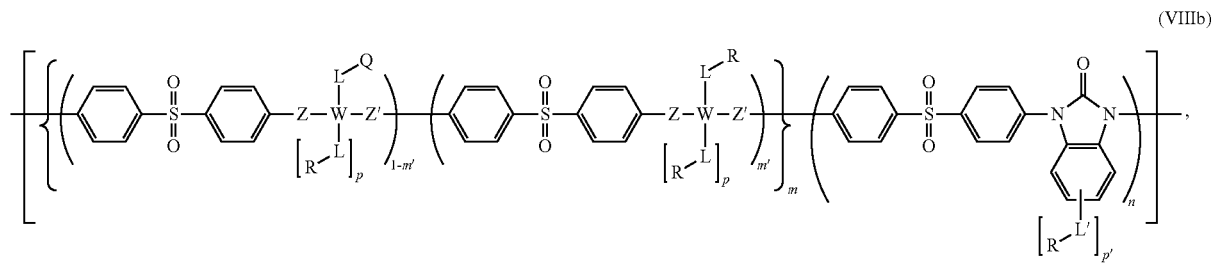

(VIIIb)

where L, L', Q, R, W, Z, Z' and p' are as defined herein, each of m and n can be less than 1 but greater than 0 (i.e., 0<m<1 and 0<n<1) and the sum of m and n is about 1, p is 1, 2 or 3, and m' represents the mole fraction of the repeat unit in the polymer backbone having the unreacted -L-R group and can be as high as about 0.75 and as low as about 0 (100% conversion). Similarly, embodiments of copolymers having the benzimidazolonyl group substituted with one or more crosslinkable groups can be represented by the formula:

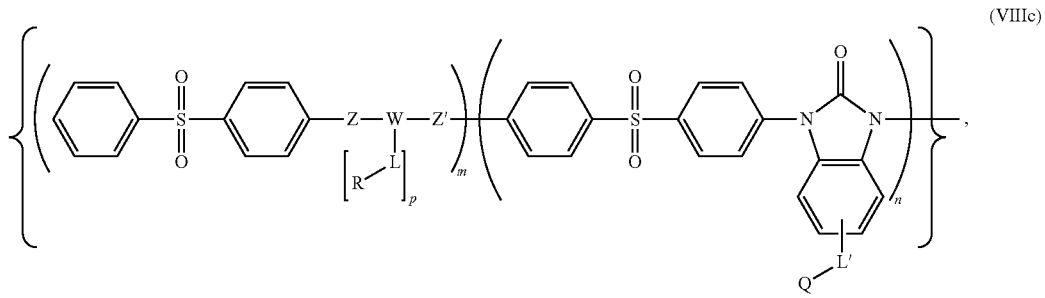

(VIIIc)

where L, L', Q, R, W, Z, Z' and p are as defined herein, and each of m and n can be less than 1 but greater than 0 (i.e., 0<m<1 and 0<n<1) and the sum of m and n is about 1. Where the reaction by which the crosslinkable group is attached to the polymer backbone can involve an -L'-R group substituted on the benzimidazolonyl group, depending on the conversion rate of the reaction, the polysulfone copolymer can be represented by:

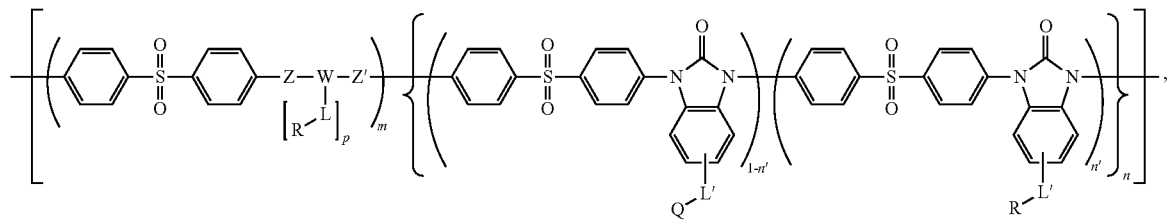

(VIIId)

where L, L', Q, R, W, Z, Z' and p are as defined herein, each of m and n can be less than 1 but greater than 0 (i.e., 0<m<1 and 0<n<1) and the sum of m and n is about 1, and n' represents the mole fraction of the repeat unit in the polymer backbone having the unreacted -L'-R group and can be as high as about 0.75 and as low as about 0 (100% conversion).

In particular embodiments, both W and the benzimidazolonyl group can be substituted with one or more crosslinkable groups. Embodiments of such copolymers can be represented by the formula:

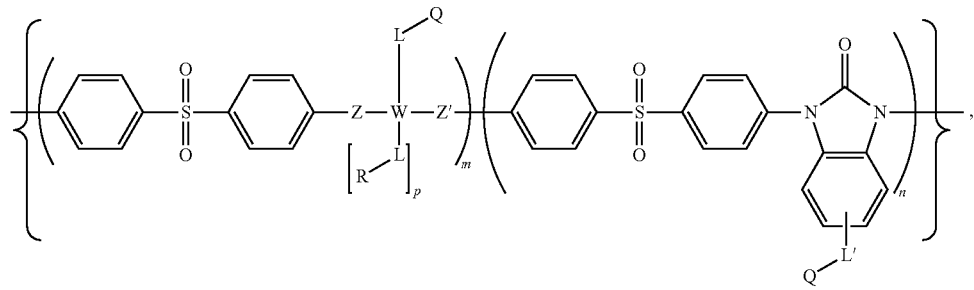

(VIIIe)

where L, L', Q, R, W, Z and Z' are as defined herein, each of m and n can be less than 1 but greater than 0 (i.e., 0<m<1 and 0<n<1) and the sum of m and n is about 1, and p is 1, 2 or 3. Where the reaction by which the crosslinkable group is attached to the polymer backbone can involve an -L-R group substituted on the W group and/or an -L'-R group substituted on the benzimidazolonyl group, depending on the conversion rate of the reaction, the polysulfone copolymer can be represented by the formula:

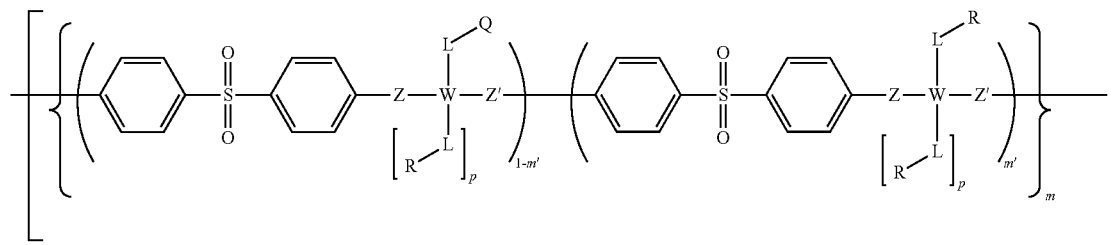

(VIIIf)

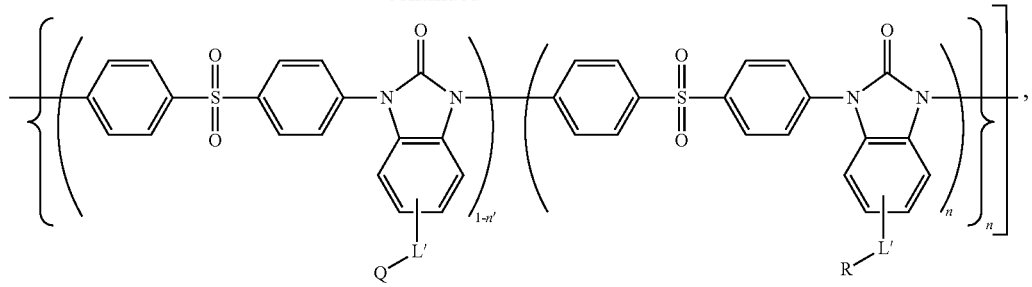

where L, L', Q, R, W, Z and Z' are as defined herein, each of m and n can be less than 1 but greater than 0 (i.e., $0<m<1$ and $0<n<1$) and the sum of m and n is about 1, p is 1, 2 or 3, and m' and n' represent the mole fraction of the repeat unit in the polymer backbone having the unreacted -L-R group and the mole fraction of the repeat unit in the polymer backbone having the unreacted -L'-R group, respectively, and can be as high as about 0.75 and as low as about 0 (100% conversion).

Generally, various embodiments of the polysulfone that can be used as the gate dielectric component in the IGZO transistor according to the present teachings can be represented by the formula:

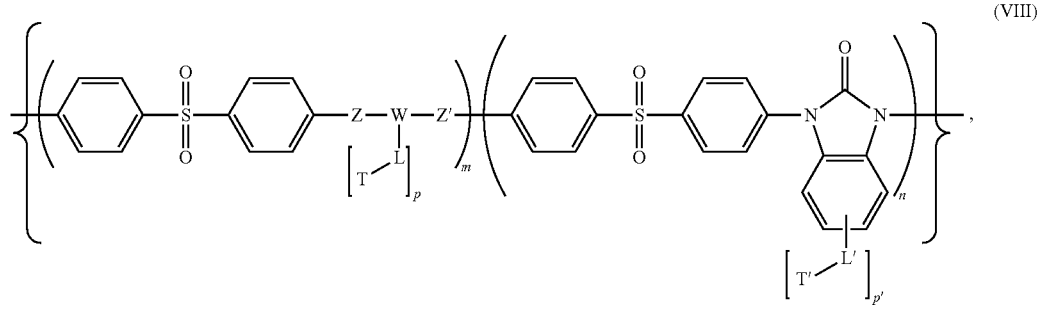

(VIII)

wherein:
L and L', at each occurrence, independently can be selected from the group consisting of —O—, —S—, a divalent $C_{1-10}$ alkyl group, a divalent $C_{6-18}$ aryl group, and a covalent bond;
T and T', at each occurrence, independently can be Q or R, wherein:
  Q is a crosslinkable group; and
  R, at each occurrence, is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;
W can be —Ar[—Y—Ar]$_q$—, wherein:
  Ar, at each occurrence, independently can be a divalent $C_{6-18}$ aryl group;
  Y, at each occurrence, independently can be selected from the group consisting of —O—, —S—, —(CR'R")$_r$—, —C(O)—, and a covalent bond, wherein R' and R", at each occurrence, independently can be selected from the group consisting of H, a halogen, CN, a $C_{1-10}$ alkyl group, and a $C_{1-10}$ haloalkyl group; and r is selected from the group consisting of 1, 2, 3, 4, 5, 6, 7, 8, 9 and 10; and
  q is selected from the group consisting of 0, 1, 2, 3, 4, 5, 6, 7, 8, 9 and 10;
Z and Z' independently can be selected from the group consisting of —O—, —S—, and —Se—;

p and p' independently are 1, 2, 3 or 4; and
m and n are real numbers representing mole fractions, wherein $0 \le m \le 1$ and $0 \le n \le 1$, provided that the sum of m and n is about 1.

For example, where the polysulfone is a polysulfone copolymer, each of m and n can be less than 1 but greater than 0 (i.e., $0<m<1$ and $0<n<1$), preferably, each of m and n is less than or equal to 0.9 but greater than or equal to 0.1 (i.e., $0.1 \le m, n \le 0.9$), more preferably, each of m and n is less than or equal to 0.8 but greater than or equal to 0.2 (i.e., $0.2 \le m, n \le 0.8$), even more preferably, each of m and n is less than or equal to 0.7 but greater than or equal to 0.3 (i.e., $0.3 \le m, n \le 0.7$). In certain embodiments, n can be greater than m (i.e., $n>m$, provided that m+n=1. For example, m can be about 0.4, and n can be about 0.6; or m can be about 0.3, and n can be about 0.7; or m can be about 0.2, and n can be about 0.8; or m can be about 0.1, and n can be about 0.9. In certain embodiments, the polysulfone copolymer can have one or more pendant groups as described herein, that is, at least one -L-T group is a methoxy group or an -L-Q group, and/or at least one -L'-T group is a methoxy group or an -L'-Q group. In preferred embodiments, the polysulfone copolymer comprises one or more pendant groups that include crosslinkable groups, that is, at least one -L-T group is an -L-Q group, and/or at least one -L'-T group is an -L'-Q group. In various embodiments, the polysulfone copolymer can have a molecular weight ($M_w$) ranging from about 1,000 to about 50,000.

Polymers of the present teachings can be synthesized following Scheme 1 below if the group -L-T or -L'-T' does not contain acidic hydrogen atoms or is not base-sensitive. Examples of -L-T or -L'-T' groups that do not contain acidic hydrogen atoms or otherwise are not base-sensitive include H, alkoxy groups (e.g., OMe), thioalkyl groups (e.g., SMe), alkyl groups (e.g., Me), or fluoroalkyl groups (e.g., $CF_3$).

Scheme 1

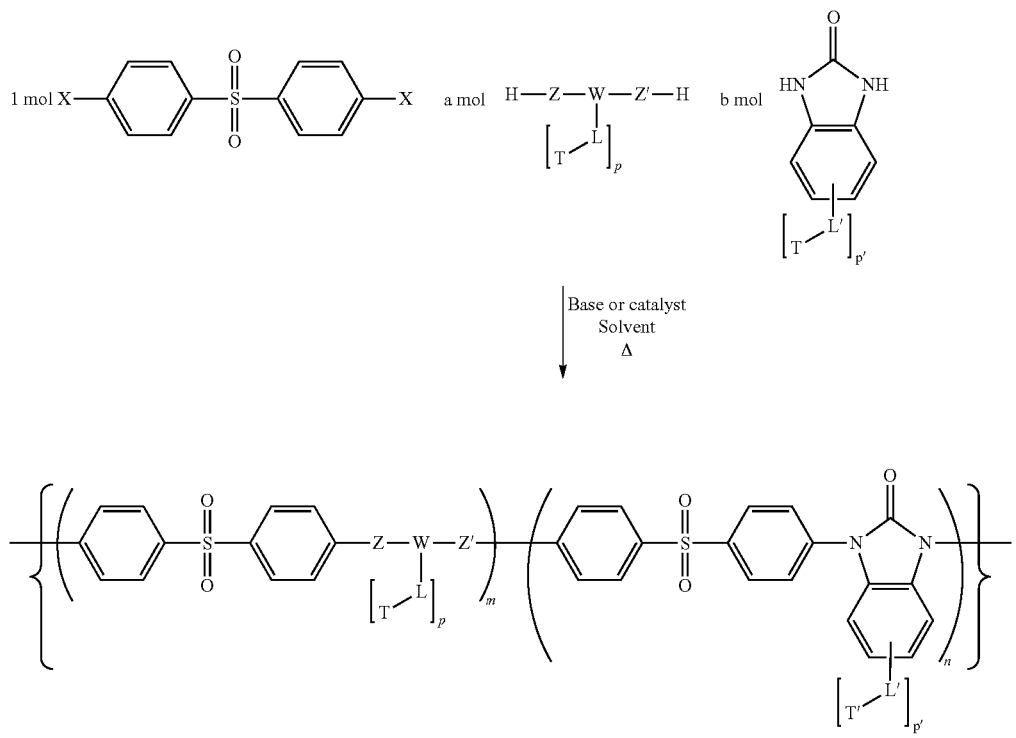

where each X can be a leaving group such as a halogen (F, Cl, Br, I), CN, OTf, OMs, or $NO_2$. In certain cases, transition metal-based catalysts, such as those of Pd or Ni, for promoting C—Z bond formation can be used. See Frlan, R. Kikelj, D. "Recent Progress in Diaryl Ether Synthesis," *Synthesis*, 14: 2271-2285 (2006); Aubin, Y. et al., "Direct Amination of Aryl Halides with Ammonia," *Chemical Society Reviews*, 39(11): 4130-4145 (2010); and Hassan, J. et al., "Aryl-Aryl Bond Formation One Century After the Discovery of the Ullmann Reaction," *Chemical Reviews*, 102(5): 1359-1469 (2002). In addition, a could be equal to m and b could be equal to n depending on the relative reactivity of Z versus the N nucleophiles. In any case, m+n=1.

Alternatively, polymers of the present teachings can be synthesized following Scheme 2, which first involves the use of a protecting group (G) on L to synthesize the backbone, which is then transformed into T.

Scheme 2

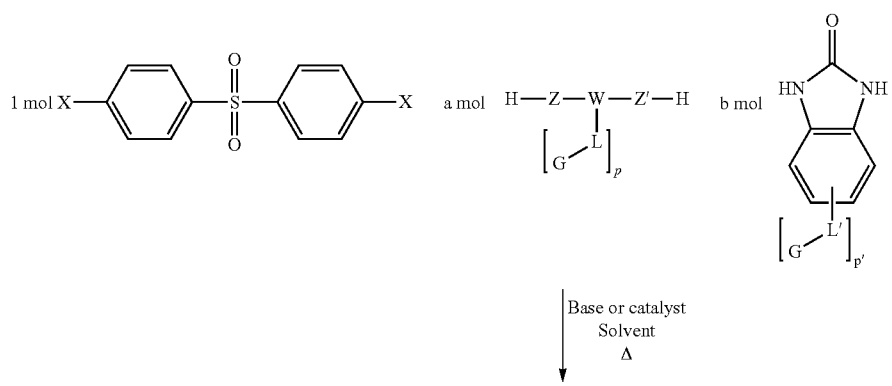

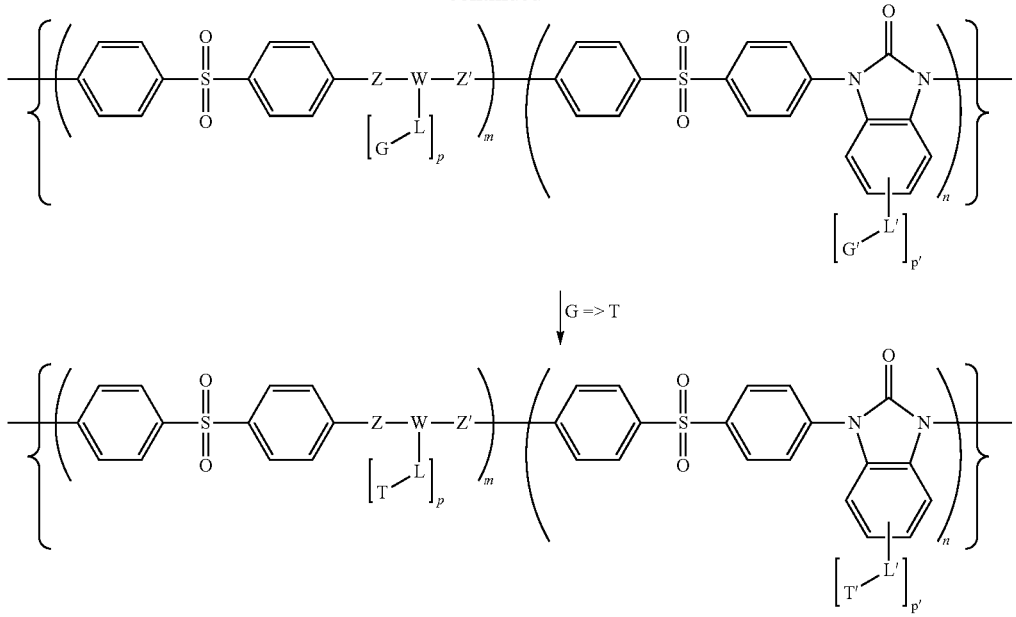

For example, -L-G can be an ether, e.g., —OMe, which can be dealkylated into OH (see Examples 3 and 11, infra), which in turn can be reacted with a compound bearing a crosslinkable moiety to provide -L-Q (Scheme 3, infra). In another example, -L-G can be an imine group (e.g., —N=CHR), which can be converted to -L-Q (—NH$_2$) by acidic hydrolysis. In a further example, -L-G can be a phenylhydrazone (e.g., —CR=N—NHPh) which can be converted to -L-Q (—COR, a ketone) by acidic hydrolysis. Additional exemplary protecting groups for various functional groups are known in the art (see e.g., T. W. Green, P. G. M. Wuts, *Protective Groups in Organic Synthesis*, Wiley-Interscience, New York, 1999, 503-507, 736-739). Similar to Scheme 1, a in Scheme 2 could be equal to m and b could be equal to n depending on the relative reactivity of Z versus the N nucleophiles. In any case, m+n=1.

Examples of known compounds having the formula:

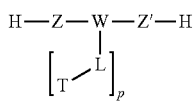

which could be used in Scheme 1, where L is a covalent bond and T is H include:

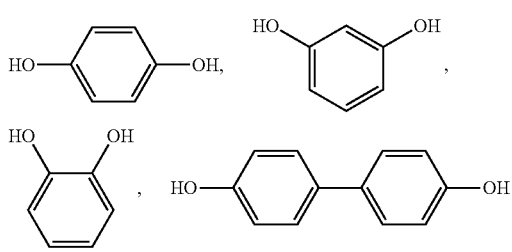

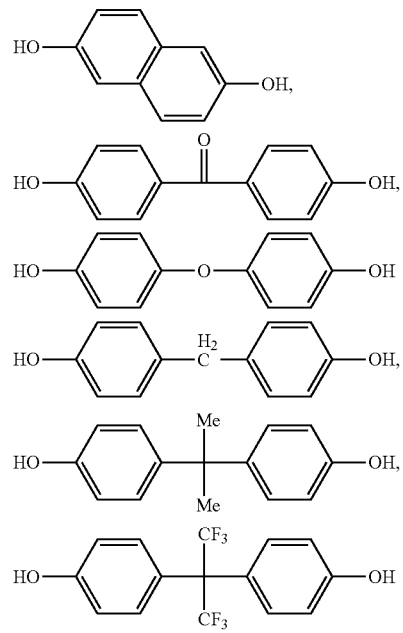

-continued
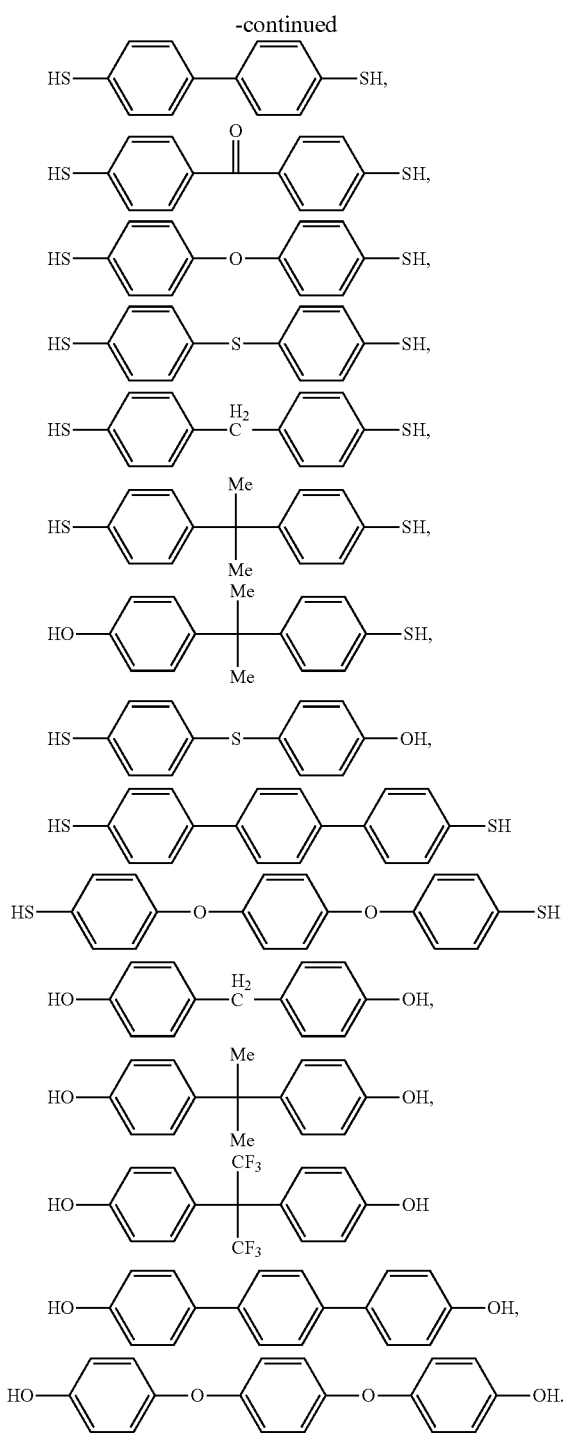
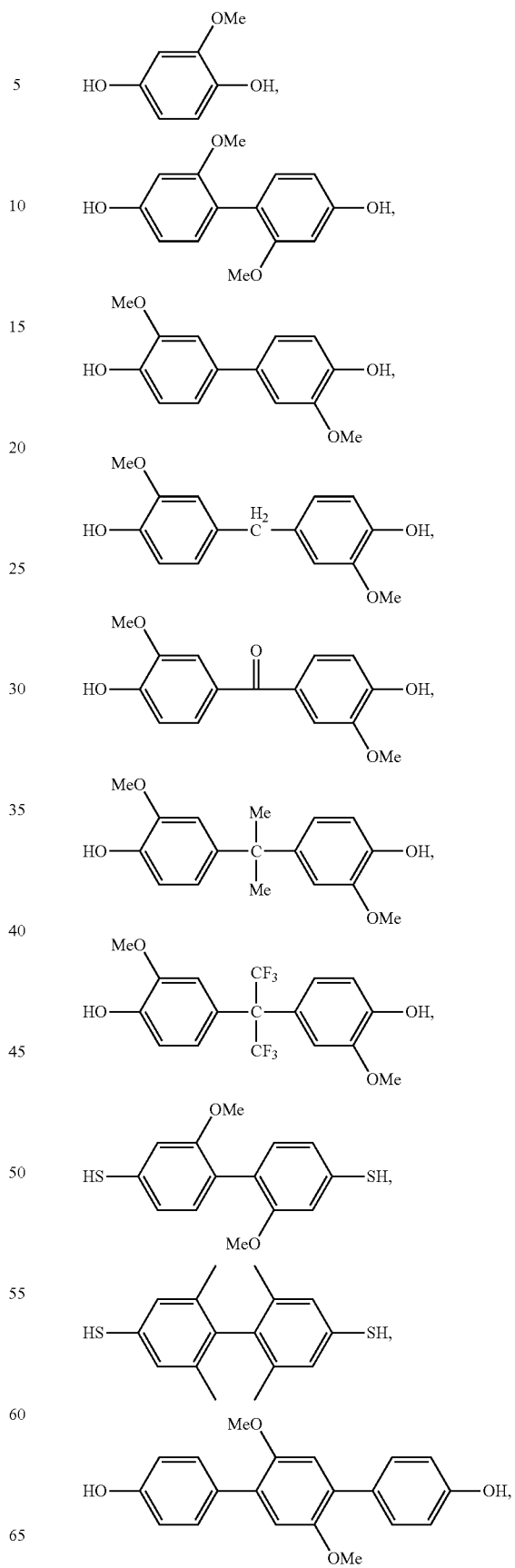
Examples of known compounds having the formula:
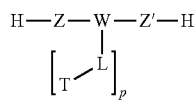
which could be used in Scheme 1 or Scheme 2, where L is —O— or a covalent bond and T is a methyl group (Me) include:

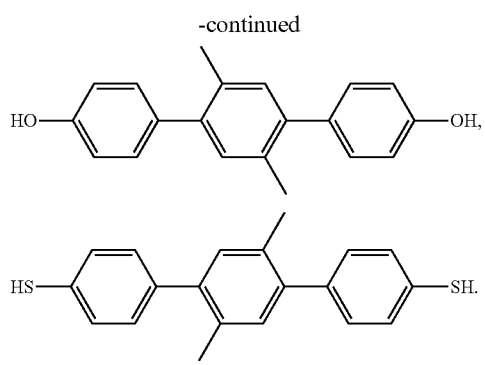
Examples of commercially available benzimidazolone compounds include:
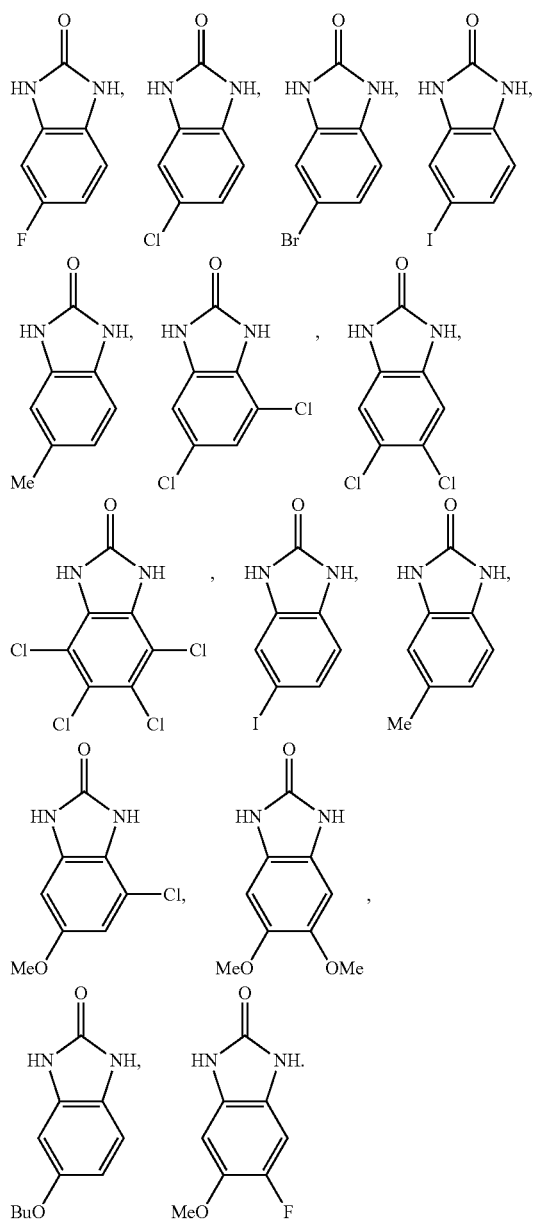
The starting compound
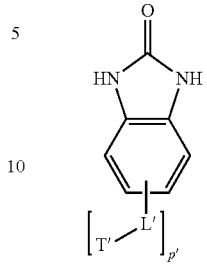
can be synthesized according to reported protocols for synthesizing the commercially available
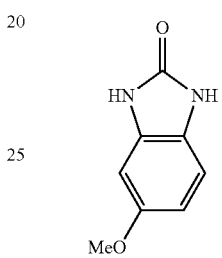
such as:
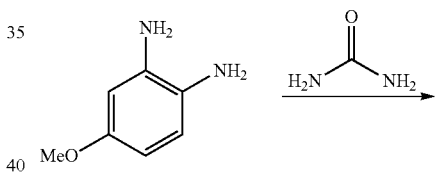
Journal of Heterocyclic Chemistry, 46, 788 (2009)
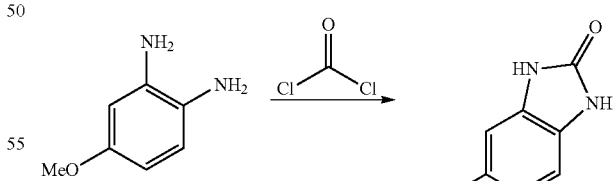
Ger. Offen., 3839743, 31 May 1990
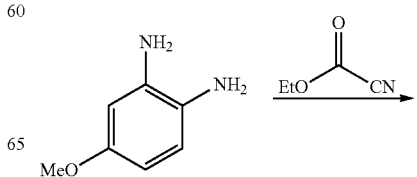

-continued
Letters in Organic Chemistry, 8(6), 406-411; 2011
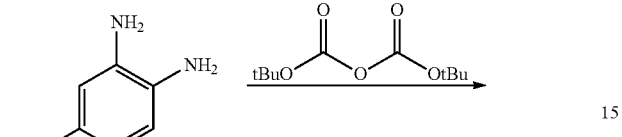
-continued
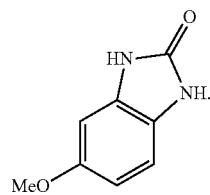
PCT Int. Appl., 2012003418, 5 Jan. 2012
Examples of polymers that can be synthesized according to Scheme 1 include, but are not limited to:
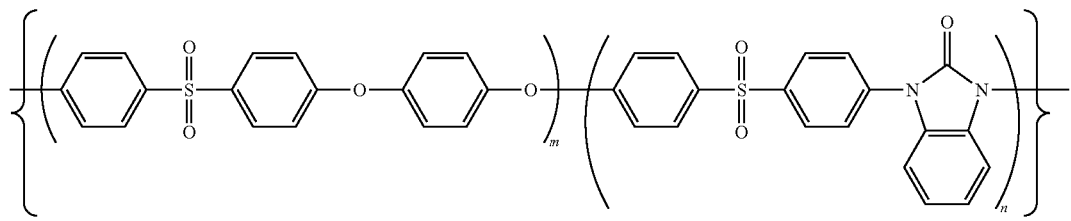
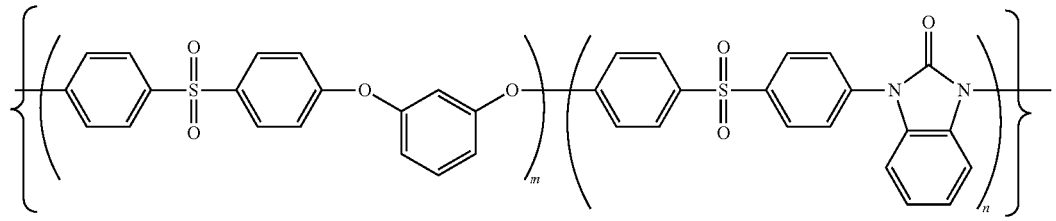
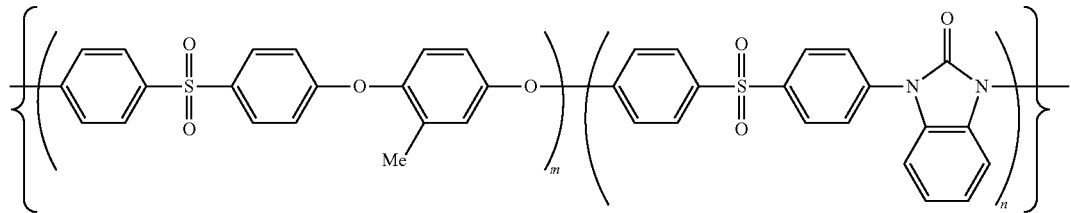
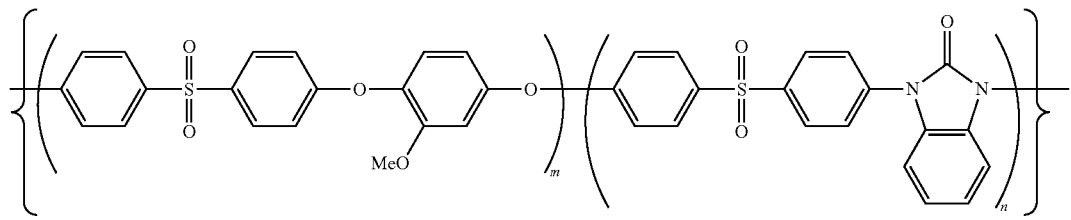
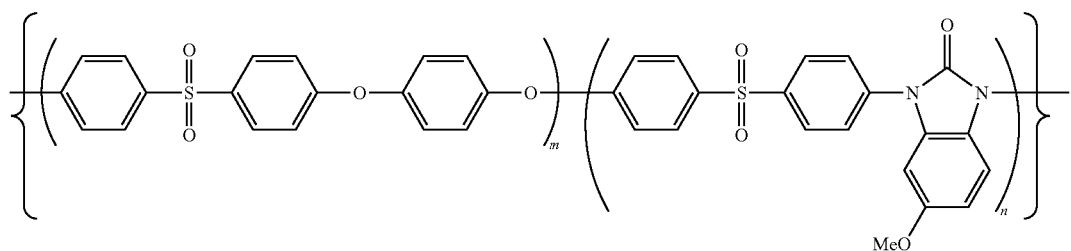

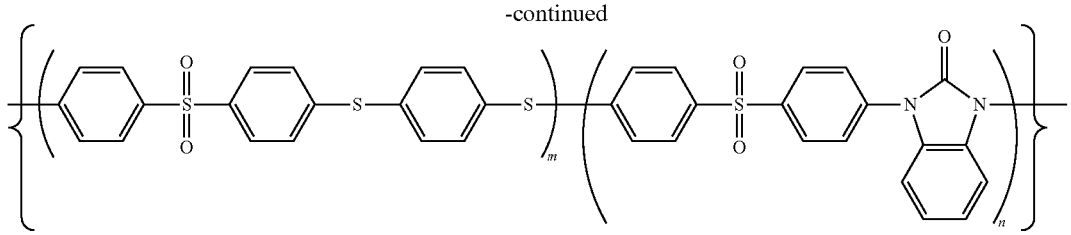

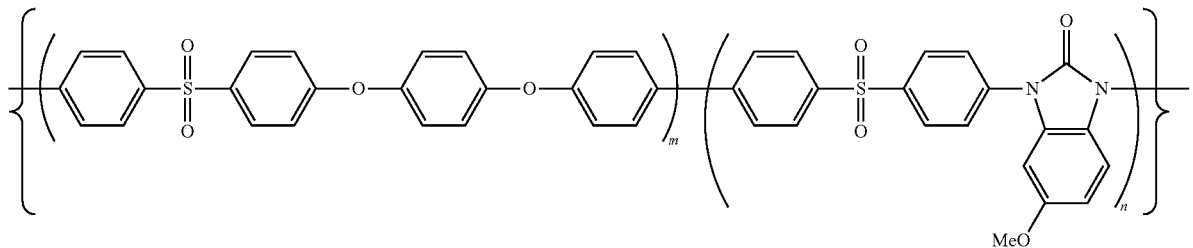

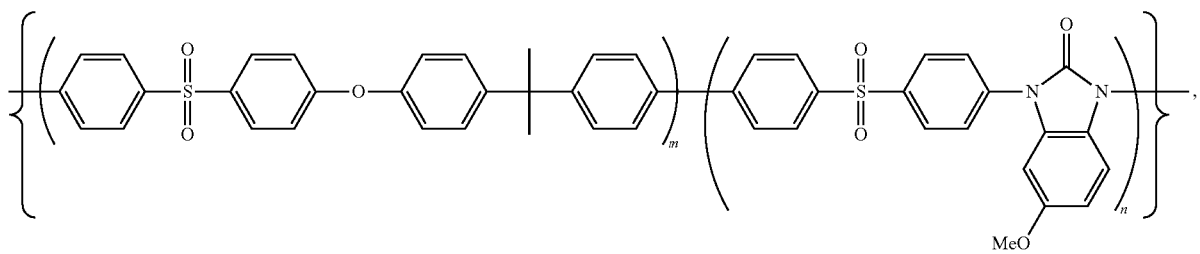

where m and n are real numbers representing mole fractions, wherein 0<m<1 and 0<n<1, and the sum of m and n is about 1.

In another aspect, the present teachings relate to novel polysulfone copolymers that include at least one diphenylsulfonyl unit copolymerized with a benzimidazolonyl unit, where the diphenylsulfonyl unit and/or the benzimidazolonyl unit has functional pendant groups, especially pendant groups having a crosslinkable moiety. For example, the benzimidazolonyl unit in the polysulfone copolymer can have a crosslinkable moiety. Such a polymer can be solution-processed into thin films, where the thin films subsequently can be crosslinked, e.g., via thermal treatment and/or UV irradiation, into physically robust and ambient-stable active or passive materials suitable for use in various electronic, optical, and optoelectronics devices. For example, the polymer materials according to the present teachings can be used (either by itself or with at least one other dielectric material) as the dielectric layer in a thin film transistor, as a passivation material (for example, to encapsulate the source and drain electrodes in a transistor), as an interfacial material (for example, a surface-modifying interlayer), or as a component in the semiconductor layer.

When used as a dielectric material, the present organic materials can exhibit a wide range of desirable properties and characteristics including, but not limited to, low leakage current densities, high breakdown voltages, low hysteresis, large capacitance values, uniform film thickness, solution-processability, fabricability at low temperatures and/or atmospheric pressures, thermal stability, air and moisture stability, resistance to harsh reagents, and/or compatibility with diverse gate materials and/or semiconductors. When used as passivation or interfacial materials, the present organic materials can exhibit desirable properties and characteristics including, but not limited to, high glass transition temperature, high optical clarity, low shrinkage, low moisture absorption, low oxygen penetration, uniform film thickness, solution-processability, fabricability at low temperatures and/or atmospheric pressures, and good adhesion to adjacent materials.

More specifically, the present teachings provide solution-processable polymers that can be crosslinked to provide robust dielectric materials that can exhibit excellent insulating properties and can be used to fabricate various organic electronic devices, including metal-oxide-semiconductor TFTs. The dielectric materials also can be air-stable at elevated temperatures, and have long shelf stability, and can be compatible with metal-oxide-semiconductors deposited by various solution-phase and vapor-phase deposition techniques.

Such novel polysulfone copolymers that include at least one diphenylsulfonyl unit copolymerized with a benzimidazolonyl unit, where the diphenylsulfonyl unit and/or the benzimidazolonyl unit has functional pendant groups, especially pendant groups having a crosslinkable moiety, can be represented by formula (IX):

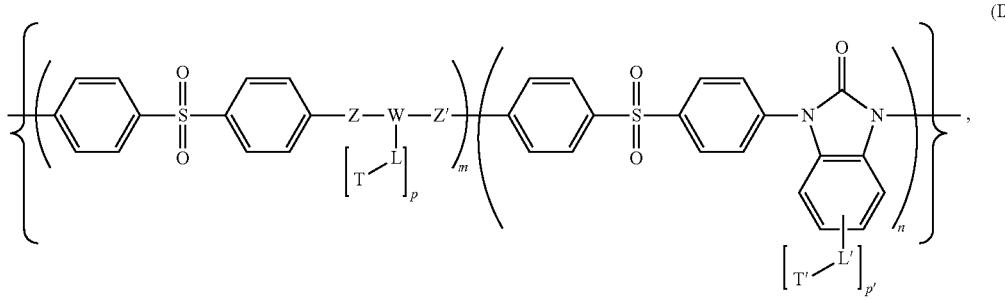

wherein:
L and L', at each occurrence, independently can be selected from the group consisting of —O—, —S—, a divalent $C_{1-10}$ alkyl group, a divalent $C_{6-18}$ aryl group, and a covalent bond;
T and T', at each occurrence, independently can be Q or R, wherein:
  Q is a crosslinkable group; and
  R, at each occurrence, is selected from the group consisting of H, a $C_{1-10}$ alkyl group, a $C_{1-10}$ haloalkyl group, and a $C_{6-10}$ aryl group optionally substituted with 1 to 5 substituents independently selected from the group consisting of a halogen and CN;
W can be —Ar[—Y—Ar]$_q$—, wherein:
  Ar, at each occurrence, independently can be a divalent $C_{6-18}$ aryl group;
  Y, at each occurrence, independently can be selected from the group consisting of —O—, —S—, —(CR'R")$_r$—, —C(O)—, and a covalent bond, wherein R' and R", at each occurrence, independently can be selected from the group consisting of H, a halogen, CN, a $C_{1-10}$ alkyl group, and a $C_{1-10}$ haloalkyl group; and r is selected from the group consisting of 1, 2, 3, 4, 5, 6, 7, 8, 9 and 10; and
  q is selected from the group consisting of 0, 1, 2, 3, 4, 5, 6, 7, 8, 9 and 10;
Z and Z' independently can be selected from the group consisting of —O—, —S—, and —Se—;
p and p' independently are 1, 2, 3 or 4;
m and n are real numbers representing mole fractions, wherein 0<m<1 and 0<n<1, and the sum of m and n is about 1; and
provided that at least one -L-T group is an -L-Q group, and/or at least one -L'-T group is an -L'-Q group. For example, p and/or p' can be 1, and -L-T and/or -L'-T can be Q or —O—Q.

In another embodiment, the present polysulfone copolymers can be represented by formula (X):

wherein:
L and L', at each occurrence, independently can be selected from the group consisting of —O—, —S—, a divalent $C_{1-10}$ alkyl group, a divalent $C_{6-18}$ aryl group, and a covalent bond;
T and T', at each occurrence, independently can be Q or R, wherein:
  Q is a crosslinkable group; and
  R, at each occurrence, is selected from the group consisting of H, a $C_{1-10}$ alkyl group, a $C_{1-10}$ haloalkyl group, and a $C_{6-10}$ aryl group optionally substituted with 1 to 5 substituents independently selected from the group consisting of a halogen and CN;
W can be a divalent phenyl group;
Z and Z' independently can be selected from the group consisting of —O—, —S—, and —Se—;
p and p' independently are 1, 2, 3 or 4;
m and n are real numbers representing mole fractions, wherein 0<m<1 and 0<n<1, and the sum of m and n is about 1; and
provided that at least one -L-T group and/or at least one -L'-T group is not H. For example, p and/or p' can be 1, and -L-T and/or -L'-T can be OMe, —O—Q, or Q.

As described above, each crosslinkable group Q can be a functional group which includes a double bond, a triple bond, a precursor which is capable of in-situ formation of a double or triple bond, or a heterocyclic addition-polymerizable radical. In certain embodiments, Q can be a functional group that comprises an ethenyl moiety, an ethynyl moiety, a dienyl moiety, an acrylate moiety, a coumarinyl moiety, or a cyclic ether moiety (e.g., epoxy, oxetane, etc.).

The novel polymers according to Formula IX or X can be synthesized via, for example, Reaction A, B, C or D, which can be carried out according to the protocols shown in Scheme 3 below:

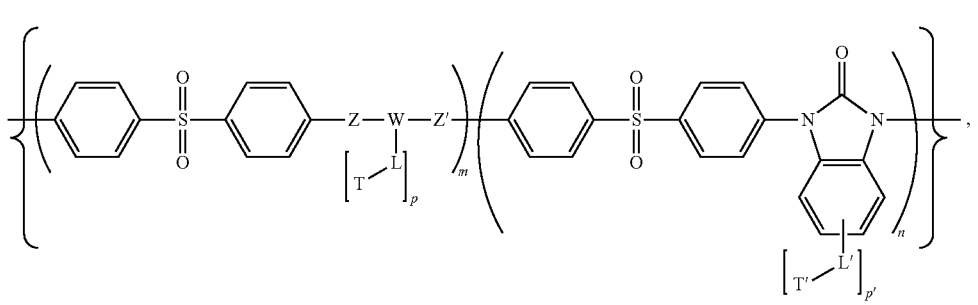

Scheme 3
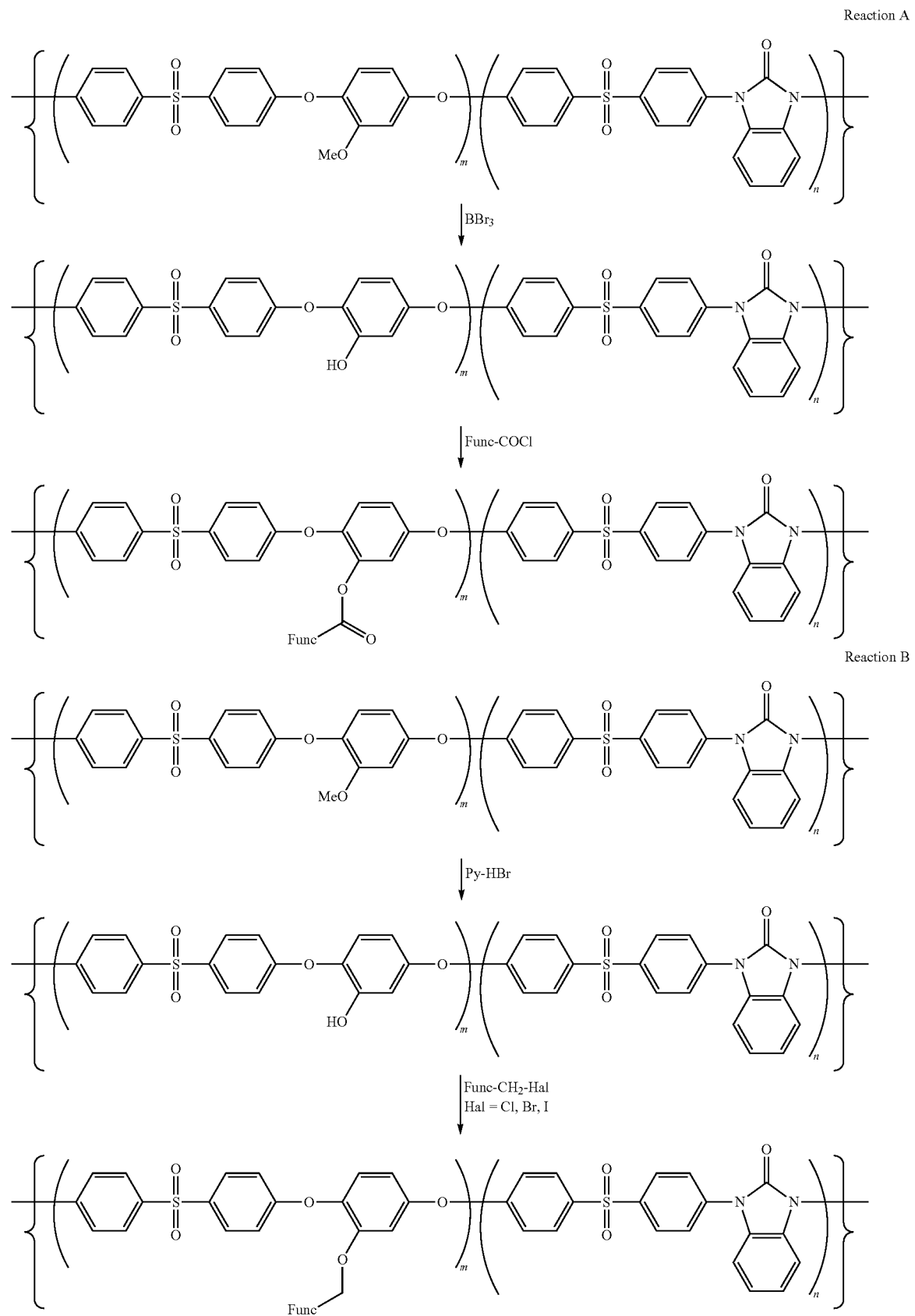

-continued
Reaction C
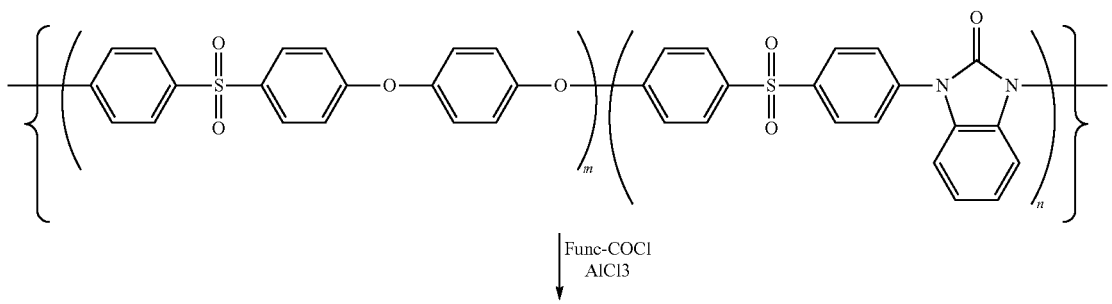
Func-COCl
AlCl3 ↓
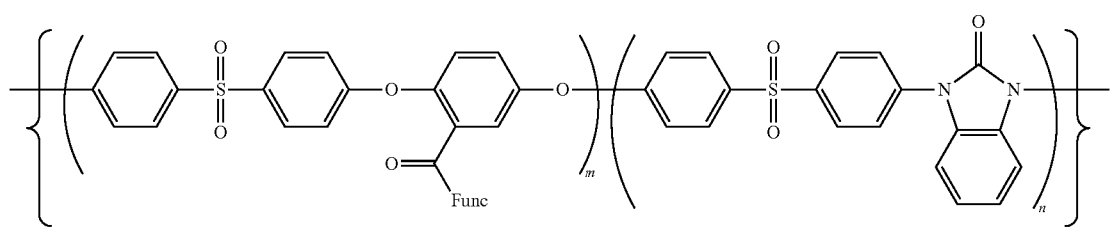
Reaction D
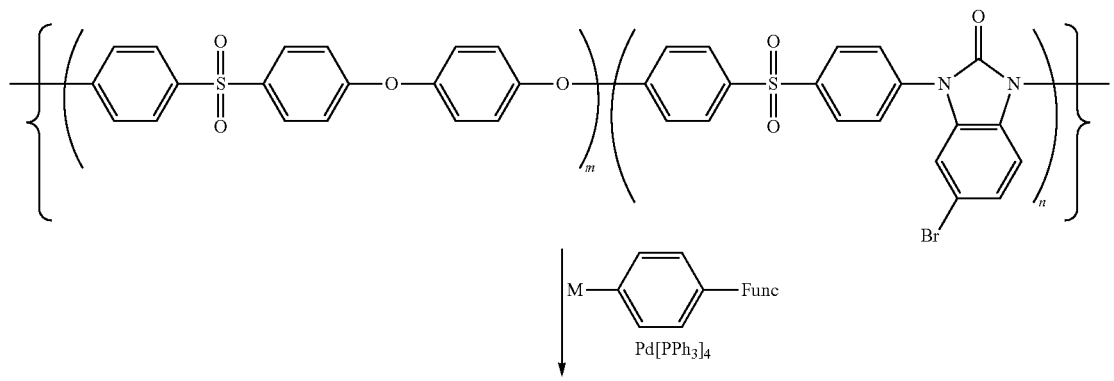
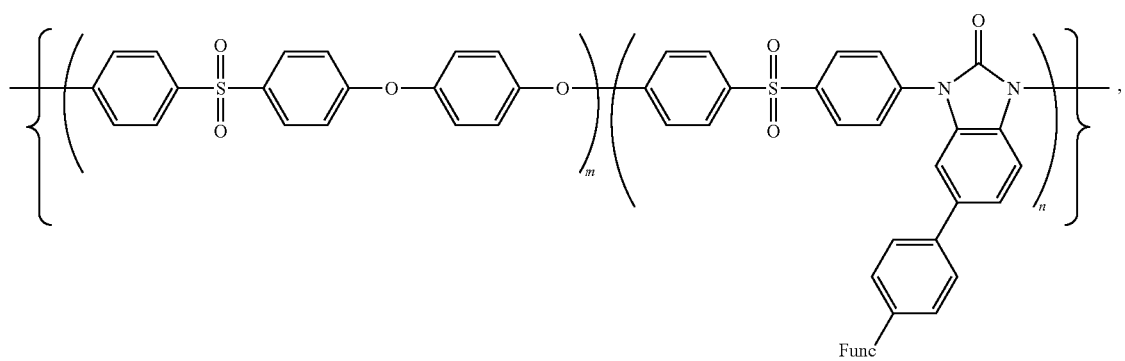
M = -SnMe3, -B(OH)2, —B(OCMe2CMe2O)

where Func can be selected from the group consisting of:
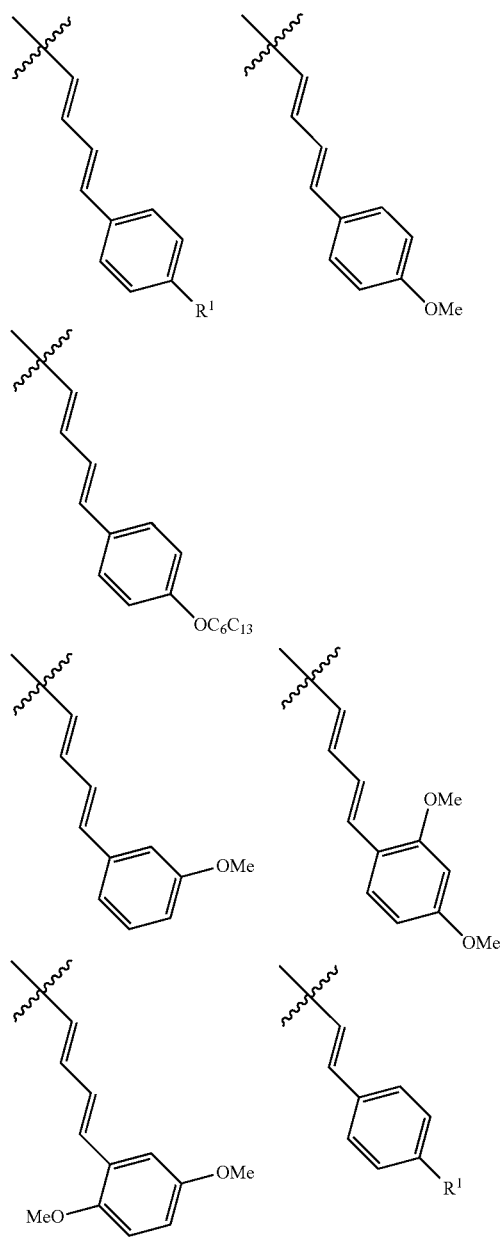
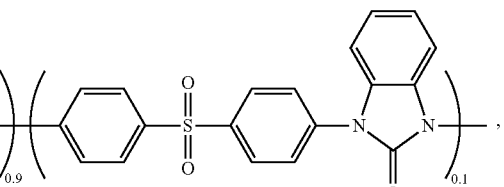
where $R^1$ is H, F, CN, a $C_{1-10}$ alkyl group, a $C_{1-10}$ haloalkyl group, and a $C_{1-10}$ alkoxy group.
Examples of polymers that can be synthesized according to Scheme 3 include, but are not limited to:
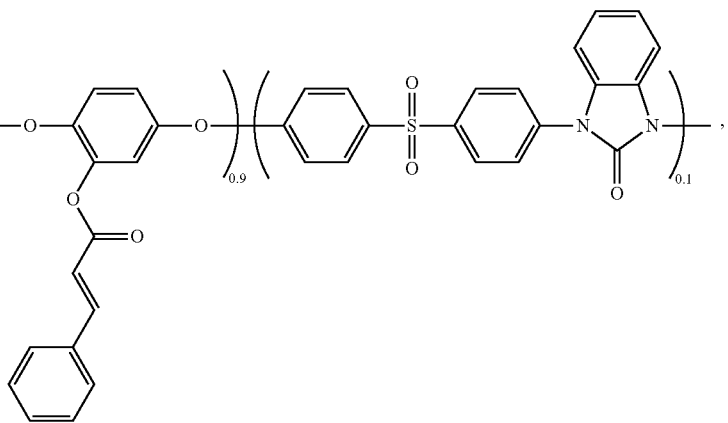

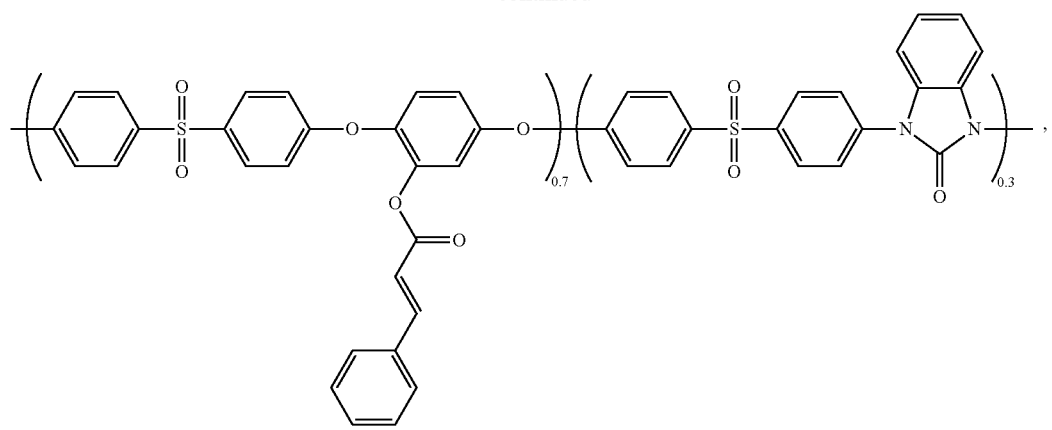
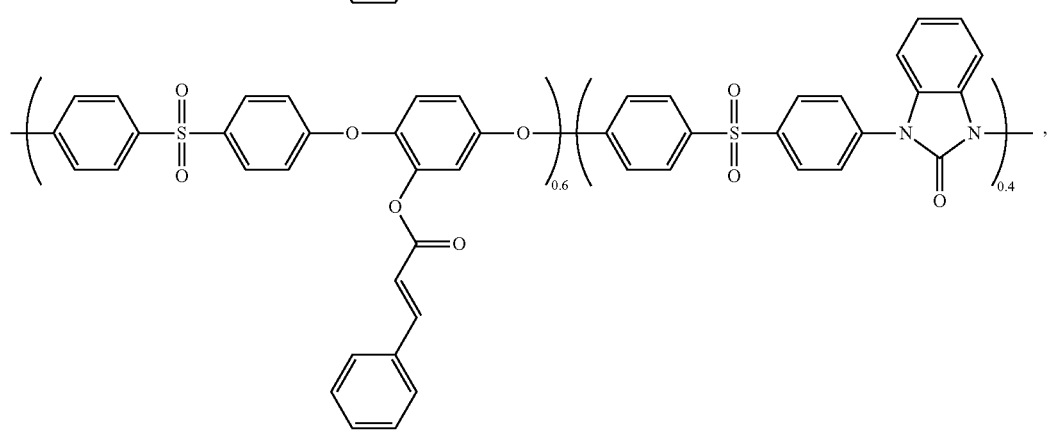
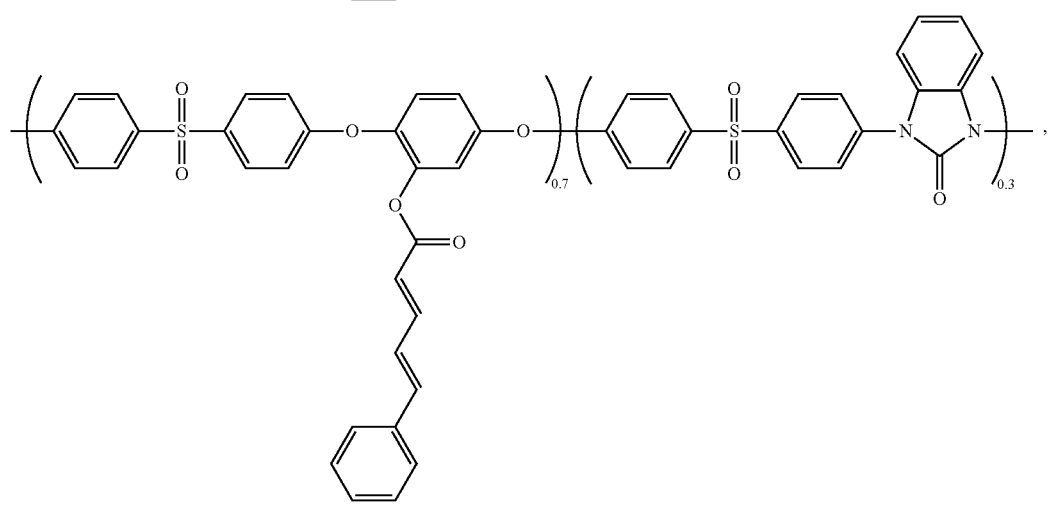
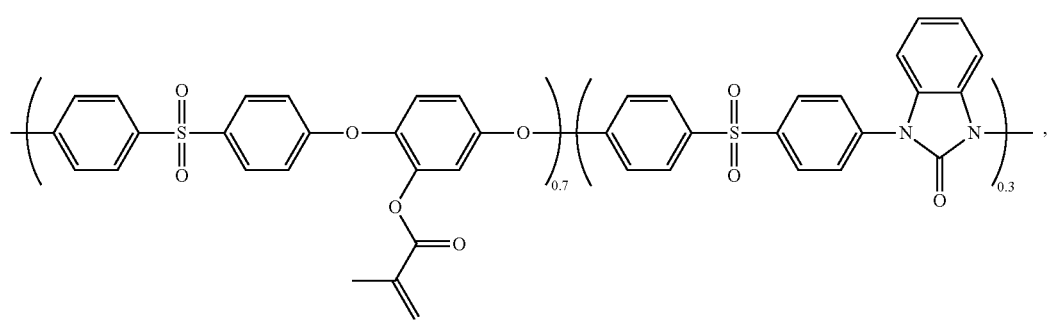

-continued
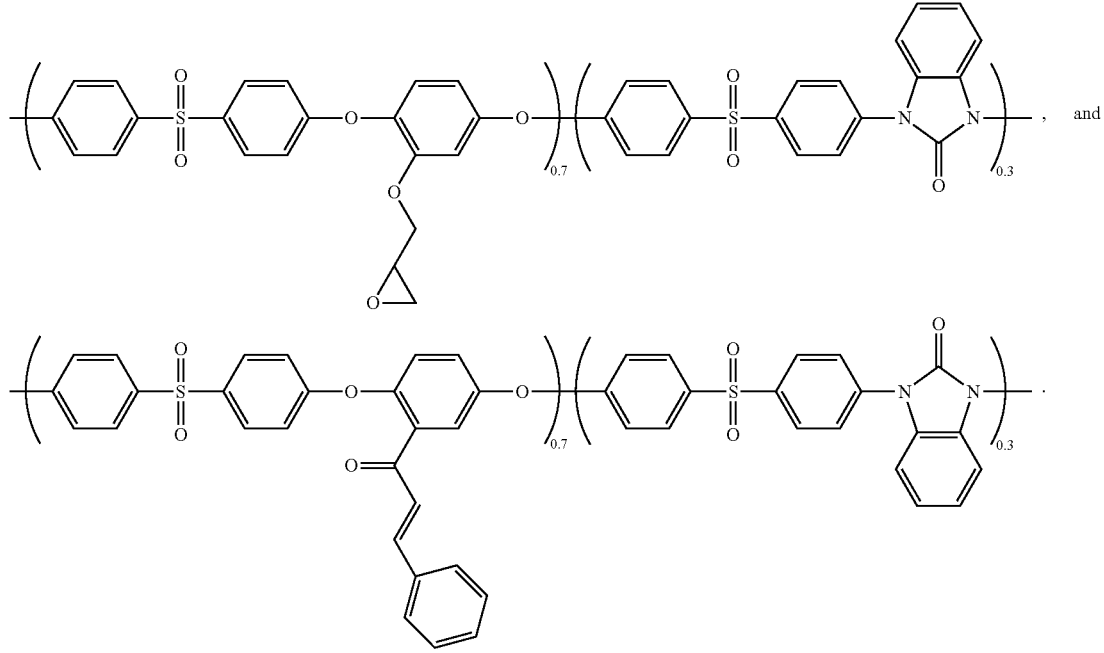
Additional examples of crosslinkable polysulfones according to the present teachings include:
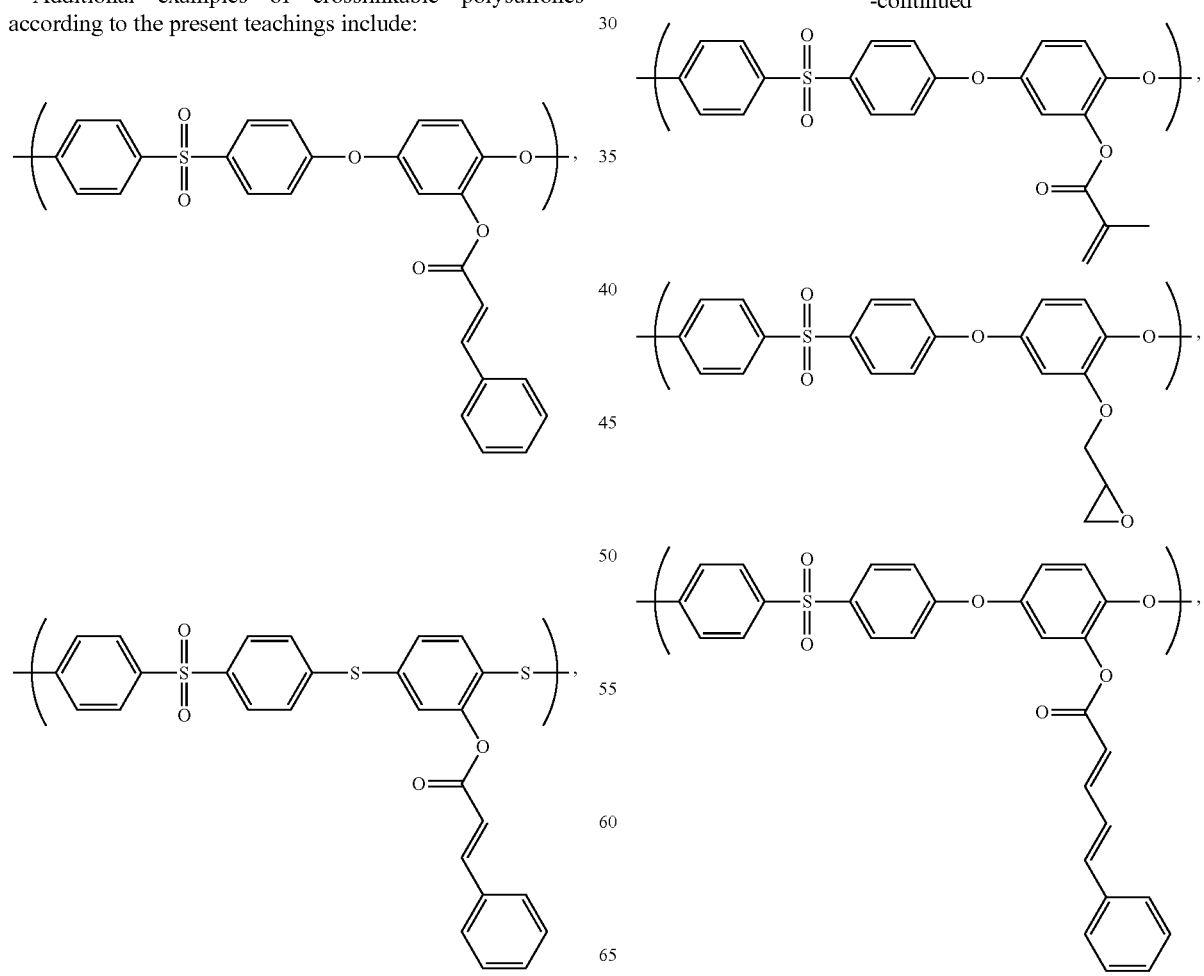

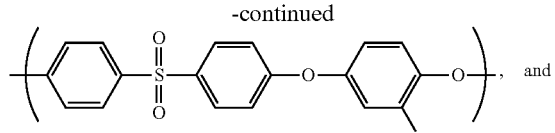

and

Prior to thermal curing and/or photocrosslinking, the polysulfones according to the present teachings generally are soluble in common organic solvents but can become significantly less soluble or insoluble in the same solvents after undergoing crosslinking. As used herein, a compound can be considered soluble in a solvent when at least 1 mg of the compound can be dissolved in 1 ml of the solvent. Compounds wherein less than 1 mg of the compound can be homogeneously dissolved in 1 ml of the solvent are considered insoluble.

More specifically, the polymers disclosed herein (prior to crosslinking) can have satisfactory solubility in various common organic solvents, thereby affording formulations that are suitable for solution-phase processes. Examples of organic solvents that can be used to formulate the present polymers include, but are not limited to, aromatic hydrocarbon solvents such as benzene, cyclohexylbenzene, toluene, xylene, and mesitylene; aliphatic hydrocarbons such as hexanes, cyclopentane, cyclohexane, n-nonane, n-decane, n-undecane, n-dodecane; alcohol solvents such as methanol, ethanol, propanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-butanone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate, methyl lactate, ethyl lactate and γ-butyrolactone; ether solvents such as diisopropyl ether, dibutyl ether, ethyl propyl ether, diethyl ether, bis(2-methoxyethyl)ether, dioxane, anisole, phenetole, and veratrole; and amide solvents such as N-methylpyrrolidinone, dimethyl formamide, and dimethylacetamide. Preferred solvents can include diethyl carbonate, cyclopentanone, PGMEA, anisole, cyclohexanone, dimethylacetamide, diacetone alcohol, tetramethylurea, methylbenzoate, γ-butyrolactone, ethylbenzoate, and propylene carbonate. Any of these solvents can be used either singly or in combination, or as mixtures with water.

Accordingly, the present polymers can be mobilized in a liquid medium to provide a composition (a coating formulation) for forming a thin film material. The composition can be a solution, a dispersion, a suspension, an emulsion, or a gel, although in most embodiments, the composition is a solution or a dispersion suitable for solution-phase processes. The liquid medium can include solid and/or gaseous components, that is, the liquid medium can be in a vapor or gaseous form. As such, the term "liquid medium" can include a vaporized liquid medium. The term "mobilized in a liquid medium" broadly means that the designated liquid medium causes a designated solid to take on properties of a liquid or vapor. For example, the solid can be dissolved in the liquid medium to form a single-phase solution, or the solid can be dispersed in the liquid medium to form a two-phase dispersion. In other embodiments, the solid and the liquid medium can be combined together to form an emulsion, a suspension, a gel, or even micelles. As used herein, the term "solution" means that a substantial proportion of a designated solute has formed a single phase with a designated solvent, but a substantial solid, liquid and/or gaseous second phase that can include dispersed particulate matter also can be present.

In addition to the present polymers, the coating formulation can include other components that can be used to selectively modify certain properties such as the viscosity of the coating formulation, or the dielectric properties, thermal stability, and/or glass transition temperature of the film material to be formed. The coating formulation also can include initiators and/or additional crosslinking agents to enhance the crosslinkability (e.g., speed up curing time or reduce curing temperature or radiation dosage) and/or to increase the crosslinking density of the present polymers. Examples of initiators can include radical initiators such as azobisisobutyronitrile (AIBN), photoacid generators (PAGs) such as triphenylsulfonium triflate, radical photoinitiators such as diphenyl(2,4,6-trimethylbenzoyl)phosphine oxide (TPO), or photosensitizers such as benzophenone and 1-chloro-4-propoxy-9H-thioxanthen-9-one. Some commercially available PAGs are:

Irgacure PAG 103

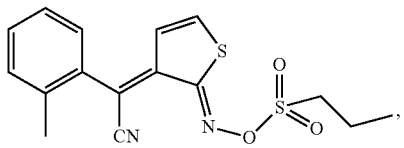

Irgacure PAG 121

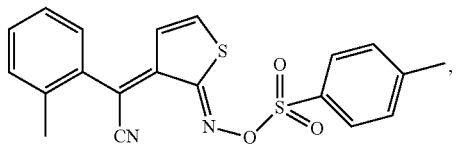

-continued

CGI 1907

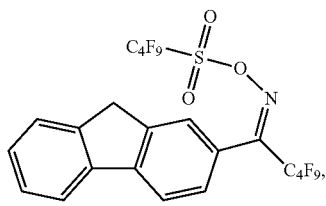

CGI 725

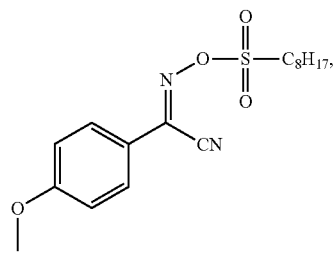

Irgacure PAG 203

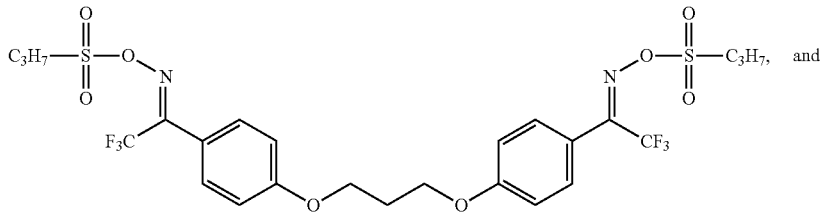

Irgacure PAG 290

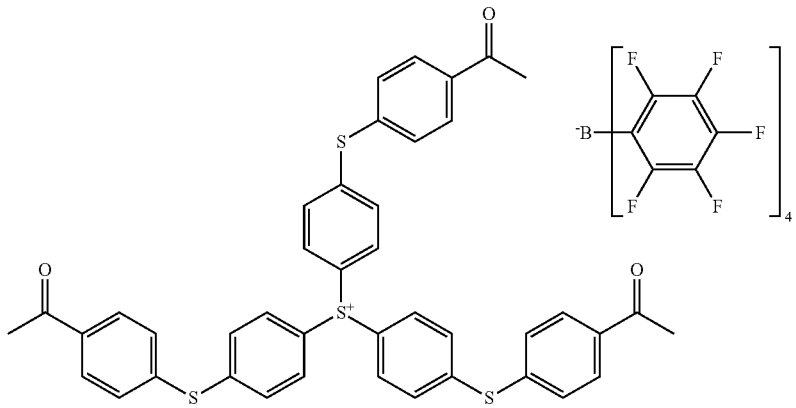

In certain embodiments, the coating formulation can include a small molecule crosslinker or a second crosslinkable polymer, where the small molecule crosslinker or the second crosslinkable polymer can include the same crosslinkable group as the polysulfone. By including the small molecule crosslinker or the second crosslinkable polymer, the resulting polysulfone formulation can lead to a more densely crosslinked film with increased mechanical strength and stronger chemical resistance.

To illustrate, in certain embodiments, a crosslinked film according to the present teachings can be deposited from a blend formulation, where the blend formulation includes (a) a polysulfone functionalized with a crosslinkable group Q, and (b) a small molecule crosslinker or a polymeric crosslinker, where the small molecule crosslinker or the polymeric crosslinker is functionalized with the same crosslinkable group Q as the polysulfone, and where the polymeric crosslinker has a different backbone than the polysulfone. For example, the polymeric crosslinker can have a backbone selected from poly(vinylphenol), poly(vinyl alcohol), and poly(methyl methacrylate). The polysulfone can be present in the blend formulation (relative to the small molecule crosslinker or the polymeric crosslinker) at a weight ratio greater than about 60%, preferably greater than about 70%, and more preferably greater than about 80%.

In particular embodiments where the polysulfone is functionalized with a cinnamoyl-containing crosslinkable group Q, a blend formulation according to the present teachings can comprise any of the polymeric crosslinkers described in U.S. Pat. Nos. 7,981,989 and 8,338,555 including, but not limited to:

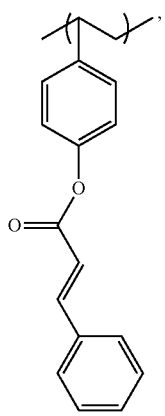

-continued

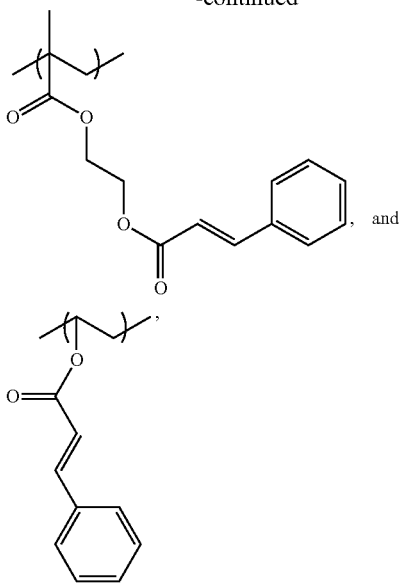
and and/or a small molecule crosslinker such as:

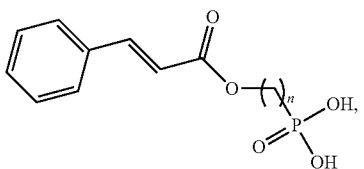
n = 3 to 11

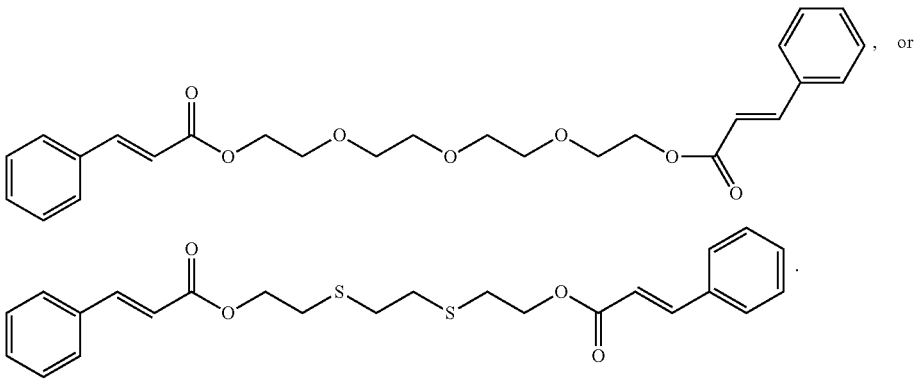

In particular embodiments where the polysulfone is functionalized with an epoxy-containing crosslinkable group Q, a blend formulation according to the present teachings can comprise an epoxide polymer such as those described in U.S. patent application Ser. No. 13/742,867:

or a diglycidyl ether polymer such as:

poly(ethylene glycol) diglycidyl ether poly(propylene glycol) diglycidyl ether and/or a small molecule crosslinker such as:

trimethylolpropane triglycidyl ether

-continued

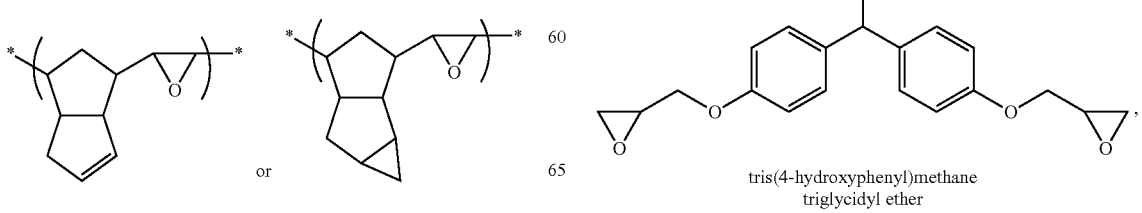

tris(4-hydroxyphenyl)methane triglycidyl ether

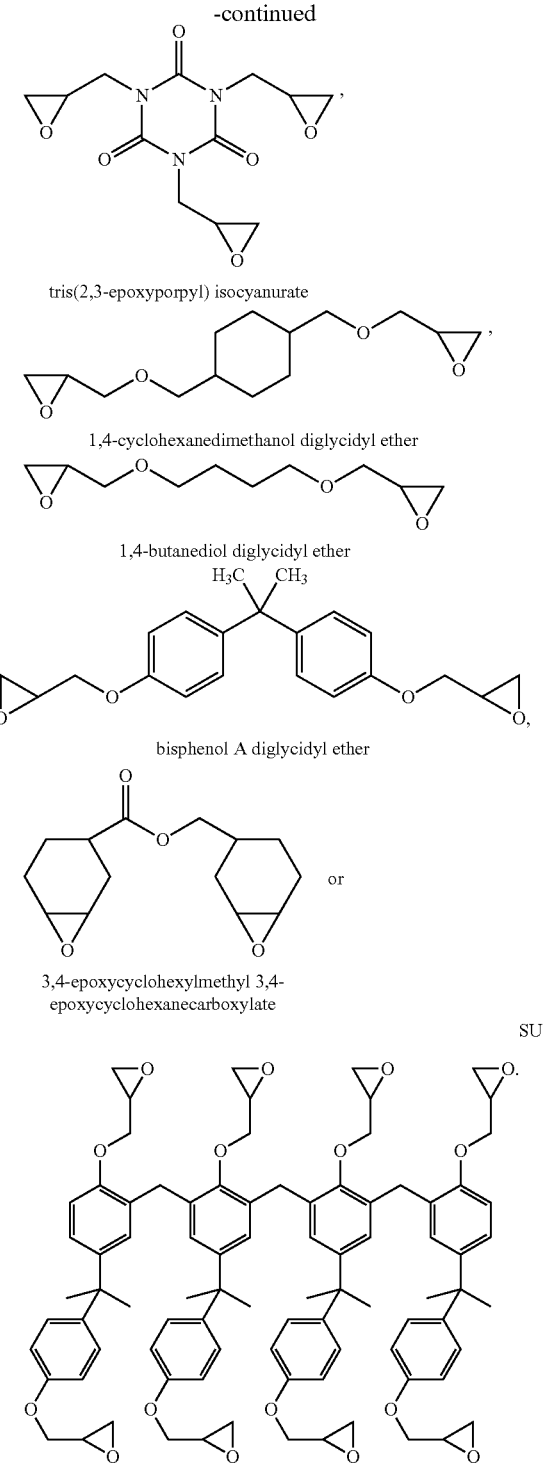

As used herein, "solution-processable" or "solution-processed" refers to the ability of a compound, for example, the present polymers, to be processed via various solution-phase processes. A coating formulation comprising the present polymers can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity. For noncontact printing techniques such as inkjet printing, the solubility requirement generally can be less stringent and a solubility range as low as about 1-4 mg/ml can suffice. For gravure printing, a higher solubility range may be necessary, often in the range of about 50-100 mg/ml. Other contact printing techniques such as screen-printing and flexo printing can require even higher solubility ranges, for example, about 100-1000 mg/ml.

Polymers of the present teachings can be deposited on a substrate to form a film which can take various forms including a wafer, a layer, a sheet, or an elongated web. Thin film materials based upon a polymer according to the present teachings can be monolithic (composed of a single homogenous layer) or can have multiple sublayers, where the multiple sublayers can have identical (homogeneous) or different (heterogeneous) chemical compositions. The polymeric film then can be patterned using standard lithographic methods. Accordingly, a patterned polymeric film comprising the present polymer can be prepared by depositing a solution comprising the present polymer (including a blend formulation described hereinabove) to form a polymeric film of a desired thickness, coating the polymeric film with a photoresist solution in which the present polymer is insoluble to form a photoresist, developing the photoresist, etching the polymeric film, and finally stripping off the photoresist.

As described above, certain embodiments of the polymers disclosed herein can have the advantageous ability to crosslink after deposition onto a substrate. The crosslinking functionality allows formation of a film composed of a densely crosslinked polymeric matrix. The crosslinked polymeric matrix can be robust enough to withstand various conditions that are common in device fabrication processes, including patterning and subsequent solution-phase processes, for example, to form/deposit overlying layers (e.g., the oxide semiconductor layer). In some embodiments, the crosslinking chemistry can include a 2+2 photo-stimulated cycloaddition that provides stable cyclobutane moieties. In some embodiments, the crosslinking chemistry can involve free radical polymerization of an alkyne or acrylate, and/or acid polymerization of an epoxide. Depending on the specific crosslinkable group employed in the present polysulfone, the crosslinking step can be carried out via thermal annealing, irradiation, or both.

For example, in embodiments where the present polysulfone is functionalized with an epoxide-containing crosslinkable group, such polysulfones can undergo thermal crosslinking without any auxiliary reagents (e.g., hardeners) at an elevated temperature of about 150-200° C. Such polysulfones also can be cured with or without thermal treatment via reaction with a hardener, which can be any molecule containing a reactive hydrogen. Common classes of hardeners include amines, alcohols, thiols, amides, urea, and anhydrides. Epoxy-functionalized polysulfones also can be photocrosslinked when photoacid generators are included in the coating formulation as additives.

In embodiments where the present polysulfone is functionalized with a coumarin-containing crosslinkable group, such polysulfones can undergo photocrosslinking without any auxiliary reagents (e.g., photosensitizers). However, photosensitizers may be used to speed up the curing time.

In embodiments where the present polysulfone is functionalized with a benzocyclobutene-containing crosslinkable group, such polysulfones can undergo thermal crosslinking without any auxiliary reagents. However, these polysulfones also can be photocrosslinked when used with bis-azide photocrosslinkers.

In embodiments where the present polysulfone is functionalized with a double or triple bond-containing crosslinkable group such as:

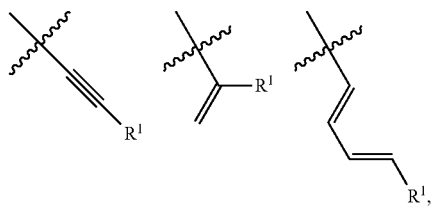

such polysulfones can be thermally crosslinked without any auxiliary reagents or with another compound (small molecule or polymer) having a double or triple-bond containing crosslinkable group. These polysulfones also can be cured via reaction with thiol (e.g., thiol-ene photopolymerization).

In embodiments where the present polysulfone is functionalized with a dienyl-containing crosslinkable group, such polysulfones can be thermally crosslinked without any auxiliary reagents. However, these polysulfones also can be blended with another compound (small molecule or polymer) having a double (e.g., dienyl) or triple-bond containing crosslinkable group, then thermally crosslinked. Self-photocrosslinking also is possible with these polysulfones, although photosensitizers can be used to speed up the curing time. Alternatively, thiol-ene polymerization can be used to crosslink these polysulfones.

In embodiments where the present polysulfone is functionalized with a cinnamoyl-containing crosslinkable group, such polysulfones can be blended with another compound (small molecule or polymer) having a double (e.g., dienyl) or triple-bond containing crosslinkable group, then thermally crosslinked. In preferred embodiments, these polysulfones can be photocrosslinked without any auxiliary reagents, although photosensitizers can be used to speed up the curing time. Alternatively, thiol-ene polymerization can be used to crosslink these polysulfones.

Films composed of a crosslinked polymeric matrix as described herein can be patterned using photolithography. Alternatively, photocurable polymers of the present teachings can be directly patterned by exposing the uncrosslinked film to radiation using an appropriate photomask. The process generally involves depositing a solution comprising a present polymer to form a polymeric film of desired thickness, exposing the polymeric film to radiation (e.g., H, I, or G line wavelengths) through a photomask to provide crosslinked areas and uncrosslinked areas, and stripping the uncrosslinked areas. Subsequent to the formation of the crosslinked matrix, the film material of the present teachings can be subjected to further patterning and processing steps, by which additional layers, including additional dielectric, semiconductor and/or conducting layers, can be formed on top of the material.

As mentioned above, the present polysulfone copolymers can exhibit very low leakage current densities. Leakage current density typically is defined as a vector whose magnitude is the leakage current per cross-sectional area. As used herein, "leakage current" refers to uncontrolled ("parasitic") current flowing across region(s) of a semiconductor structure or device in which no current should be flowing, for example, current flowing across the gate dielectric in a metal-oxide-semiconductor (MOS) structure. As known by those skilled in the art, the leakage current density of a dielectric material can be determined by fabricating a standard metal-insulator-semiconductor (MIS) and/or metal-insulator-metal (MIM) capacitor structures with the dielectric material, then measuring the leakage current, and dividing the measured current by the area of the metal electrodes.

Polymers of the present teachings and their crosslinked products can have very low leakage current densities as measured from standard MIS and MIM capacitor structures. For example, polymers of the present teachings and their crosslinked products can have a leakage current density of less than or equal to about $4 \times 10^{-8}$ A/cm$^2$ at 2 MV/cm, less than or equal to about $2 \times 10^{-8}$ A/cm$^2$ at 2 MV/cm, less than or equal to about $1 \times 10^{-8}$ A/cm$^2$ at 2 MV/cm, less than or equal to about $8 \times 10^{-9}$ A/cm$^2$ at 2 MV/cm, less than or equal to about $7 \times 10^{-9}$ A/cm$^2$ at 2 MV/cm, less than or equal to about $6 \times 10^{-9}$ A/cm$^2$ at 2 MV/cm, less than or equal to about $4 \times 10^{-9}$ A/cm$^2$ at 2 MV/cm, less than or equal to about $2 \times 10^{-9}$ A/cm$^2$ at 2 MV/cm, or less than or equal to about $1 \times 10^{-9}$ A/cm$^2$ at 2 MV/cm. Polymers of the present teachings also can exhibit low leakage current densities at higher voltages, for example, a leakage current density of less than or equal to about $1 \times 10^{-6}$ A/cm$^2$ at 4 MV/cm, less than or equal to about $5 \times 10^{-7}$ A/cm$^2$ at 4 MV/cm, less than or equal to about $3 \times 10^{-7}$ A/cm$^2$ at 4 MV/cm, less than or equal to about $1 \times 10^{-7}$ A/cm$^2$ at 4 MV/cm, less than or equal to about $5 \times 10^{-8}$ A/cm$^2$ at 4 MV/cm, or less than or equal to about $1 \times 10^{-8}$ A/cm$^2$ at 4 MV/cm.

Dielectric materials prepared from polymers of the present teachings also were found to be able to withstand very high breakdown voltages (i.e., the maximum voltage difference that can be applied across the dielectric before it breaks down and begins to conduct). For example, dielectric materials of the present teachings can withstand a breakdown voltage of 4 MV/cm or higher, a breakdown voltage of 6 MV/cm or higher, or a breakdown voltage of 7 MV/cm or higher.

Polymers of the present teachings also can have relatively high glass transition temperatures. For example, polymers of the present teachings can have a glass transition temperature greater than about 100° C., a glass transition temperatures greater than about 110° C., a glass transition temperatures greater than about 120° C., a glass transition temperatures greater than about 130° C., a glass transition temperatures greater than about 140° C., a glass transition temperatures greater than about 150° C., a glass transition temperatures greater than about 160° C., or a glass transition temperatures greater than about 170° C. In particular embodiments, polymers of the present teachings can have a glass transition temperature in the range of about 140° C. to about 160° C.

Glass transition temperature ($T_g$) can be defined as the midpoint of a temperature range at which a material gradually becomes more viscous and changes from a rubbery state to a glassy state.

Furthermore, polymers of the present teachings can have relatively high decomposition temperatures. For example, polymers of the present teachings can have a decomposition temperature greater than about 200° C., a decomposition temperature greater than about 220° C., a decomposition temperature greater than about 240° C., a decomposition temperature greater than about 260° C., a decomposition temperature greater than about 280° C., a decomposition temperature greater than about 300° C., a decomposition temperature greater than about 320° C., or a decomposition temperature greater than about 340° C. The decomposition temperature ($T_d$) of a polymer can be defined as the temperature in a thermogravimetric analysis (TGA) plot where the polymer loses ~5% of the initial mass.

Dielectric materials prepared from polymers of the present teachings can allow surface planarization and filling of pinholes before crosslinking, hence improving surface smoothness (for example, achieving a sub-nanometer surface roughness), and accordingly, device performance and operation. Pinholes also can be filled by depositing two or more layers of dielectric materials sequentially on top of one another, hence forming a multilayer dielectric material that can have very good surface uniformity and can be essentially pinhole-free over a large area.

For example, certain embodiments of a dielectric material according to the present teachings can be a multi-layer laminate having two or more layers of dielectric materials sequentially deposited on top of each other (although one or more interlayers can be present), where at least one of the layers is prepared from a composition including a polymer according to the present teachings. For example, the multi-layer laminate can include at least one layer prepared from a composition including the present polymers alone in a liquid medium, and at least one layer prepared from a dielectric polymer or an inorganic (e.g., metal oxide) dielectric material. In embodiments where the dielectric material is a multi-layer laminate including both organic (such as the present polysulfone) and inorganic (such as silicon nitride or oxide) sublayers, a hybrid layer (such as a blend of polysulfone with metal oxide particles or a small molecule silane, phosphonate, or thiolate) can be present to improve adhesion between the sublayers.

Examples of linear dielectric polymers that can be used in combination with the present polymers (either in the same dielectric layer or in a separate dielectric layer) can include, without limitations, fluorinated para-xylene, fluoropolyarylether, fluorinated polyimide, polystyrene, poly(α-methyl styrene), poly(α-vinylnaphthalene), poly(vinyltoluene), polyethylene, cis-polybutadiene, polypropylene, polyisoprene, poly(4-methyl-1-pentene), poly(tetrafluoroethylene), poly(chlorotrifluoroethylene), poly(2-methyl-1,3-butadiene), poly(p-xylylene), poly(α-α-α'-α'-tetrafluoro-p-xylylene), poly[1,1-(2-methyl propane)bis(4-phenyl) carbonate], poly(cyclohexyl methacrylate), poly(4-chlorostyrene), poly(2,6-dichlorostyrene), poly(4-bromostyrene), poly(2,6-dimethyl-1,4-phenylene ether), polyisobutylene, poly(vinyl cyclohexane), poly(arylene ether), polyphenylene, poly(ethylene/tetrafluoroethyelene), poly(ethylene/chlorotrifluoroethylene), fluorinated ethylene/propylene copolymer, polystyrene-co-α-methyl styrene, ethylene/ethyl acetate copolymer, poly(styrene/butadiene), poly(styrene/2,4-dimethylstyrene), polypropylene-co-1-butene, poly(methyl methacrylate), poly (ethyl methacrylate), poly(2-hydroxyethyl methacrylate), poly(butyl methacrylate), poly(hexyl methacrylate), poly (benzyl methacrylate), poly(vinyl phenol), poly(vinyl alcohol), poly(vinyl alcohol-co-ethylene), poly(isobutylene/methyl methacrylate), poly(vinyl phenol/methyl methacrylate), poly(vinyl chloride), polysaccharides such as 2-hydroxyethyl cellulose, cellulose acetate, cellulose acetate butyrate, ethyl cellulose; cyanated (ethoxylated) polysaccharides such as cyanopullulan (e.g., CYMM®), benzocyclobutene-based polymers, poly(2-vinylpyridine), poly(4-vinylpyridine), poly (4-vinylpyridine-co-butyl methacrylate), poly(4-vinylpyridine-co-styrene), poly(1-vinylpyrrolidone-co-styrene), poly (1-vinylpyrrolidone-co-vinyl acetate), poly(vinylidine fluoride), polyacrylonitrile, poly(acrylonitrile-co-butadiene-co-styrene), poly(acrylonitrile-co-methyl acrylate), polyacrylamide, poly(N-isopropylacrylamide), poly(2-ethyl-2-oxazoline), polyvinylpyrrolidone, poly(pentafluorostyrene), poly(dimethylsiloxane), poly(tetrahydrofuran), poly(methyl vinyl ether), poly(methyl vinyl ether-alt-maleic anhydride), poly(ethyl vinyl ether), poly(ethylene-alt-maleic anhydride), poly(allylamine), poly(ethyleneimine), poly(vinyl acetate), poly(vinyl cinnamate), poly(vinyl stearate), poly(vinyl propionate), poly(vinyl formate), poly(ethylene glycol), poly (propylene glycol), poly(styrene-co-acrylonitrile), poly(maleic anhydride-alt-1-octadecane), poly(tetrahydrofuryl methacrylate), poly(Bisphenol A carbonate), poly(propylene carbonate), poly(1,4-butylene terephthalate), poly(diallyl isophthalate), poly(hexafluoropropylene oxide), poly(fluoropropylene oxide-co-perfluoroformaldehyde), and combinations thereof. In addition, perfluoro(1-butenyl vinyl ether) homocyclopolymers (for example, those under the trade name CYTOP®) can be used. Examples of such fluorinated cyclopolymers include those having one of the following structures:

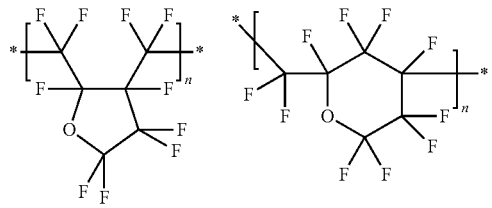

Poly[4,5-difluoro-2,2-bis(trifluoromethyl)-1,3-dioxole-co-tetrafluoroethylene (commercially available under the trade name Teflon® AF 2400) having the following structure also can be used:

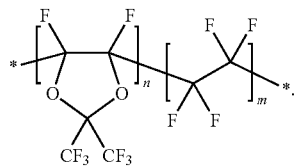

Accordingly, an aspect of the present teachings relates to methods for preparing a dielectric material. The method can include preparing a solution that includes the polymer described herein, and printing the solution onto a substrate to form a dielectric layer. The method can include exposing the dielectric layer to a radiation source (e.g., ultraviolet light) to induce crosslinking, thereby forming a crosslinked dielectric material. The method can also include printing an additional dielectric layer onto the crosslinked dielectric layer to form a multilayer dielectric material.

The present teachings further provide articles of manufacture, for example, composites, that includes a dielectric material of the present teachings and a substrate component and/or a semiconductor component. The substrate component can be selected from, but is not limited to, doped silicon, an indium tin oxide (ITO), ITO-coated glass, ITO-coated polyimide or other plastics, copper, molybdenum, chromium, aluminum or other metals alone or coated on a polymer or other substrate. The composite can include a semiconductor component, particularly, a metal-oxide-semiconductor such as IGZO.

Particularly, the present polymers can be used, in whole or in part, as the dielectric layer of a metal-oxide-semiconductor field-effect transistor (MOSFET), preferably, an IGZO thin film transistor. A typical thin film transistor (TFT) includes a number of layers and can be configured in various ways. For example, a TFT can include a substrate, a dielectric layer, a semiconductor layer, source and drain electrodes in contact with the semiconductor layer, and a gate electrode adjacent to the dielectric layer. When a potential is applied on the gate electrode, charge carriers are accumulated in the semiconductor layer at an interface with the dielectric layer. As a result, a conductive channel is formed between the source electrode and the drain electrode and a current will flow if a potential is applied to the drain electrode.

FIG. 1 illustrates the four common types of TFT structures: (a) bottom-gate top-contact structure, (b) bottom-gate bottom-contact structure, (c) top-gate bottom-contact structure, and (d) top-gate top-contact structure. As shown in FIG. 1, a TFT can include a dielectric layer (e.g., shown as 8, 8', 8", and 8'" in FIGS. 1a, 1b, 1c, and 1d, respectively), a semiconductor/channel layer (e.g., shown as 6, 6', 6", and 6'" in FIGS. 1a, 1b, 1c, and 1d, respectively), a gate contact (e.g., shown as 10, 10', 10", and 10'" in FIGS. 1a, 1b, 1c, and 1d, respectively), a substrate (e.g., shown as 12, 12', 12", and 12'" in FIGS. 1a, 1b, 1c, and 1d, respectively), and source and drain contacts (e.g., shown as 2, 2', 2", 2'", 4, 4', 4", and 4'" in FIGS. 1a, 1b, 1c, and 1d, respectively). One or more optional layers also can be present. For example, an optional buffer layer can be deposited on top of the substrate to improve the wetting and crystallization of an overlying layer. An optional surface-modifying film can be disposed on the gate electrode.

Figure 2:
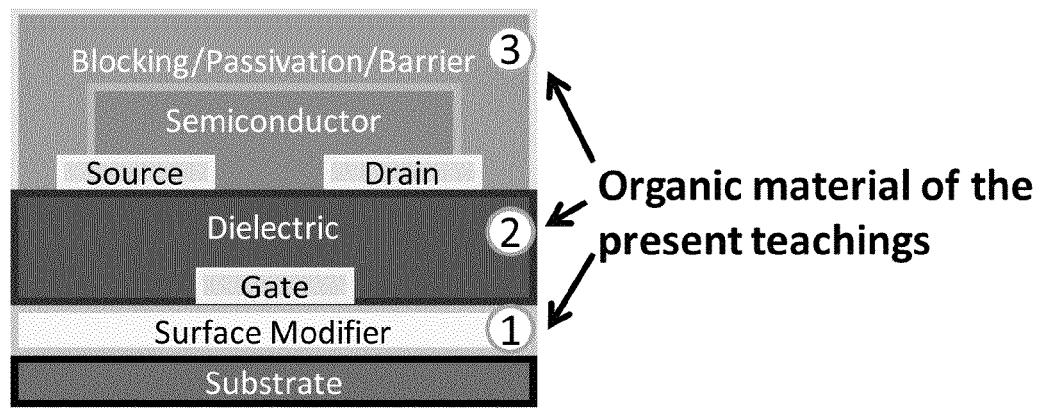
FIG. 2 shows a bottom-gate bottom-contact thin film transistor, illustrating that the polymers of the present teachings can be employed as a surface modifying layer (layer 1), a gate dielectric layer (layer 2), and/or an etch-stop/blocking/passivation/barrier/encapsulation layer (layer 3).

The present polymers also can be incorporated in a TFT, such as an MOSFET, as a component other than the dielectric. Using an example of a bottom-gate top-contact thin film transistor, FIG. 2 illustrates where the organic material of the present teachings can be employed: in layer 1 (as a surface modifier), layer 2 (as the gate dielectric), and/or encapsulation layer 3 (as an etch-stop/blocking/passivation/barrier material).

Accordingly, the present polymers can be deposited as a thin film material adjacent to a semiconductor layer and function as the dielectric layer in a thin film transistor. Specifically, the thin film material can be coupled to the semiconductor thin film layer on one side and an electrically conductive component (i.e., a gate electrode) on the opposite side. The thickness of the dielectric layer typically ranges from about 10 nm to about 5000 nm, preferably from about 50 nm to about 1000 nm, and more preferably from about 200 nm to about 500 nm. In some embodiments, one or more interlayers can be present between the semiconductor layer and the dielectric layer comprising the present polymers. The interlayer(s) can be prepared from one or more dielectric polymers, examples of which are provided hereinbelow. In some embodiments, the interlayer(s) can be composed of an inorganic material such as a silicon nitride ($SiN_x$) film and or a silicon oxide ($SiO_x$) film in a thickness range of X. The inorganic interlayer(s) can be deposited via conventional methods such as thermal evaporation and various physical and chemical vapor deposition techniques (e.g., sputtering, plasma-enhanced chemical vapor deposition (PECVD), atomic layer deposition (ALD), pulsed laser deposition (PLD), and ion-assisted deposition (IAD)).

The semiconductor layer can comprise an inorganic semiconductor material such as silicon, germanium, gallium arsenide, and various metal oxides and metal chalcogenides known in the art. Examples of metal oxide semiconductors include indium oxide ($In_2O_3$), indium zinc oxide (IZO), zinc tin oxide (ZTO), indium gallium oxide (IGO), indium-gallium-zinc oxide (IGZO), indium-gallium-oxide (IGO), indium-ittrium-oxide (IYO), indium tin zinc oxide (ITZO), tin oxide ($SnO_2$), and zinc oxide (ZnO). Examples of metal chalcogenide semiconductors include cadmium sulfide (CdS), cadmium selenide (CdSe), and the like. Solution-phase processed metal oxides and metal chalcogenides are described in, for example, U.S. Pat. No. 8,017,458. Alternatively, the semiconductor layer can comprise a vapor-phase processed (e.g., sputtered) metal oxide or chalcogenide.

A composite including a dielectric material comprising the present polymer in contact with a metal oxide semiconductor component thereon can be prepared by dissolving one or more polymers described herein in an organic solvent to provide a dielectric composition, depositing (e.g., by spin-coating or printing) the dielectric composition onto a substrate to form a dielectric material, and forming a metal oxide semiconductor component thereon. In some embodiments, the method can include performing at least one curing step before or after forming the metal oxide semiconductor component. For example, the curing step can involve heating at a temperature within the range of about 100° C. and about 350° C. (preferably between about 150° C. and about 250° C.) for a duration between about 2 minutes and about 80 minutes (preferably between about 10 minutes and about 30 minutes). The curing step also can involve irradiation (e.g., with ultraviolet light). In certain materials, one or more dielectric polymers (e.g., a polymeric crosslinker described hereinabove) can be added to the dielectric composition prior to the depositing step. In certain embodiments, one or more small molecule crosslinkers can be added to the dielectric composition prior to the depositing step. The metal oxide semiconductor component can be formed by vapor deposition such as sputtering or by solution-phase deposition such as spin-coating, slot die coating, or printing.

In some embodiments, a multi-layer dielectric material according to the present teachings can be prepared by dissolving one or more polymers described herein in an organic solvent to provide a dielectric composition, where the dielectric composition optionally can include a photosensitizer and/or a small molecule or polymeric crosslinker; depositing (e.g., by spin-coating or printing) the dielectric composition onto a substrate to form a first layer; and depositing a composition that includes a dielectric polymer or a metal oxide to form a second layer. After each depositing step, a curing step can be performed, e.g., by heating and optionally irradiation using parameters described herein. An inorganic semiconductor can be formed by vapor deposition such as sputtering or solution by spin-coating, slot die coating or printing.

Uncrosslinked or crosslinked thin film materials prepared from the present polymers also can be used as a passivation layer in a thin film transistor given their barrier properties to moisture and oxygen. When used as a passivation layer, the thin film material can have a thickness in the range of about 0.2 μm to about 5 μm. The passivation layer can be prepared by dissolving one or more polymers described herein in an organic solvent to provide a coating formulation, depositing (e.g., by spin-coating or printing) the coating formulation onto a substrate (e.g., overlying the source and drain electrodes), and optionally performing at least one curing step to form a passivation layer. The curing step can be induced by heat or radiation. For example, the curing step can involve heating at a temperature within the range of about 100° C. and about 350° C. (preferably between about 150° C. and about 250° C.) for a duration between about 5 minutes and about 80 minutes (preferably between about 5 minutes and about 30 minutes). The curing step also can involve irradiation (e.g., with ultraviolet light). By using the present crosslinked organic materials, which can provide improved moisture- and oxygen-blocking properties, as the passivation layer, the thin film transistor can achieve better device reliability. In addition to their use in MOSFETs, because the present polymers can be soluble in solvents that are orthogonal to those typically used to deposit organic semiconducting molecules or polymers, a passivation layer comprising the present polymers can be formed via a solution-phase process on top of the source and drain electrodes in a top-contact organic thin film transistor (OTFT) structure without damaging the organic semiconductor channel region.

Because the present polymers could be crosslinked at relatively low temperatures (e.g., below about 160° C.) or by radiation, they are compatible with a large variety of substrates, including plastic, flexible substrates that have a limited temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be an inexpensive rigid substrate that has relatively low heat and/or chemical resistance. For example, the present organic thin films can be coupled to an inexpensive soda lime glass substrate, as opposed to more expensive and higher heat and/or chemical resistant glass substrates such as quartz and VYCOR®. In embodiments where a very high degree of crosslinking is desirable, higher crosslinking temperatures (e.g., about 350° C.) may be used, in which case, more thermally-resistant plastic substrates or flexible glasses or metals can be used. Substrate-gate materials commonly used in thin-film transistors include doped silicon wafer, tin-doped indium oxide on glass, tin-doped indium oxide on polyimide or mylar film, aluminum or other metals alone or coated on a polymer such as polyethylene terephthalate, a doped polythiophene, and the like.

Accordingly, the present teachings also relate to electronic, optical, or optoelectronic device comprising an organic layer comprising a crosslinked material prepared from at least one of the present polymers, where the organic layer can be in contact or coupled to a semiconductor layer (e.g., an inorganic semiconductor layer) and/or a conductive component (e.g. a metallic contact that functions as either the source, drain, or gate electrode) either directly or via optionally present intervening layer(s) such as a protective or surface modifying interlayer. In various embodiments, the device can be a transistor device, for example a thin film transistor (OTFT) (more specifically, an amorphous semiconductor oxide field effect transistor (ASO FET) or a semiconductor oxide thin film transistor (SOTFT). The source and drain electrodes as well as the gate electrode can be made using various deposition techniques. For example, the source and drain electrodes can be deposited through a mask, or can be deposited then etched. Suitable deposition techniques include electrodeposition, vaporization, sputtering, electroplating, coating, laser ablation and offset printing, from metal or metal alloy including copper, aluminum, gold, molybdenum, silver, platinum, palladium, and/or nickel, or an electrically conductive polymer such as polyethylenethioxythiophene (PEDOT).

An aspect of the present teachings relates to a thin film transistor device including a dielectric layer comprising a dielectric material as described herein, a semiconductor layer, a gate electrode, a source electrode, and a drain electrode. The dielectric layer typically is disposed between the semiconductor layer and the gate electrode. Depending on the device geometry, the source and drain electrodes can be disposed above the semiconductor layer (top-contact), or the semiconductor layer can be disposed above the source and drain electrodes (bottom-contact).

Another aspect of the present teachings relates to methods for fabricating field effect transistors that include a dielectric material of the present teachings. The dielectric materials of the present teachings can be used to fabricate various types of field effect transistors including, but not limited to, top-gate top-contact structures, top-gate bottom-contact structures, bottom-gate top-contact structures, and bottom-gate bottom-contact structures.

In some embodiments, the method can include depositing a dielectric composition according to the present teachings onto a substrate (gate) to form a dielectric layer, wherein the dielectric composition includes one or more polymers described herein; forming a metal oxide semiconductor layer on the dielectric layer; and forming a first electrical contact and a second electrical contact (source and drain) on the semiconductor layer, thereby providing a top-contact bottom-gate metal oxide field effect transistor. The method can include curing the dielectric layer, for example, by heating, by radiation, or by both heating and radiation (in either order) to induce crosslinking In some embodiments, the method can include depositing a dielectric composition according to the present teachings onto a substrate (gate) to form a dielectric layer, wherein the dielectric composition includes one or more polymers described herein; forming a first electrical contact and a second electrical contact (source and drain) above the dielectric material; and forming a metal oxide semiconductor layer above the first and second electrical contacts and the dielectric layer (i.e., to cover the electrical contacts and an area of the dielectric material between the electrical contacts), to provide a bottom-contact bottom-gate metal oxide field effect transistor. The method can include curing the dielectric layer, for example, by heating, by radiation, or by both heating and radiation (in either order) to induce crosslinking In some embodiments, the method can include forming a first electrical contact and a second electrical contact (source and drain) on a substrate; forming a metal oxide semiconductor layer above the first and second electrical contacts (i.e., to cover the electrical contacts and an area of the substrate between the electrical contacts); depositing a dielectric composition according to the present teachings above the semiconductor layer to form a dielectric layer, where the dielectric composition includes one or more polymers described herein; and forming a third electrical contact (gate) above the dielectric material, wherein the third electrical contact is above an area between the first and second electrical contacts, to provide a bottom-contact top-gate metal oxide field effect transistor. The method can include curing the dielectric layer, for example, by heating, by radiation, or by both heating and radiation (in either order) to induce crosslinking.

In some embodiments, the method can include forming a metal oxide semiconductor layer on a substrate; forming a first electrical contact and a second electrical contact (source and drain) above the semiconductor layer; depositing a dielectric composition according to the present teachings above the first and second electrical contacts and an area of the semiconductor layer between the first and second electrical contacts to form a dielectric layer, where the dielectric composition includes one or more polymers described herein; and forming a third electrical contact (gate) above the dielectric material, wherein the third electrical contact is above an area between the first and second electrical contacts, to provide a top-contact top-gate metal oxide field effect transistor. The method can include curing the dielectric layer, for example, by heating, by radiation, or by both heating and radiation (in either order) to induce crosslinking The semiconductor layer and the various electrical contacts can be formed by various deposition processes known to those skilled in the art. For example, the semiconductor layer can be formed by processes such as, but not limited to, sputtering, ion-assisted deposition (IAD), physical vapor deposition, different types of printing techniques (e.g., flexo printing, litho printing, gravure printing, ink-jetting, pad printing, and so forth), drop casting, dip coating, doctor blading, roll coating, and spin-coating. In other embodiments, the semiconductor layer is formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

Yet another aspect of the present teachings relates to methods for fabricating field effect transistors that include a surface-modifying layer of the present teachings. For example, the method can include depositing a surface modifier composition onto a substrate (e.g., glass), wherein the surface modifier composition includes one or more polymers described herein, prior to formation of the source and drain contacts, formation of the semiconductor layer, formation of the gate dielectric layer, and formation of the gate contact (regardless of sequence of these steps as required by the desired configuration). The method can include curing the surface-modifying layer, for example, by heating, by radiation, or by both heating and radiation (in either order) to induce crosslinking.

A further aspect of the present teachings relates to methods for fabricating field effect transistors that include an encapsulation layer of the present teachings. For example, subsequent to the formation of the TFT stack, the method can include depositing a composition including one or more polymers of the present teachings over the entire TFT stack to form an encapsulation layer, and optionally curing the encapsulation layer by heating, by radiation, or by both heating and radiation (in either order) to induce crosslinking. The semiconductor component can comprise an organic semiconductor selected from, but not limiting to, various fused heterocycles, polythiophenes, fused aromatics, and other such organic semiconductor compounds or materials, whether p-type or n-type, otherwise known or found useful in the art. The semiconductor component also can comprise an inorganic semiconductor other than various metal oxide semiconductors already described, such as silicon, germanium, gallium arsenide, and the like. The composite can include one or more electrical contacts. Such electrical contacts can be made of one or more metals (e.g., Mo or a Mo—Cu multilayer electrode) and can function as source, drain, or gate contacts.

Various embodiments of the transistors described herein can be arranged in an array which can be used as switching devices or peripheral drivers in active matrix liquid crystal displays (AMLCDs) and as pixel drivers for active matrix organic light-emitting diodes (AMOLEDs).

In the following examples, polymers and dielectric/passivation materials according to the present teachings were prepared and characterized by various analytical techniques including nuclear magnetic resonance (NMR) spectroscopy, elemental analysis, gel permeation chromatography (GPC), thermogravimetric analysis (TGA), optical microscopy, scanning electron microscopy (SEM), and metal-insulator-semiconductor (MIS) device leakage and impedance spectroscopy measurements, to demonstrate, among other things, their dielectric properties, thermal stability, chemical resistance, and compatibility with oxide semiconductors and photolithography processes. Electronic devices, for example, metal oxide thin film transistors, incorporating these polymeric films also have been fabricated and characterized, data of which are provided below.

The following examples are provided to illustrate further and to facilitate the understanding of the present teachings and are not in any way intended to limit the invention.

Example 1A

Synthesis of $PSA_{0.3}E_{0.7}$-OMe

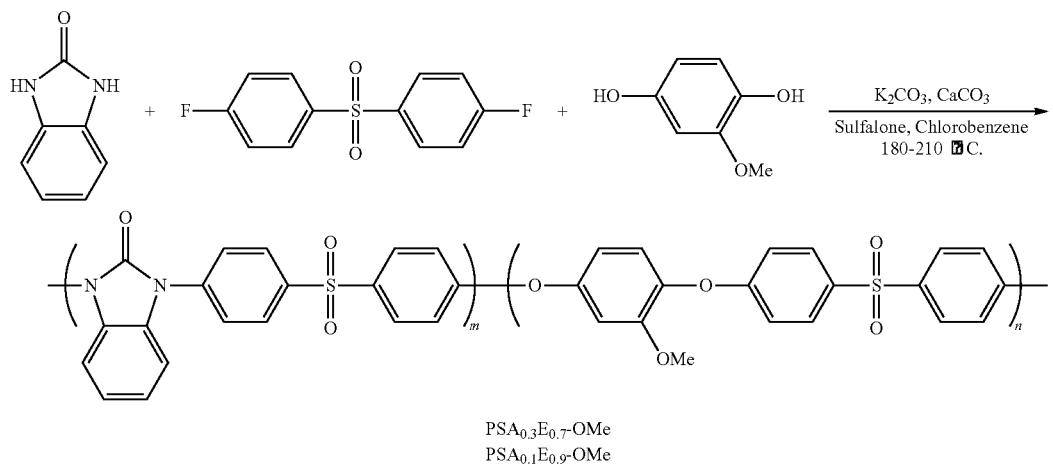

$PSA_{0.3}E_{0.7}$-OMe
$PSA_{0.1}E_{0.9}$-OMe

To an oven-dried 500 mL three-neck round bottom flask equipped with a Dean-Stark trap, a condenser, a magnetic stir bar and an $N_2$ inlet were added 4,4'-difluorodiphenyl sulfone (15.75 g, 61.9 mmol), 2-methoxyhydroquinone (6.10 g, 43.5 mmol), 2-hydroxybenzimidazole (2.50 g, 18.6 mmol), potassium carbonate (8.55 g, 61.9 mmol), calcium carbonate (6.25 g, 61.9 mmol), sulfolane (40 mL) and chlorobenzene (93 mL). The mixture was heated to 180° C. to remove as an azeotrope the resulting water with chlorobenzene for 2 h. Then, chlorobenzene was removed and the resulting mixture was heated at 210° C. for 1 h. Subsequently, an additional amount of sulfolane (50 mL) was added to dilute the mixture, which was heated further at 210° C. for 30 min. The reaction mixture was then cooled to rt, diluted with $CH_2Cl_2$ (50 mL) and precipitated in acidified methanol (500 mL, with 5 mL acetic acid). The crude product was collected via filtration, re-dissolved in $CH_2Cl_2$ (100 mL) and filtered through a layer of CELITE®. The filtrate was precipitated in a methanol/hexane mixture (1/3, v/v, 500 mL), filtered and dried under vacuum overnight to obtain the title polymer as a pale grey solid (14.25 g, 65% yield). Elemental analysis: C % 63.12; H % 3.74; S % 8.75; $^1$H-NMR (CDCl$_3$): δ (ppm) 8.23-8.01 (m, 17H), 8.00-7.66 (m, 50H), 7.24-7.12 (m, 17H), 7.12-7.00 (m, 25H), 7.00-6.90 (m, 17H), 6.90-6.78 (m, 8H), 6.78-6.69 (brs, 8H), 6.69-6.54 (m, 8H), 3.76-3.62 (brs, 25H); GPC (THF): Mn=4.3 kDa, PDI=2.2.

Example 1B

Synthesis of PSA$_{0.1}$E$_{0.9}$-OMe

To an oven-dried 500 mL three-neck round bottom flask equipped with a Dean-Stark trap, a condenser, a magnetic stir bar and an $N_2$ inlet were added 4,4'-difluorodiphenyl sulfone (30 g, 0.12 mol), 2-methoxyhydroquinone (14.9 g, 0.11 mol), 2-hydroxybenzimidazole (1.58 g, 11.8 mmol), potassium carbonate (16.3 g, 0.12 mol), calcium carbonate (11.8 g, 0.12 mol), sulfolane (96 g) and chlorobenzene (180 mL). The mixture was heated to 180° C. to remove water as an azeotrope for 2 h. Then, chlorobenzene was distilled off and the resulting mixture was heated at 210° C. for 1 h. Subsequently, additional sulfolane (120 g) was added to dilute the mixture, which was heated further at 210° C. for 30 min. The reaction mixture was then cooled to rt, diluted with $CH_2Cl_2$ (100 mL) and precipitated in acidified methanol (500 mL, with 5 mL acetic acid). The crude product was collected via filtration, stir-washed with $H_2O$ (100 mL), re-dissolved in $CH_2Cl_2$ (400 mL) and filtered through a layer of CELITE®. The filtrate was concentrated and re-dissolved in $CH_2Cl_2$ (200 mL) and precipitated in a methanol/hexane mixture (1/6, v/v, 2 L), filtered and dried under vacuum at 90° C. overnight to obtain the title polymer as a pale grey solid (28.5 g, 67% yield). $^1$H-NMR (CDCl$_3$): δ (ppm) 8.20-7.60 (m, 42H), 7.19-7.03 (m, 30H), 6.96-6.72 (m, 20H), 6.73 (brs, 9H), 6.03-6.00 (m, 9H), 3.72 (s, 27H); GPC (THF): Mn=6.77 kDa, PDI=1.8

Example 2A

Synthesis of PSE-OMe-4k

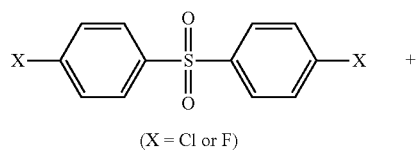

(X = Cl or F)

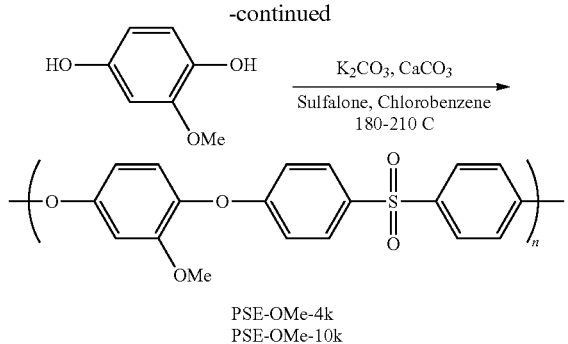

PSE-OMe-4k
PSE-OMe-10k

To an oven-dried 500 mL three-neck round bottom flask equipped with a Dean-Stark trap, a condenser, a magnetic stir bar and an $N_2$ inlet were added 4,4'-dichlorodiphenyl sulfone (10.01 g, 34.8 mmol), 2-methoxyhydroquinone (4.88 g, 34.8 mmol), potassium carbonate (9.62 g, 69.6 mmol), sulfolane (24 mL) and chlorobenzene (45 mL). The mixture was heated to 180° C. to remove as an azeotrope the resulting water with chlorobenzene for 2 h. Then, chlorobenzene was removed and the resulting mixture was heated at 210° C. for 1 h. Subsequently, additional sulfolane (30 mL) was added to dilute the mixture and further heated at 210° C. for 30 min. The reaction mixture was then cooled to rt, diluted with $CH_2Cl_2$ (50 mL) and precipitated in acidified methanol (500 mL, with 5 mL acetic acid). The crude product was collected via filtration, re-dissolved in $CH_2Cl_2$ (100 mL) and filtered through a layer of CELITE®. The filtrate was precipitated in a methanol/hexane mixture (1/3, v/v, 500 mL), filtered and dried under vacuum overnight to obtain the title polymer as a grey solid (10.03 g, 81% yield). $^1$H-NMR (CDCl$_3$): δ (ppm) 7.96-7.70 (m, 4H), 7.11-6.99 (m, 3H), 6.98-6.87 (m, 2H), 6.76-6.67 (brs, 1H), 6.65-6.46 (m, 1H), 3.76-3.62 (brs, 3H); GPC (THF): Mn=3.2 kDa, PDI=1.7.

Example 2B

Synthesis of PSE-OMe-10K

To an oven-dried 500 mL three-neck round bottom flask equipped with a Dean-Stark trap, a condenser, a magnetic stir bar and an $N_2$ inlet were added 4,4'-difluorodiphenyl sulfone (18.3 g, 72 mmol), 2-methoxyhydroquinone (11.0 g, 72 mmol), potassium carbonate (19.9 g, 0.14 mol), calcium carbonate (14.4 g, 0.14 mol), sulfolane (200 g) and chlorobenzene (200 mL). The mixture was heated to 180° C. to remove water by azeotrope for 2 h. Then, chlorobenzene was then distilled off and the resulting mixture was heated at 210° C. for 1 h. Subsequently, additional sulfolane (200 g) was added to dilute the mixture, which was further heated at 210° C. for 30 min. The reaction mixture was then cooled to rt and precipitated into acidified methanol (500 mL, with 5 mL acetic acid). The crude product was collected via filtration, stir-washed with $H_2O$ (100 mL), re-dissolved in $CH_2Cl_2$ (400 mL) and filtered through a layer of CELITE®. The filtrate was concentrated and re-dissolved in $CH_2Cl_2$ (200 mL) and precipitated in a methanol/hexane mixture (1/6, v/v, 2 L), filtered and dried under vacuum at 90° C. overnight to obtain the title polymer as a pale grey solid (11.5 g, 45% yield). $^1$H-NMR (CDCl$_3$): δ (ppm) 7.91-7.82 (m, 4H), 7.10-7.03 (m, 3H), 6.96-6.92 (m, 2H), 6.73 (brs, 1H), 6.63-6.60 (m, 1H), 3.72 (brs, 3H); GPC (THF): Mn=8.0 kDa, PDI=1.53.

Example 3

General Procedure for Demethylation

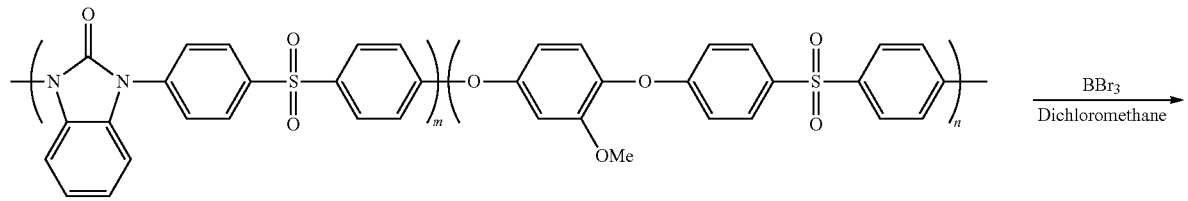

PSE-OMe-4k
PSE-OMe-10k
PSA$_{0.3}$E$_{0.7}$-OMe
PSA$_{0.1}$E$_{0.9}$-OMe

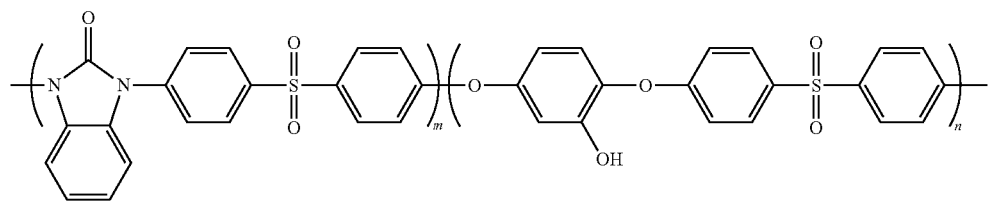

PSE-OH-4k
PSE-OH-10k
PSA$_{0.3}$E$_{0.7}$-OH
PSA$_{0.1}$E$_{0.9}$-OH

A solution of PSE-OMe-4k (1M in CH$_2$Cl$_2$, 1 equiv.) in an oven-dried round bottom flask charged with a stir bar was cooled under N$_2$ in an ice-water bath. Then BBr$_3$ (1 M in CH$_2$Cl$_2$, 1.3 equiv.) was added dropwise to the solution at 0° C. with stirring. A brown-grey precipitate appeared after the completion of addition. The reaction mixture was further stirred at rt for 12 h. Then the mixture was poured into ice water to quench unreacted BBr$_3$ and the solid was collected via filtration, washed with H$_2$O, then CH$_2$Cl$_2$. The crude product was re-dissolved in THF and precipitated in methanol. The precipitate was filtered, washed with methanol and dried under vacuum overnight to obtain the demethylated polymer as a pale grey solid (71-90%).

PSE-OH-4k: $^1$H-NMR (DMSO-d$_6$): δ (ppm) 10.26-10.01 (brs, 1H), 8.12-7.57 (m, 4H), 7.32-6.85 (m, 5H), 6.71-6.65 (brs, 1H), 6.64-6.53 (m, 1H).

PSE-OH-10k: $^1$H-NMR (DMSO-d$_6$): δ (ppm) 9.95 (brs, 1H), 7.76-7.65 (m, 4H), 7.00-6.90 (m, 3H), 6.84-6.80 (m, 2H), 6.49 (brs, 1H), 6.43-6.40 (m, 1H).

PSA$_{0.3}$E$_{0.7}$-OH: Elemental analysis: C % 61.72; H % 4.30; S % 7.67; $^1$H-NMR (DMSO-d$_6$): δ (ppm) 10.36-10.10 (brs, 8H), 8.33-7.58 (m, 67H), 7.49-6.82 (m, 67H), 6.81-6.29 (m, 17H).

PSA$_{0.1}$E$_{0.9}$-OH: $^1$H-NMR (DMSO-d$_6$): δ (ppm) 10.16-10.12 (brs, 9H), 8.20-7.80 (m, 42H), 7.49-7.13 (m, 32H), 7.03-6.90 (m, 18H), 6.09 (brs, 9H), 6.62-6.59 (m, 9H).

Example 4

General Procedure for Attachment of a Cinnamoyl Group

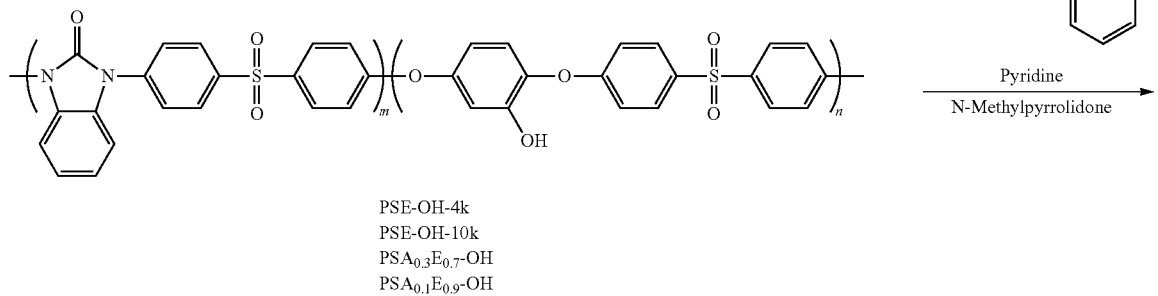

PSE-OH-4k
PSE-OH-10k
PSA$_{0.3}$E$_{0.7}$-OH
PSA$_{0.1}$E$_{0.9}$-OH

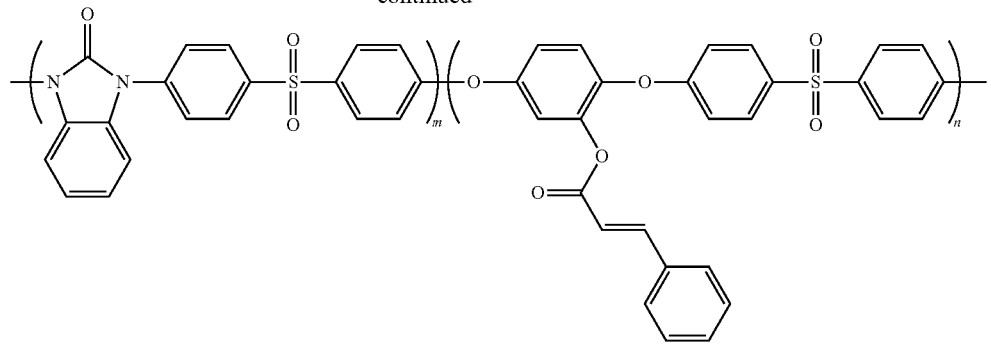

PSECy-4k
PSECy-10k
PSA$_{0.3}$E$_{0.7}$Cy
PSA$_{0.1}$E$_{0.9}$Cy

PSA$_{0.1}$E$_{0.9}$-OH (1 equiv.) was dissolved in pyridine (1 M) and stirred for 2 hours. Cinnamoyl chloride (1.3 equiv.) was dissolved in NMP (2 M, endothermic) and was slowly added to the pyridine solution of PSA$_{0.1}$E$_{0.9}$-OH under N$_2$ and in a water bath. The reaction was exothermic and turned to a clear brownish solution. The reaction suspension was stirred (18 hours) at rt overnight. The solution was slowly poured into MeOH (1:9 v/v) to form a solid and stirred for 4 h. The supernatant was decanted and the solid was stirred with MeOH and washed with MeOH. The wet solid was dried in high vacuum at rt overnight and the solid was dissolved in methylene chloride and the solution was precipitated into a MeOH/hexane mixture (1/6) through filter papers by gravity to form a solid and stirred for 2 h. The supernatant was decanted and the solid was stirred with MeOH and washed with MeOH. The wet solid was dried in high vacuum at rt overnight. The yield was 85~96%.

PSECy-4k: Elemental analysis: C % 65.56; H % 3.87; S % 7.02; Cl % 1.40; $^1$H-NMR (CDCl$_3$): δ (ppm) 8.01-7.67 (m, 4H), 7.67-7.52 (m, 1H), 7.51-7.28 (m, 5H), 7.19-6.86 (m, 6H), 6.86-6.65 (m, 1H), 6.44-6.22 (m, 1H); GPC (THF): Mn=4.6 kDa, PDI=1.7.

PSECy-10k: Elemental analysis: C % 69.98; H % 3.85; S % 6.67; F % 0.21; $^1$H-NMR (CDCl$_3$): δ (ppm) 7.93-7.82 (m, 4H), 7.64-7.59 (m, 1H), 7.45-7.35 (m, 5H), 6.86-6.65 (m, 7H), 6.40-6.35 (m, 1H); GPC (THF): Mn=10.8 kDa, PDI=1.6.

PSA$_{0.3}$E$_{0.7}$Cy: Elemental analysis: C % 62.76; H % 3.41; S % 7.21; F % 0.36. $^1$H-NMR (CDCl$_3$): δ (ppm) 8.19-7.99 (m, 17H), 7.99-7.66 (m, 50H), 7.66-7.51 (m, 8H), 7.48-7.26 (m, 42H), 7.22-6.88 (m, 75H), 6.88-6.69 (brs, 8H), 6.48-6.25 (m, 8H); GPC (THF): Mn=10.8 kDa, PDI=2.6

PSA$_{0.1}$E$_{0.9}$Cy: Elemental analysis: C % 67.97; H % 3.85; S % 7.00; N % 0.48; $^1$H-NMR (CDCl$_3$): δ (ppm) 8.08-7.75 (m, 42H), 7.63-7.59 (m, 9H), 7.43-7.37 (m, 45H), 7.20-6.70 (m, 59H), 6.39-6.35 (m, 9H); GPC (THF): Mn=7.7 kDa, PDI=1.8.

Example 5

General Procedure for Attachment of a Phenylpentadienoyl Group

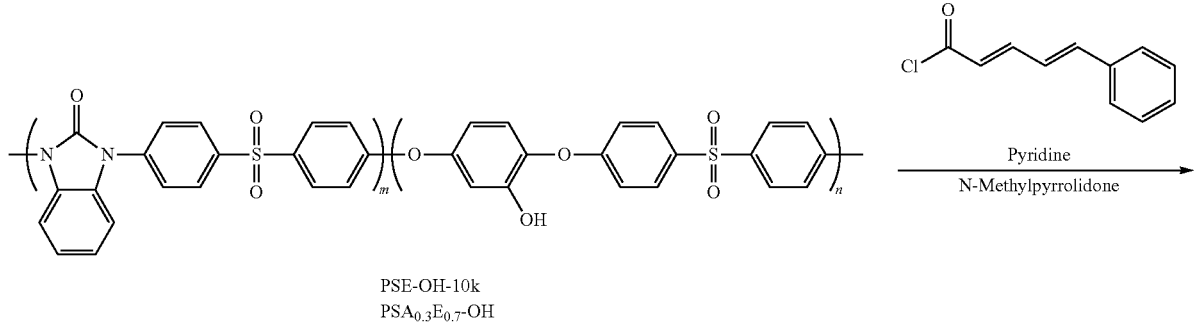

PSE-OH-10k
PSA$_{0.3}$E$_{0.7}$-OH

-continued

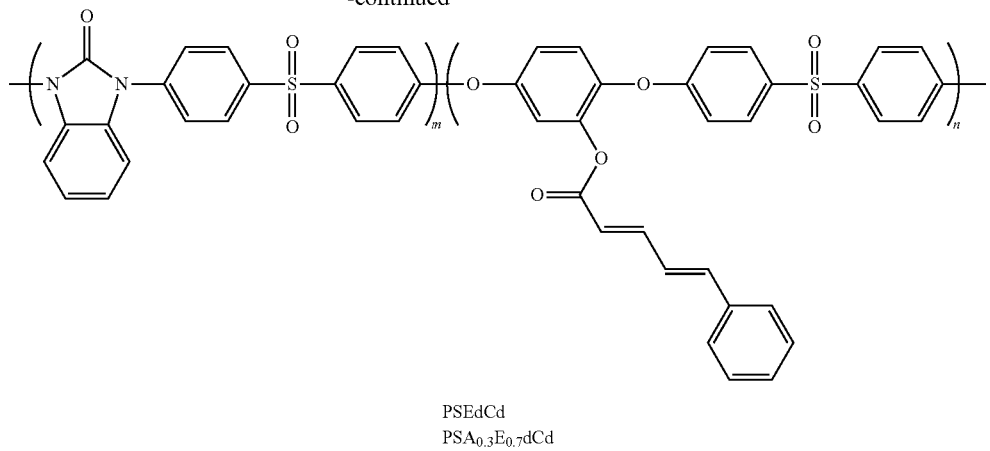

PSEdCd
PSA$_{0.3}$E$_{0.7}$dCd

PSE-OH-10K (1 equiv.) was dissolved in pyridine (1 M) and stirred for 2 hours. 5-Phenylpenta-2,4-dienoyl chloride (1.3 equiv.) was dissolved in NMP (2 M, endothermic) and was slowly added to the pyridine solution of PSE-OH-10K under N$_2$ and in a water bath. The reaction was exothermic and turned to a clear brownish solution. The reaction suspension was stirred (18 hours) at rt overnight. The solution was slowly poured into MeOH (1:9 v/v) to form a solid and stirred for 4 h. The supernatant was decanted and the solid was stirred with MeOH and washed with MeOH. The wet solid was dried in high vacuum at rt overnight and the solid was dissolved in methylene chloride and the solution was precipitated into a MeOH/hexane mixture (1/6) through filter papers by gravity to form a solid and stirred for 2 hours. The supernatant was decanted and the solid was stirred with MeOH and washed with MeOH. The wet solid was dried in high vacuum at rt overnight. The yield was 60~80%.

PSEdCd: Elemental analysis: C % 68.78; H % 3.96; S % 5.84; $^1$H-NMR (CDCl$_3$): δ (ppm) 7.90-7.80 (m, 4H), 7.43-7.24 (m, 6H), 7.10-6.76 (m, 9H), 6.40-6.35 (m, 1H); GPC (THF): Mn=6.99 kDa, PDI=1.4.

PSA$_{0.3}$E$_{0.7}$dCd: Elemental analysis: C % 67.42; H % 3.83; S % 7.05; N % 1.85; $^1$H-NMR (CDCl$_3$): δ (ppm) 8.09-7.40 (m, 59H), 7.44-7.26 (m, 35H), 7.17-6.80 (m, 75H), 6.39-6.35 (m, 7H); GPC (THF): Mn=11.1 kDa, PDI=2.4 (with partial crosslinking)

Example 6

Synthesis of PSEkCy

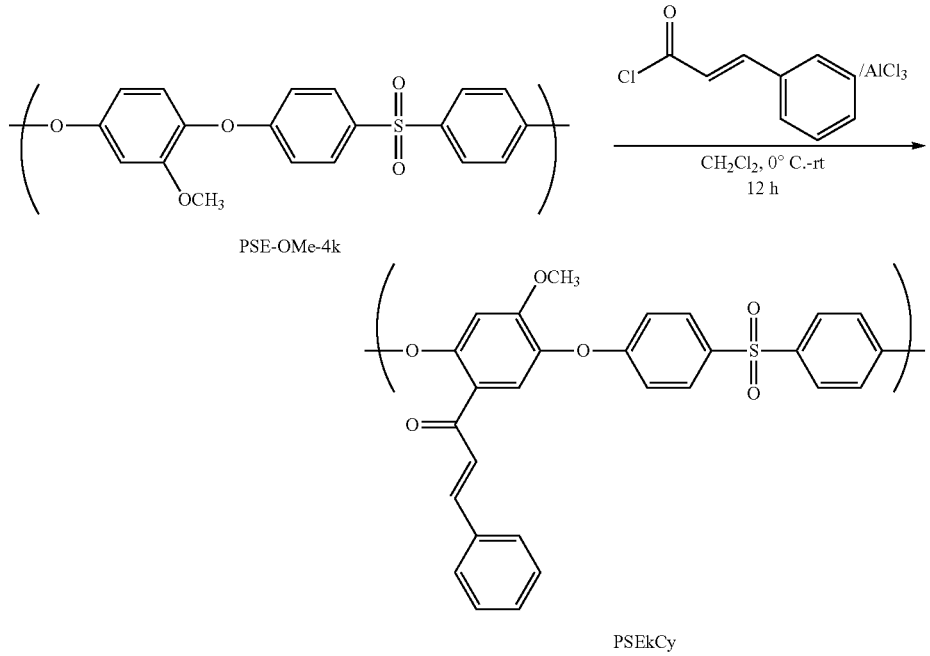

An oven-dried 100 mL round bottom flask was cooled under N$_2$ in an ice-water bath, charged with a stir bar, PSA-OMe-4k (1.00 g, 2.82 mmol) and CH$_2$Cl$_2$ (40 mL) to generate a solution. To this solution, cinnamoyl chloride (1.22 g, 7.34 mmol) was added, and then aluminum chloride (1.13 g, 7.34 mmol) was added in small portions. The solution was stirred at rt for 12 h and then poured into ice water to quench the reaction. The organic layer was separated, washed with H$_2$O (3×50 mL), dried over MgSO$_4$ and concentrated under reduced pressure. The crude product was re-dissolved in THF (40 mL) and precipitated in a methanol/hexane mixture (1/3, v/v, 200 mL). The resulting solid was filtered and dried under vacuum to obtain PSAkCy as a pale orange solid (0.958 g, 70%). $^1$H-NMR (CDCl$_3$): δ (ppm) 7.97-7.74 (m, 4H), 7.67-7.50 (m, 2H), 7.50-7.20 (m, 7H), 7.06-6.90 (m, 3H), 6.72-6.63 (m, 1H), 3.80-3.68 (brs, 3H); GPC (THF): Mn=5.0 kDa, PDI=1.5.

Example 7

Synthesis of PSECu-4k

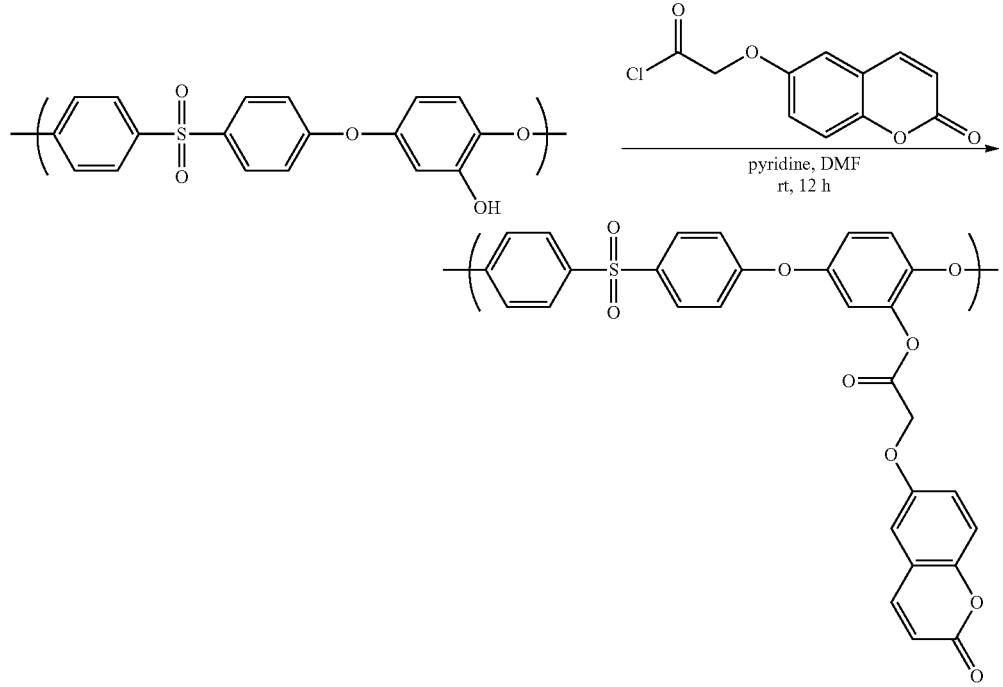

PSE-OH (1 equiv.) and pyridine (3 equiv.) were dissolved in DMF (1 M) and stirred for 2 hours. Coumarin chloride (1.3 equiv.) was added slowly in portions to the polymer solution under N$_2$ and in a water bath. The reaction was exothermic and turned to a clear brown-orange solution. The reaction suspension was stirred (12 hours) at RT overnight. The solution was slowly poured into MeOH (1:9 v/v) to form a solid and stirred for 1 hour. The solid was filtered and washed with MeOH. The wet solid was dried in a vacuum oven at RT overnight and the solid was dissolved in methylene chloride and the solution was precipitated into MeOH/hexane (1/6) through filter papers by gravity to form a solid and stirred for 2 hours. The solid was filtered and washed with MeOH. The wet solid was dried in high vacuum at RT overnight. The yield was 85~96%.

NMR: $^1$H-NMR (CDCl$_3$): δ (ppm) 7.80-7.61 (m, 4H), 7.40-7.28 (m, 1H), 7.04-6.74 (m, 9H), 6.74-6.59 (m, 1H), 6.24-6.04 (m, 1H), 4.66-4.53 (brs, 2H); GPC (THF): Mn=4.8 kDa, PDI=1.2.

Example 8

Synthesis of PSE-Allyl

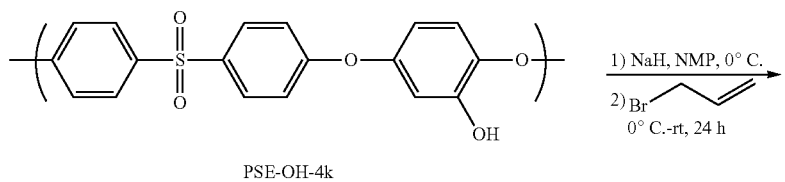

PSE-OH-4k

-continued

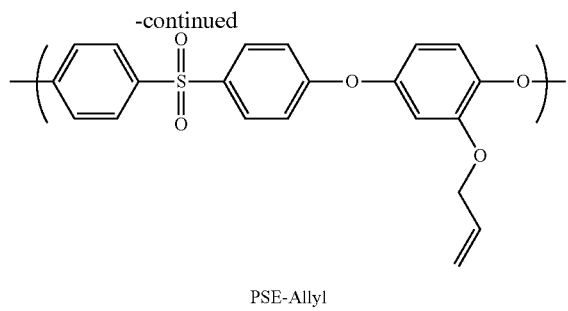

PSE-Allyl

PSE-OH-4k (1 equiv.) was dissolved in NMP (1 M) and stirred for 2 hours. Sodium hydride (60 wt % in mineral oil, 1.5 equiv.) was slowly added to above polymer NMP solution placed in an ice-water bath. After the gas production ceased, allyl bromide was added dropwise via a syringe to the polymer solution, and the mixture was stirred (12 hours) at RT overnight. The solution was slowly poured into cold $H_2O$ (1:9 v/v) to form a suspension and stirred for 12 hours. The suspension was extracted with DCM (×2), and the DCM layer was separated, dried over $MgSO_4$ and concentrated via evaporation. The polymer DCM solution was precipitated in hexane (1/5, v/v) and the supernatant was decanted. The crude product was dried in a vacuum oven for 24 hours to give a pale brown solid. The solid was taken up in DCM and precipitated in hexane again. After drying in vacuum oven for 24 hours, a pale grey solid was obtained. The yield was about 50-60%.

$^1$H-NMR (CDCl$_3$): δ (ppm) 8.06-7.73 (m, 4H), 7.34-7.07 (m, 3H), 7.04-6.88 (m, 3H), 6.85-6.49 (m, 1H), 5.80-5.49 (m, 1H), 5.05-4.76 (m, 2H), 4.57-4.28 (m, 2H); GPC (THF): Mn=3.1 kDa, PDI=1.7.

Example 9

Synthesis of PSE-Ep

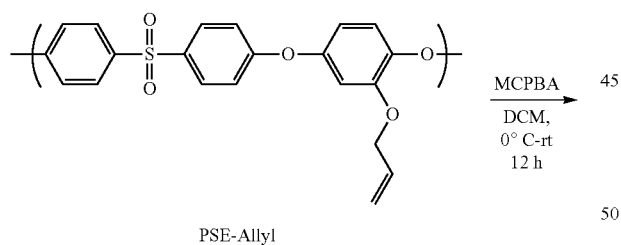

PSE-Allyl

-continued

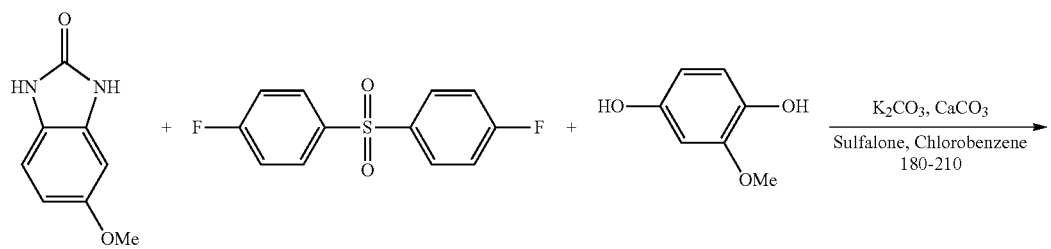

PSE-Ep

PSE-Allyl (1 equiv.) was dissolved in DCM (1 M) in an ice water bath. m-Chloroperoxybenzoic acid (MCPBA, 1.5 equiv.) was slowly added to the above polymer solution. After addition, the solution was stirred (12 hours) at RT overnight. The solution was filtered. The filtrate was washed with 10% $Na_2CO_3$ (aq.) twice, then with $H_2O$ and dried over $MgSO_4$. The solution was then slowly poured into hexane (1:5 v/v) to form a white solid. The solid was filtered, dried in a vacuum oven for 24 hours. The crude solid was dissolved in DCM and precipitated in hexane, and the solid was filtered and dried to give a white solid.

Example 10

Synthesis of HC-PSA$_{0.3}$E$_{0.7}$-OMe

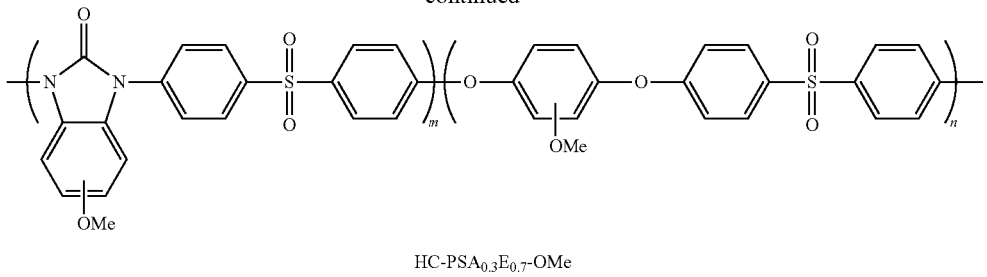

HC-PSA$_{0.3}$E$_{0.7}$-OMe

To an oven-dried 500 mL three-neck round bottom flask equipped with a Dean-Stark trap, a condenser, a magnetic stirring bar and an N$_2$ inlet was added bis-(4-fluorophenyl) sulfone (7.77 g, 30.6 mmol), 2-methoxyhydroquinone (3.01 g, 21.5 mmol), 5-methoxy-2-benzimidazoline (1.51 g, 9.2 mmol), potassium carbonate (4.22 g, 30.6 mmol), calcium carbonate (3.06 g, 30.6 mmol), sulfolane (45 mL) and chlorobenzene (46 mL). The mixture was heated at 180° C. to remove as an azeotrope the resulting water with chlorobenzene for 2 h. The chlorobenzene was removed and the resulting mixture was heated at 210° C. for another 2 h. Then, the reaction mixture was cooled to rt, diluted with CH$_2$Cl$_2$ (50 mL), filtered and washed by CH$_2$Cl$_2$ (5 mL×3). The filtrate was precipitated in a mixture of methanol (300 mL) with acetone (50 ml). The solid was collected via filtration and dried under vacuum at 60° C. overnight. Finally, a pale tan solid was obtained (9.83 g, yield 88.9%). $^1$H NMR (CDCl$_3$, 500 MHz): δ 7.97-8.19 (m, br, 1H), 7.61-7.96 (m, br, 4H), 6.52-7.21 (m, br, 6H), 3.57-3.86 (m, br, 3H). GPC (THF, rt): Mn=7.98 kDa, PDI=1.43.

Example 11

Synthesis of HC-PSA$_{0.3}$E$_{0.7}$-OH

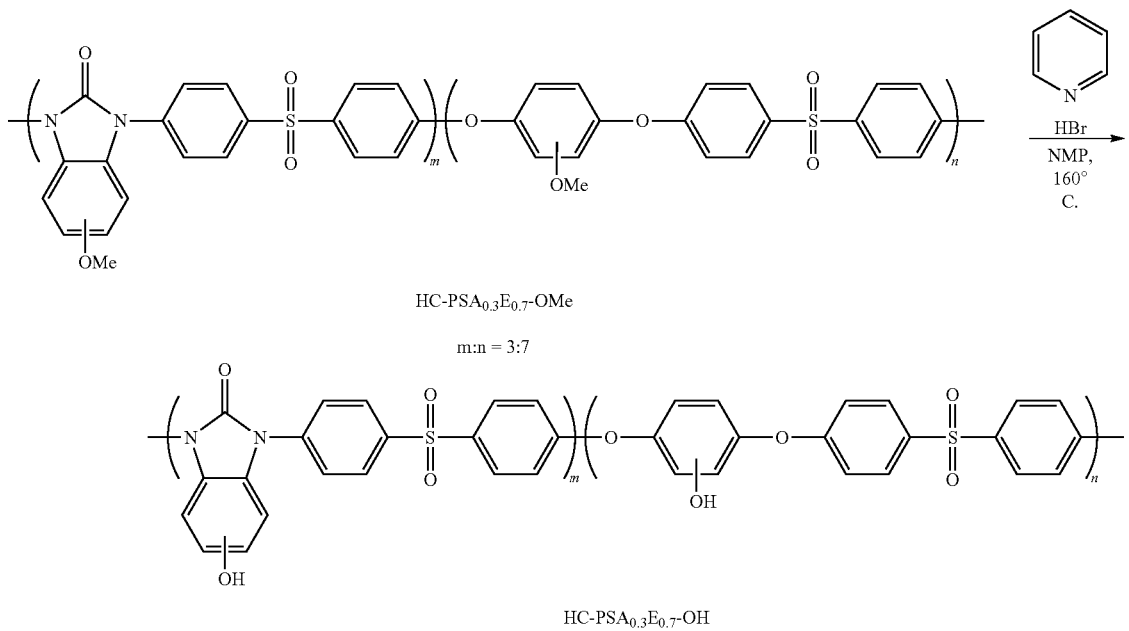

HC-PSA$_{0.3}$E$_{0.7}$-OMe m:n = 3:7

HC-PSA$_{0.3}$E$_{0.7}$-OH m:n = 3:7

To an oven-dried 500 mL round bottom flask equipped with a condenser under nitrogen was added HC-PSA0.3E0.7-OMe (9.0 g), pyridine hydrobromide (9.47 g, 59.2 mmol) and 1-methyl-2-pyrrolidone (100 ml). The reaction mixture was stirred at 160° C. for 24 hours and then more pyridine hydrobromide (9.47 g, 59.2 mmol) was added. After 24 hours, the final portion of pyridine hydrobromide (4.73 g, 29.6 mmol) was added and the mixture was stirred at 160° C. for another 24 hours. After cooling down, the mixture was precipitated into water (1000 ml), stirred for 30 min, filtered, and washed with MeOH and acetone. A pale brown solid was obtained (7.84 g, yield 90.7%) after drying under vacuum at 80° C. overnight. $^1$H NMR (d6-DMSO, 500 MHz): δ=10.16 (s, 0.7H), 9.44 (s, 0.3H), 8.32-7.70 (m, 5H), 7.40-6.90 (m, 4H), 6.85-6.44 (m, 2H).

Example 12

Synthesis of HC-PSA$_{0.3}$E$_{0.7}$Cy

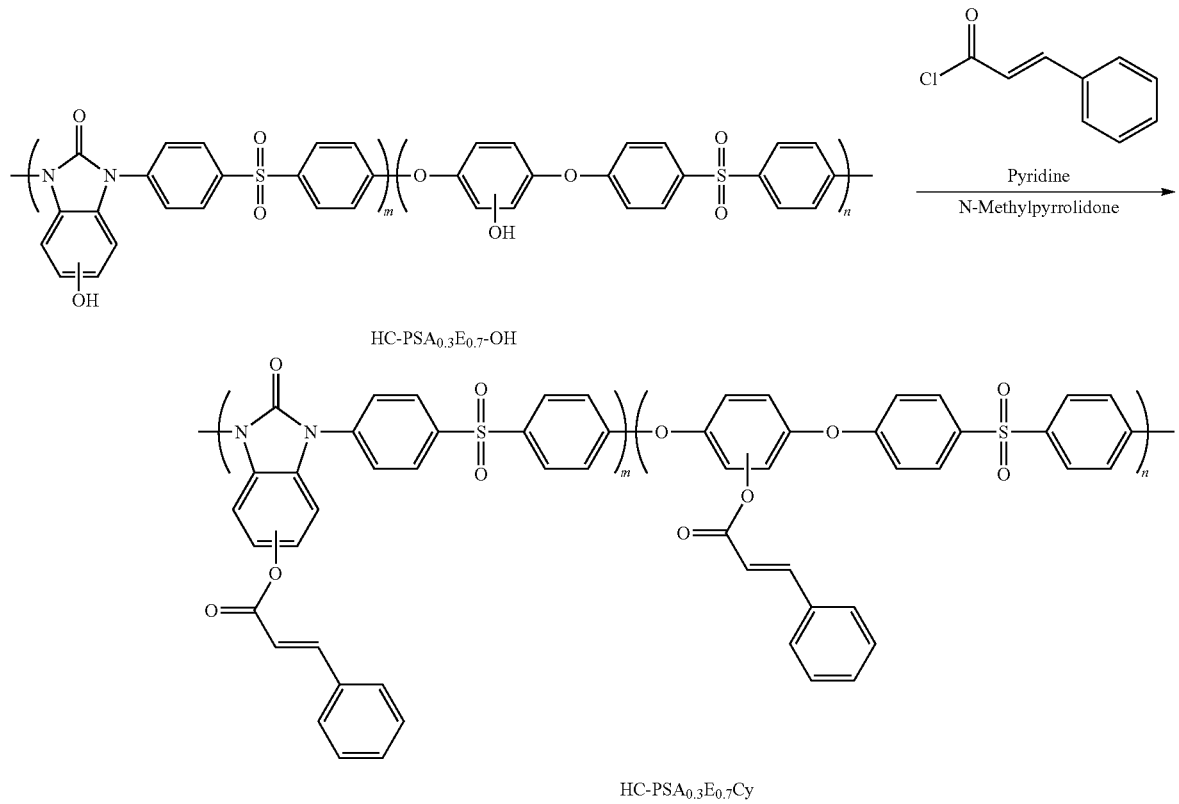

HC-PSA$_{0.3}$E$_{0.7}$Cy

A round bottom flask was charged with HC-PSA0.3E0.7-OH (7.50 g), pyridine (3.49 ml, 43.16 mmol), N,N-dimethyl-4-aminopyridine (272 mg, 2.23 mmol) and 1-methyl-2-pyrrolidone (100 ml). Then, a solution of cinnamoyl chloride (5.75 g, 34.60 mmol) in 1-methyl-2-pyrrolidone (17 ml) was added dropwise. The reaction mixture was stirred at room temperature for 24 hours and then precipitated into MeOH (300 ml) and diluted by DCM (20 ml). The mixture was washed with NaHCO$_3$ (s. aq) and 5% NaCl (aq), successively. After drying, it was concentrated by using a rotary evaporator. The residue was re-dissolved. After filtration, the solid was dissolved into DCM (140 ml), washed with 40 ml NaHCO$_3$ (aq.) and 40 ml water and dried over Na$_2$SO$_4$. After filtration, the filtrate was dropwise precipitated into MeOH (300 ml) with vigorous stirring. After filtration and washing by MeOH, a pale brown powder was collected and dried under vacuum (8.7 g, yield 84.4%). $^1$H NMR (CDCl$_3$, 500 MHz): δ=8.37-7.71 (m, 6H), 7.71-7.53 (m, 2H), 7.52-6.89 (m, 9H), 6.89-6.46 (m, 1H). Elemental Analysis for (C$_{273}$H$_{180}$N$_6$O$_{57}$S$_{10}$)$_n$: Calcd. C, 68.64; H, 3.80; N, 1.76. Found: C, 67.84; H, 3.90; N, 1.71.

Example 13

Thermal Stability of Various Polysulfone Films

Figure 3:
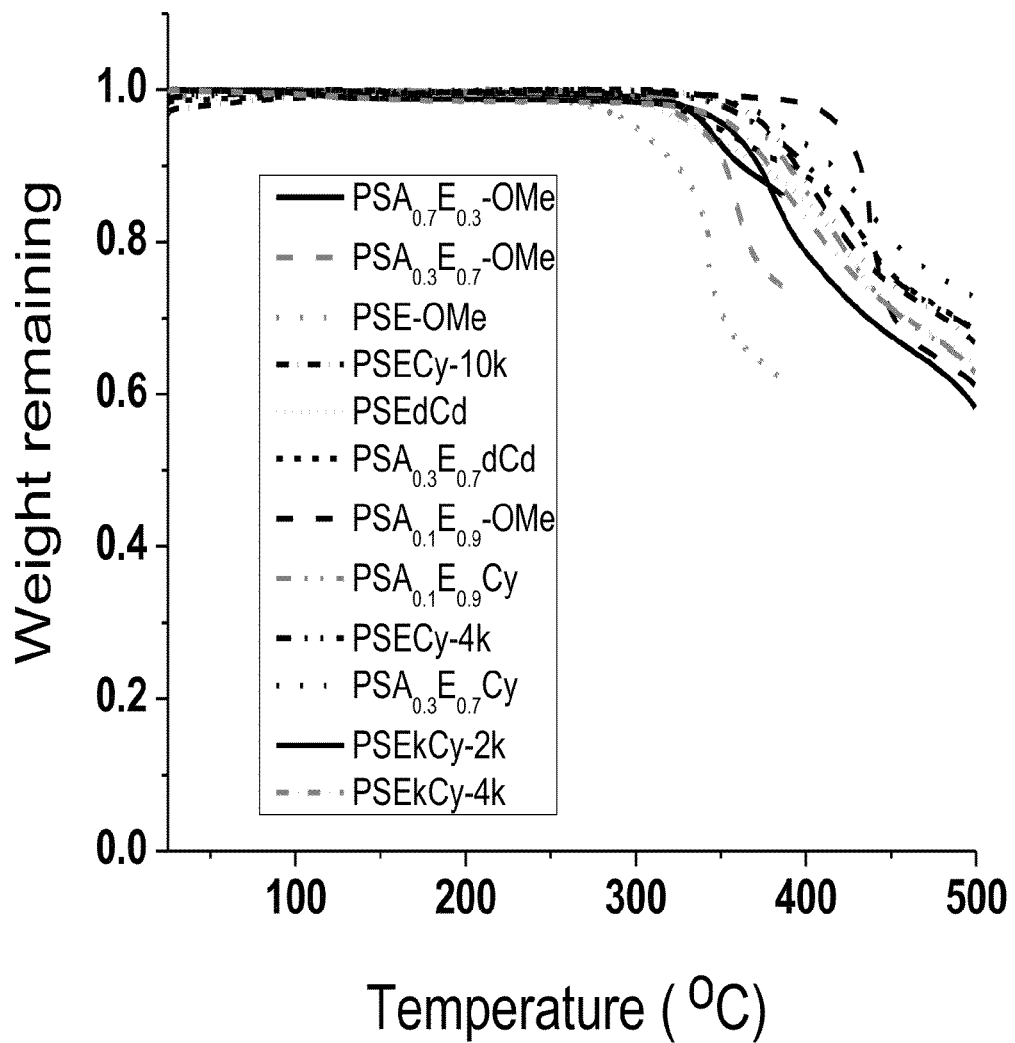
FIG. 3 shows thermogravimetric analysis (TGA) plots of various polysulfones according to the present teachings.

Thin films of various polysulfones according to the present teachings were spun from solutions of cyclopentanone (concentration: ~80-100 mg/ml; spinning rate: ~800-1800 rpm) for 60 seconds, baked at 100° C. in atmosphere for 60 s after spin-coating, UV-A flood cured (2.2 J/cm$^2$-6.8 J/cm$^2$), then hard-baked at 120° C. in air for 10 minutes. Certain films were post-baked at either 250° C. or 300° C. under a flowing nitrogen atmosphere for 1 hour. Thermogravimetric analyses (TGA) suggested excellent thermal stability with an onset decomposition temperature under nitrogen of ~300-350° C. (FIG. 3).

Example 14

Dielectric Properties of Various Polysulfone Films

Metal-insulator-semiconductor (MIS) capacitor structures were fabricated using dielectric films composed of polymers PSECy-4k, PSECy-10k, PSA$_{0.1}$E$_{0.9}$Cy, PSA$_{0.3}$E$_{0.7}$Cy, and PSA$_{0.4}$E$_{0.6}$Cy. Their leakage current density, capacitance, and film thickness were measured at three different annealing temperatures: 120° C., 250° C., and 300° C. Comparative MIS capacitor structures were fabricated and the same properties were measured from thin films composed of two low T$_g$ polymers, i.e., polyvinylphenol (PVP, T$_g$<200° C.), polymethylmethacrylate (PMMA, T$_g$~100° C.), and two high T$_g$ polymers, i.e., polybenzimidazole (PBI, PBI Performance Product Inc., T$_g$~413° C.), and polyether imide (PEI, Aldrich, T$_g$~475° C.).

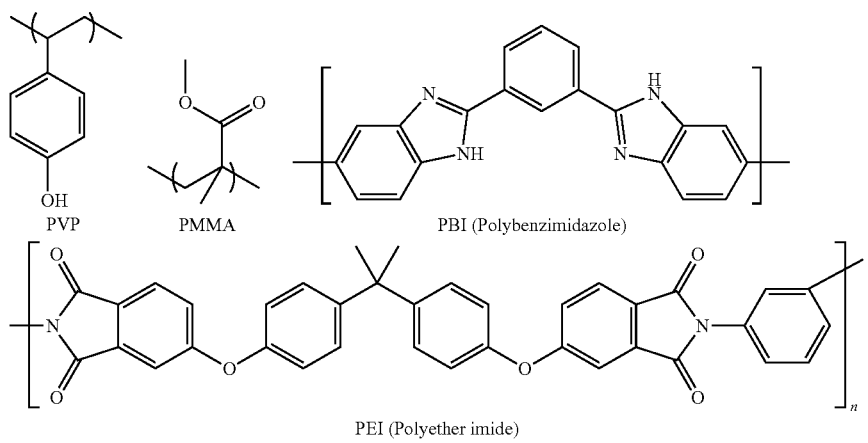

PVP   PMMA   PBI (Polybenzimidazole)

PEI (Polyether imide)

For MIS structure fabrication, heavily doped n-type Si (MEMC Electronic Materials, Antimony/n-doped) was used as the semiconductor. Dielectric films were spin-coated onto the semiconductor layer from a solution of cyclopentanone (concentration: ~80-100 mg/ml; spinning rate: ~800-1800 rpm) for 60 seconds, then baked at 100° C. in atmosphere for 60 s after spin-coating, UV-A flood cured (2.2 J/cm$^2$-6.8 J/cm$^2$), and baked at 120° C. in air for 10 minutes. Using a shadow mask, rectangular- or square-shaped Au pads having a feature size ranging from 100 μm×100 μm to 1000 μm×1000 μm, were deposited on top of the dielectric films at <5×10$^{-6}$ Torr to complete the MIS capacitor structure. Certain devices were post-baked at either 250° C. or 300° C. under a flowing nitrogen atmosphere for 1 hour as indicated.

The current (I)-voltage (V) responses of the MIS structures were measured using a high sensitivity Keithley 6430 Sub-Femtoamp Source Meter with Remote Preampifier, operated by a local Labview program and general purpose interface bus communication. All of the measurements were performed in ambient atmosphere (relative humidity=10-80%). To minimize electrical noise during the I-V scan, a triaxial cabling and probing system (Signatone, Gilroy, Calif.) was employed to probe the MIS structures. The combined use of the Signatone triaxial probing system and the Keithley 6430 source meter reduced the noise level to as low as 10-15 A and provided accurate current measurements as low as 10-14 A.

Figure 4:
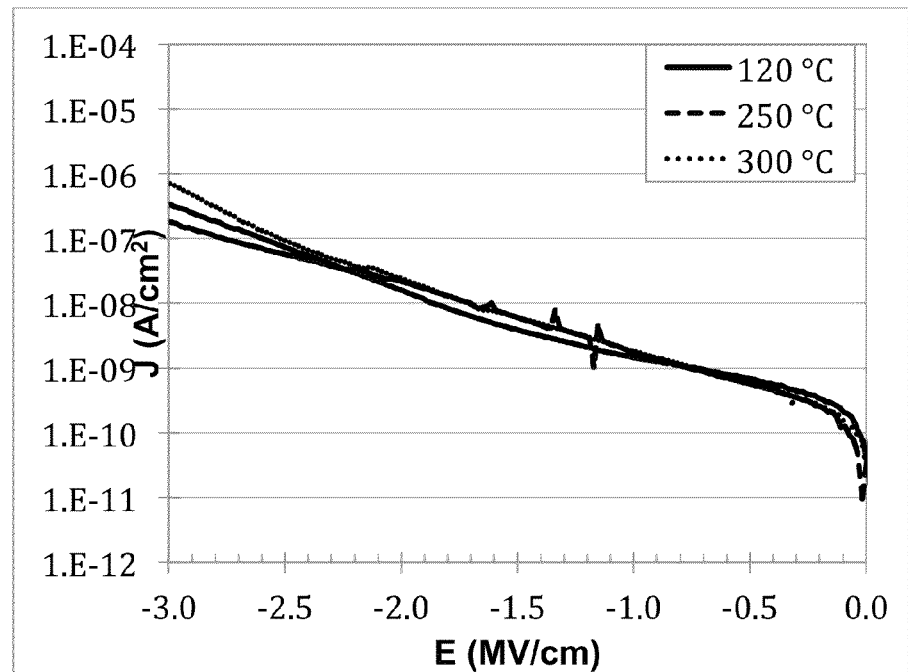
FIG. 4 shows leakage current density (J) as a function of electric field (E) of PSECy-4k films spun from a 100 mg/mL solution in cyclopentanone at 1000 rpm at 60 s. All films were baked at 100° C. in atmosphere for 60 s after spin-coating, UV-A flood cured using 6.8 J/cm$^2$, and baked at 120° C. in air for 10 min. Certain films were post-baked at either 250° C. or 300° C. under flowing nitrogen for 1 hour.
Figure 5:
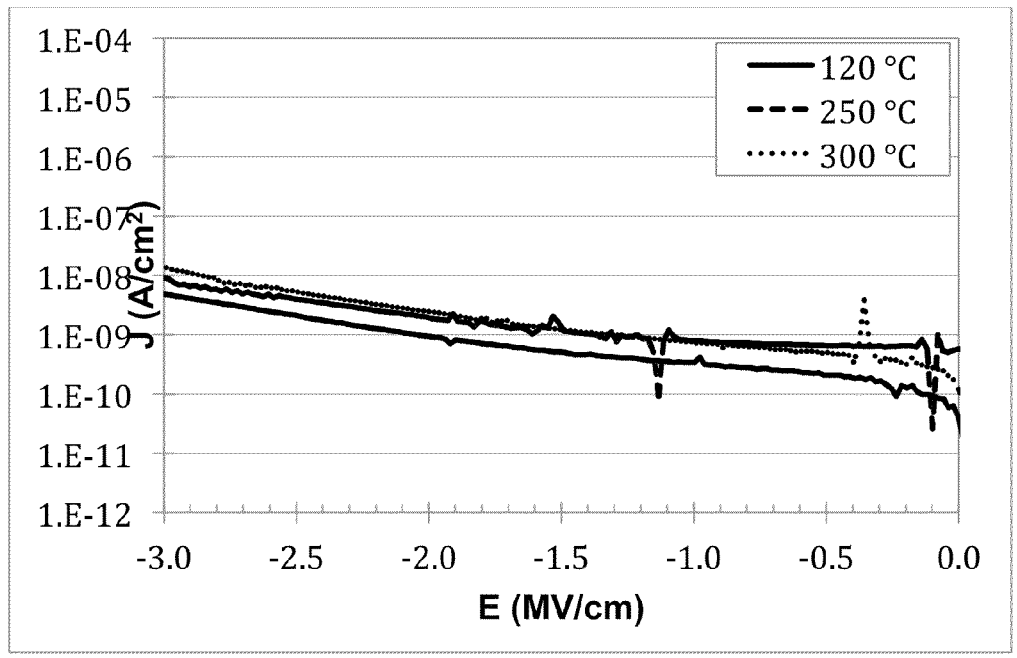
FIG. 5 shows leakage current density (J) as a function of electric field (E) of PSA$_{0.1}$E$_{0.9}$Cy (4k) films spun from a 100 mg/mL solution in cyclopentanone at 1400 rpm at 60 s. All films were baked at 100° C. in atmosphere for 60 s after spin-coating, UV-A flood cured using 6.5 J/cm², and baked at 120° C. in air for 10 min. Certain films were post-baked at either 250° C. or 300° C. under flowing nitrogen for 1 hour.

During the measurement, the bottom electrode was probed with an instrument ground and the top Au pads were probed with a soft tip from the Triaxial probe connected to the Keithley source meter. As controlled by the Labview program, an I-V scan was performed by applying bias to the triaxial probe and measuring current through the circuit. The scan rate was between 5-15 s/step, which was controlled by setting the delay time to between 0.5 s and 2 s and the number of measurements per step between 10 and 20. FIGS. 4 and 5 show leakage current density (J) as a function of electric field (E) for representative polysulfone films.

Table 1 summarizes the dielectric properties of the different polymeric films.

TABLE 1

Dielectric properties of various polysulfone-based films.
PVP, PMMA, PBI and PEI films are included for comparison.

| Polymeric Insulator | Bake 120° C., 10 min | | | Bake 250° C., 1 h | | | Bake 300° C., 1 h | | |
|---|---|---|---|---|---|---|---|---|---|
| | J (A/cm$^2$) at 2 MV/cm | $C_i$ (nF/cm$^2$) | t (nm) | J (A/cm$^2$) at 2 MV/cm | $C_i$ (nF/cm$^2$) | t (nm) | J (A/cm$^2$) at 2 MV/cm | $C_i$ (nF/cm$^2$) | t (nm) |
| PSECy (4k) | 1 × 10$^{-8}$ | 5.2 | 630 | 2 × 10$^{-8}$ | 6.1 | 550 | 2 × 10$^{-8}$ | 6.8 | 500 |
| PSECy (10k) | 3 × 10$^{-9}$ | 6.5 | 500 | 3 × 10$^{-9}$ | 6.8 | 470 | 1 × 10$^{-9}$ | 6.9 | 450 |
| PSA$_{0.1}$E$_{0.9}$Cy | 9 × 10$^{-10}$ | 5.9 | 510 | 2 × 10$^{-9}$ | 6.2 | 500 | 2 × 10$^{-9}$ | 6.3 | 500 |
| PSA$_{0.3}$E$_{0.7}$Cy | 4 × 10$^{-9}$ | 6.0 | 550 | 8 × 10$^{-10}$ | 6.1 | 520 | 6 × 10$^{-7}$ | 6.0 | 520 |
| PSA$_{0.4}$E$_{0.6}$Cy | 9 × 10$^{-9}$ | 6.0 | 520 | 9 × 10$^{-9}$ | 6.3 | 510 | 1 × 10$^{-7}$ | 6.6 | 480 |
| PVP | 6 × 10$^{-7}$ | 6.5 | 570 | Film damaged | | | Film damaged | | |
| PMMA | 7 × 10$^{-9}$ | 12 | 250 | Film damaged | | | Film damaged | | |
| PBI | 1 × 10$^{-9}$ | 7.6 | 440 | | | | 1 × 10$^{-6}$ | 8.4 | 390 |
| PEI | 1 × 10$^{-8}$ | 6.6 | 490 | | | | 1 × 10$^{-8}$ | 6.6 | 470 |

As shown in Table 1, the present polysulfone-based dielectric films retained good dielectric properties (J≤1×10$^{-7}$ A/cm$^2$ at 2 MV/cm) even after annealing up to at least about 300° C. By comparison, the PVP and PMMA films showed damages upon annealing up to about 250° C. The PBI film showed a significant deterioration in its leakage current properties (J~1×10$^{-6}$ A/cm$^2$ at 2 MV/cm) upon annealing at about 300° C. While the PEI film retained good dielectric properties (J~1×10$^{-8}$ A/cm$^2$ at 2 MV/cm) upon annealing at about 300° C., it was found that the heat treatment led to rippling of the film, suggesting that PEI becomes morphologically unstable at temperatures around about 300° C. (see infra, Example 15).

Example 15

Figure 6:
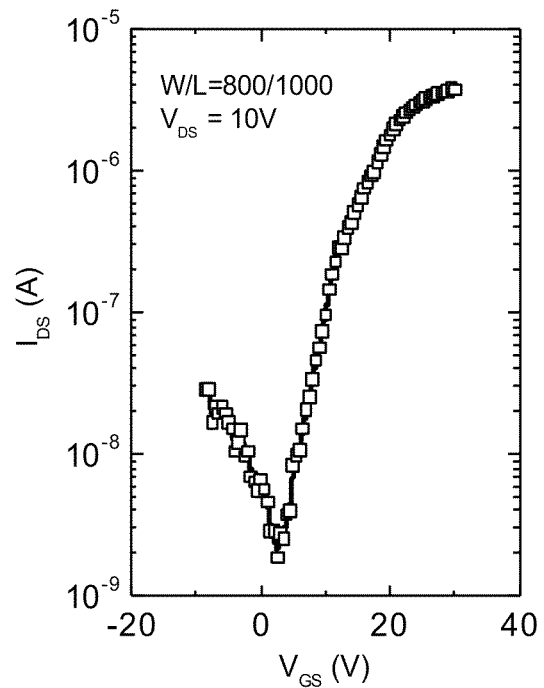
FIG. 6 shows representative a) transfer and b) output plots of an IGZO TFT incorporating a polysulfone-based (PSECy) gate dielectric.
Figure 6:
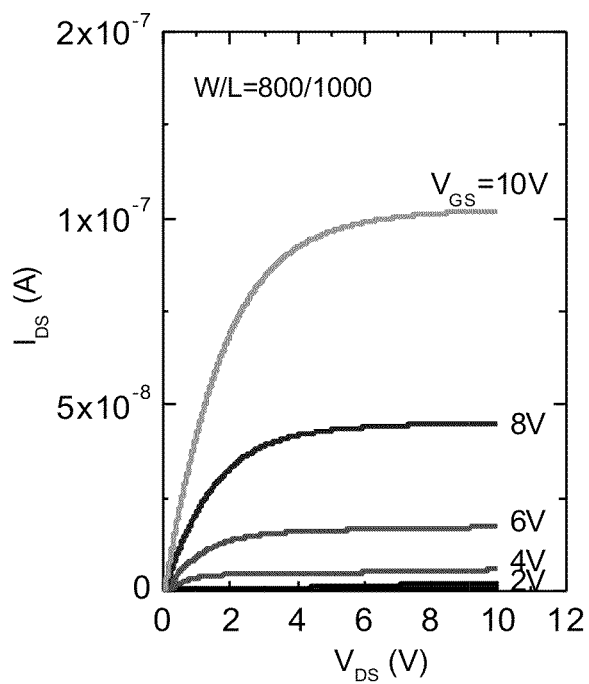

Device Performance of IGZO TFTs Incorporating a Polysulfone-Based Gate Dielectric Indium gallium zinc oxide (IGZO) thin film transistors were fabricated with a polysulfone-based gate dielectric layer in a bottom gate staggered structure. To fabricate the transistor, highly doped n-type silicon wafers (WRS Materials) were adopted as substrates and cleaned by sonication in organic solvents prior to use. The silicon wafers have resistivity less than 0.015 ohm·cm and also function as the gate electrode for the transistor. Dielectric films were solution-casted onto the wafer to form a thin insulation layer. A 50~500 nm thick IGZO layer was then deposited through stencil shadow masks using magnetron-sputtering equipment. The base pressure was below $10^{-5}$ torr and a mixture of argon and oxygen was used as the carrier gas. An annealing process at a temperature below 300° C. was applied to improve the quality of IGZO, followed by formation of the source and drain electrodes by sputtering molybdenum (~200 nm) through stencil shadow masks at a pressure below $10^5$ torr. The channel lengths were between 200~1000 µm, and the channel widths were between 200~1000 µm. These transistors were found to perform reasonably well, with mobility (p) approximating 5 cm²/Vs, an $I_{on}:I_{off}$ ratio up to $10^7$, negligible hysteresis, and low gate leakage currents. The transfer and output plots of a representative IGZO TFT (incorporating PSECy as the gate dielectric) are shown in FIG. 6. The device performance of additional IGZO TFT devices is summarized in Table 2.

Figure 7:
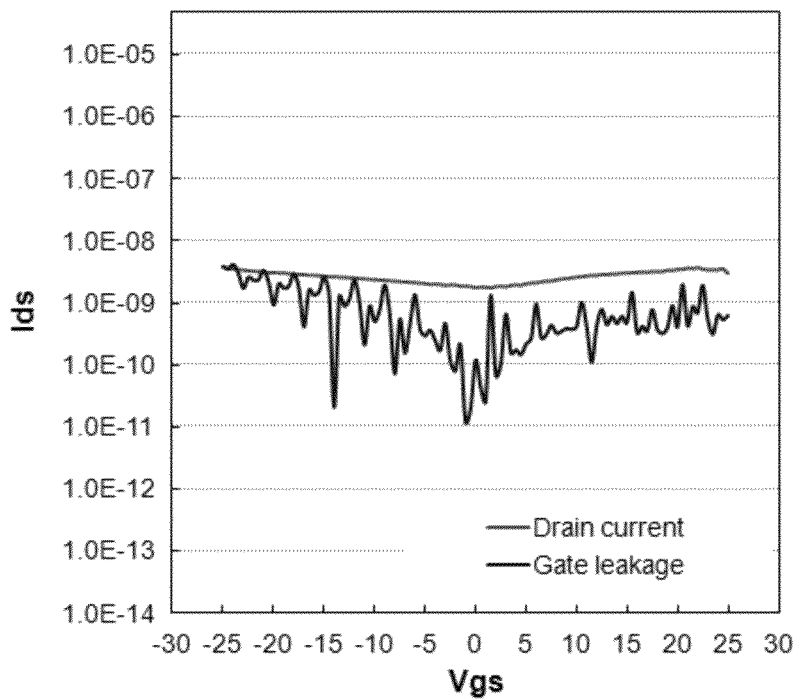
FIG. 7 shows the transfer plot of a comparative IGZO TFT device which incorporates a polyetherimide-based (PEI) gate dielectric.
Figure 8:
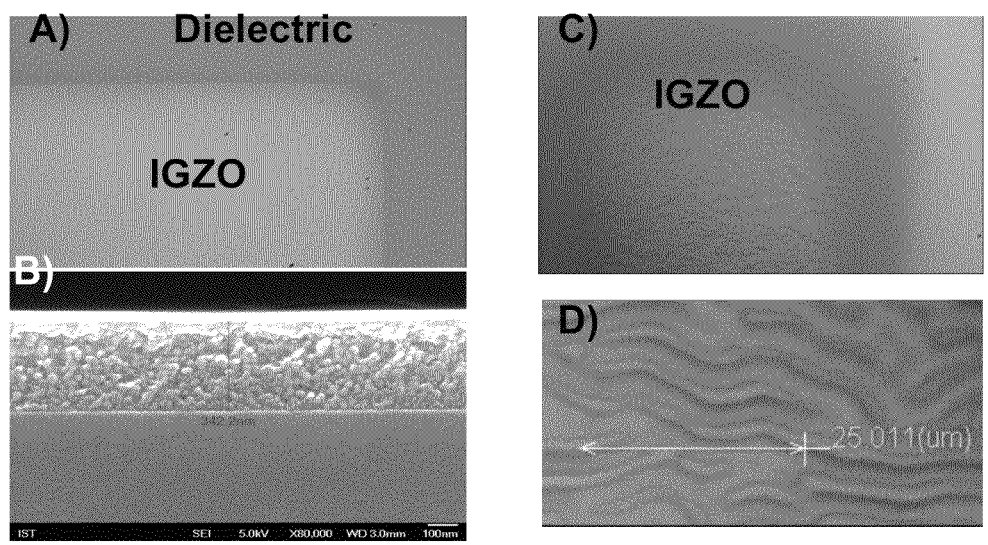
FIG. 8 compares the surface morphology of IGZO sputtered on a dielectric film composed of the present polysulfone versus another high $T_g$ polymer: A) optical microscope image of an IGZO semiconductor film (50 nm thick) sputtered on a $PSA_{0.1}E_{0.9}Cy$ film through a shadow mask and annealed at 250° C. for 1 hour in an oven under nitrogen; B) cross-section SEM image of a $PSA_{0.1}E_{0.9}Cy$ film spin-coated on a glass substrate with IGZO (50 nm) sputtered thereon and annealed at 325° C. for 2 hours in an oven under nitrogen; C) optical microscope image of an IGZO semiconductor film (50 nm thick) sputtered on a PEI film through a shadow mask and annealed at 250° C. for 1 hour in an oven under nitrogen; and D) a magnified image of C) showing a rippled IGZO film when sputtered over a PEI dielectric film.

Comparative IGZO TFT devices were fabricated using PEI (500 nm) as the dielectric material. None of the PEI-incorporated IGZO TFTs demonstrated a gate-modulated channel current. The transfer plot of a representative PEI-incorporated IGZO TFT is shown in FIG. 7. SEM images revealed that after patterning and annealing at 250° C. for 1 hour, the IGZO semiconductor film, which was sputtered onto the PEI film, showed clear rippling effect (FIGS. 8C and D). This suggested that PEI could be morphologically unstable at high temperature or its surface morphology in any case is incompatible with sputtered IGZO. By comparison, the present polysulfone-based dielectric films showed good adhesion with the adjacent IGZO layer (FIGS. 8A and B).

TABLE 2

Device performance of IGZO TFTs incorporating a polysulfone-based gate dielectric. Carrier mobility was calculated in saturation.

| Gate dielectric polymer | Substrate | µ (cm²/VS) | $I_{on}:I_{off}$ | Gate leakage (nA) |
|---|---|---|---|---|
| PSA$_{0.1}$E$_{0.9}$Cy | Si | 8.4 | $10^5$ | 0.1 |
| PSA$_{0.3}$E$_{0.7}$Cy | Si | 9.5 | $10^6$ | 0.01 |
| PSECy | Si | 6.9 | $10^3$ | 1 |
| PEI | Si | N/A | N/A | N/A |

Example 16

Device Performance of Photolithography-Processed IGZO TFTs Incorporating a Polysulfone-Based Gate Dielectric IGZO TFTs were fabricated using a process that is compatible with standard microelectronics industry practice. Particularly, the process includes patterning steps via photolithography with standard etching and stripping agents. The process started with deposition of a molybdenum alloy (~50 nm) onto glass substrates using magnetron sputtering under a base pressure below $10^{-5}$ torr. A commercial positive photoresist AZ® 650 (Clariant AG) was spin-coated on top of the Mo film and exposed through a dark field photomask under GHI line UV illumination at an intensity of approximately 20 mJ/cm². The substrates were then baked on a hot plate at 110° C. for 3 minutes, followed by soaking the substrates in tetramethylammonium hydroxide (TMAH, 2.38%) in DI water for ~1 minute to develop the photoresist patterns. After rinsing with DI water, a Mo etchant (BASF) was casted onto the substrates and allowed to sit for 6 minutes to etch away completely the unprotected metal. The photolithography process for patterning the Mo gate electrode was completed by an additional flood exposure of ~50 mJ/cm² and developing it in the TMAH solution to strip away the remaining photoresist. A polysulfone-based dielectric film was then solution-cast onto the wafer to form a thin insulator layer, followed by the deposition of a 50~500 nm thick IGZO layer using magnetron sputtering. The base pressure was below $10^{-5}$ torr and a mixture of argon and oxygen was used as the carrier gas. No mask was applied during the sputtering process. Patterning of the IGZO semiconductor layer was accomplished by standard photolithography (same process as described above for patterning the gate electrode), which includes the steps of photoresist-coating, exposing, developing, etching, and stripping. The etchant used to pattern the IGZO semiconductor was 3.4% oxalic acid in DI water. An annealing process at a temperature below 300° C. was applied to improve the quality of the IGZO active channel layer. Finally, another layer of Mo was sputtered and patterned through the same photolithography process described above. The patterned Mo served as source and drain electrodes and defined the channel of the IGZO thin film transistors. The channel length was about 20 µm, and the channel width was about 100 µm.

Figure 9:
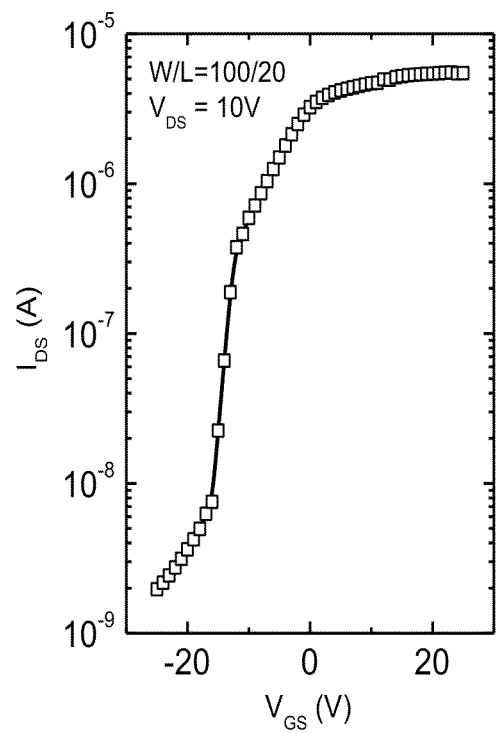
FIG. 9 shows a representative transfer plot of an IGZO TFT incorporating a polysulfone-based (PSECy) gate dielectric that was fabricated using a photolithography process compatible with standard microelectronics industry practice.

This example demonstrates that the present polysulfone-based gate dielectric films have good resistance to harsh chemicals (e.g., the oxalic acid etchant and the TMAH photoresist stripper) and are compatible with extreme processing conditions. Particularly, the tested transistors were found to perform reasonably well, with mobility (µ) approximating 5 cm²/Vs, an $I_{on}:I_{off}$ ratio up to $10^4$, and relatively low gate leakage currents. A representative IGZO-TFT transfer plot is shown in FIG. 9 (PSECy was used as the dielectric layer).

Example 17

Figure 10:
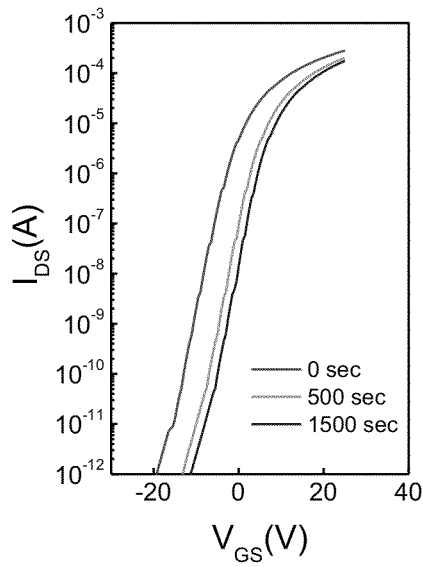
FIG. 10 compares the positive bias temperature stress of an IGZO TFT incorporating a polysulfone-based $(PSA_{0.3}E_{0.7}Cy)$ passivation layer versus a control device with no passivation layer.
Figure 10:
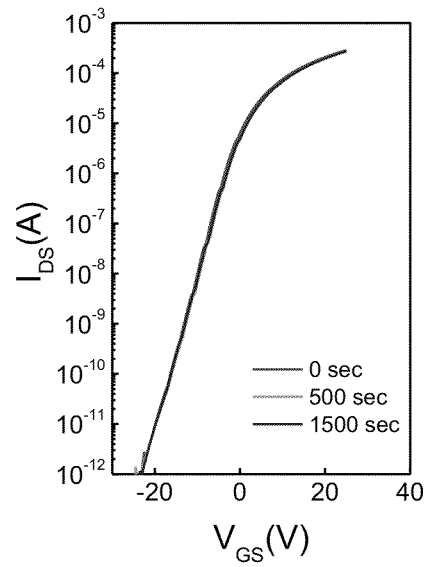

Device Performance of IGZO TFTs Incorporating a Polysulfone-Based Passivation Layer Bottom-gate staggered IGZO TFTs were fabricated with polysulfone-based materials as a top passivation layer. The gate electrode was formed by copper (~200 nm) followed by a molybdenum (~50 nm) alloy onto glass substrates by magnetron sputtering under a base pressure below $10^{-5}$ Torr. A commercial positive photoresist AZ® 650 (Clariant AG) was used to cover the Mo film and form selective patterns, followed by etching with a Mo etchant (BASF) and stripping with a positive photoresist stripper TOK-106™ (Tokyo Ohka Kogyo Co., Ltd.) to pattern the Mo/Cu gate electrode. A SiO₂/SiN$_x$ bilayer, grown through a PECVD process to a total thickness of ~300 nm, was used as the dielectric layer. Then, an IGZO layer (~50 nm in thickness) was deposited by magnetron sputtering. The base pressure was below $10^{-5}$ Torr and a mixture of argon and oxygen was used as the carrier gas. Patterning of the IGZO layer was accomplished through a standard photolithography process similar to the gate electrode patterning step described above, including photoresist-coating, exposing, developing, etching (using 3.4% oxalic acid in DI water as the etchant), and stripping. An annealing process at a temperature below 300° C. was used to improve the quality of the IGZO active channel layer. Trilayer (Mo/Cu/Mo, 50 nm/200 nm/50 nm) source and drain electrodes were sputtered and patterned on top of the IGZO semiconductor using the same metal photolithography process described above for the gate electrode. The channel length was about 10 μm, and the channel width was about 100 μm. These transistors were found to perform reasonably well, with mobility (p) approximating 5 cm$^2$/Vs, an $I_{on}$:$I_{off}$ ratio up to $10^4$, and relatively low gate leakage currents. The devices were completed by spin coating a ~500 nm thick organic passivation layer based on the materials mentioned in Example 4 ($PSA_{0.3}E_{0.7}Cy$ and $PSA_{0.1}E_{0.9}Cy$). It was found that compared to the transistors without passivation, the addition of this passivation layer did not have pronounced effect in the initial performance of the transistor, yet it helped improve the bias stress stability, particularly positive bias temperature stress (PBTS) when the devices were tested in ambient condition (~20° C., 15% relative humidity). For comparison purposes, temperature bias stresses were applied on a control transistor without passivation in vacuum (<$10^{-5}$ Torr). The degree of threshold voltage shift was similar compared to the transistors with a top passivation layer tested in ambient condition. Table 3 summarizes the device performance of the TFTs with the polysulfone-based passivation layer as well as the control devices without a passivation layer. FIG. 10 compares the positive bias temperature stress of an IGZO TFT incorporating a passivation layer according to the present teachings ($PSA_{0.3}E_{0.7}Cy$) versus a control device (with no passivation layer).

TABLE 3

Device performance of IGZO TFTs incorporating a polysulfone-based passivation layer and control devices without a passivation layer. Carrier mobility was calculated in saturation, PBTS applied at 80° C., $V_{GS}$ = 30 V and $V_{DS}$ = 0 V for 1500 seconds.

| Passivation Layer | Mobility (cm$^2$/Vs) | $V_{on}$ (V) | Hysteresis (V) | Day 14 $V_{on}$ PBTS shift (V) | $V_{on}$ PBTS shift (V) |
|---|---|---|---|---|---|
| No passivation | 8.2 | −0.5 | 1.5 | 8 | 4.5 ~ 6.5 |
| No passivation (tested in vacuum) | 8.9 | −0.5 | 0 | 1 | |
| $PSA_{0.1}E_{0.9}Cy$ | 8.1 | −1 | 1 | 1.5 ~ 6 | 1 ~ 2.5 |
| $PSA_{0.3}E_{0.7}Cy$ | 8.8 | −2 | 0.5 | 0.5 ~ 5 | 0.5 ~ 5 |
| $PSA_{0.3}E_{0.7}Cy$: cinnamoyl-modified PMMA (8:2) blend | 8.7 | −4 | 1 | −1 ~ −2 | 0 ~ 2.5 |

All publications, patent applications, patents, and other references mentioned herein are incorporated by reference in their entirety. In case of conflict, the present specification, including definitions, controls.

The present teachings can be embodied in other specific forms without departing from the spirit or essential characteristics thereof. The foregoing embodiments are therefore to be considered in all respects illustrative rather than limiting on the present teachings described herein. The scope of the present teachings is thus indicated by the appended claims rather than by the foregoing description, and all changes that come within the meaning and range of equivalency of the claims are intended to be embraced therein.

The invention claimed is:

1. An optical, electronic or optoelectronic device comprising a thin film transistor, the thin film transistor comprising:
   a substrate;
   a channel layer comprising a metal oxide semiconductor comprising a front surface and a back surface;
   source and drain electrodes in contact with the channel layer;
   a gate electrode;
   a gate dielectric layer disposed between the channel layer and the gate electrode; and
   a passivation layer in contact with the back surface of the channel layer;
wherein at least one of the gate dielectric layer and the passivation layer comprises a polysulfone-based material comprising a polymer having the formula:

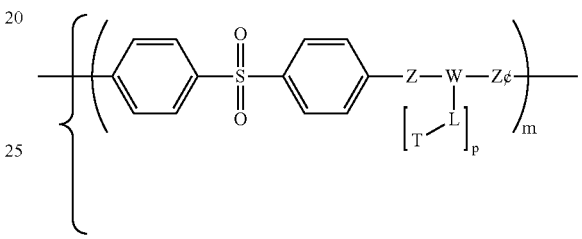

-continued

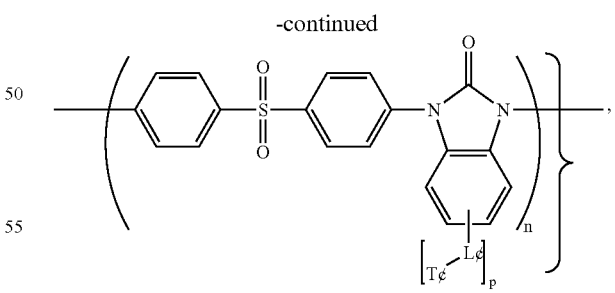

wherein:
W is —Ar[—Y—Ar]$_q$—, wherein:
   Ar, at each occurrence, independently is a divalent C$_{6-18}$ aryl group;
   Y, at each occurrence, independently is selected from the group consisting of —O—, —S—, —(CR'R'')$_r$—, —C(O)—, and a covalent bond, wherein R' and R'', at each occurrence, independently are selected from the group consisting of H, a halogen, CN, a C$_{1-10}$ alkyl group, and a $C_{1-10}$ haloalkyl group; and r is selected from the group consisting of 1, 2, 3, 4, 5, 6, 7, 8, 9 and 10; and q is selected from the group consisting of 0, 1, 2, 3, 4, 5, 6, 7, 8, 9 and 10;

Z and Z' independently are selected from the group consisting of —O—, —S—, and —Se—;

L and L', at each occurrence, independently are selected from the group consisting of —O—, —S—, a divalent $C_{1-10}$ alkyl group, a divalent $C_{6-18}$ aryl group, and a covalent bond;

T and T', at each occurrence, independently are Q or R, wherein:
  Q is a crosslinkable group comprising an ethenyl moiety, an ethynyl moiety, a dienyl moiety, an acrylate moiety, a coumarinyl moiety, and an epoxy moiety; and
  R, at each occurrence, is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;

p and p' independently are selected from the group consisting of 1, 2, 3 and 4; and m and n are real numbers representing mole fractions ranging from 0 to 1, wherein the sum of m and n is about 1.

2. The device of claim 1, wherein the polysulfone-based material comprises a polymer having formula (I):

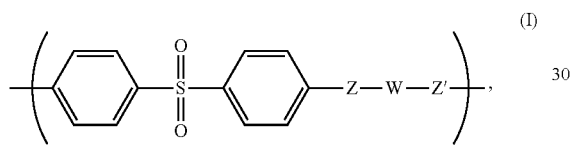

wherein W, Z, and Z' are as defined in claim 1.

3. The device of claim 2, wherein W is selected from the group consisting of —Ar—, —Ar[—O—Ar]$_q$—, —Ar—S—Ar—, —Ar—CH$_2$—Ar—, —Ar—C(CH$_3$)$_2$—Ar—, —Ar—C(CF$_3$)$_2$—Ar—, —Ar—C(O)—Ar—, and —Ar[—Ar]$_q$—, wherein q is 1, 2, 3 or 4, and each Ar independently is a divalent phenyl group or a divalent naphthalenyl group.

4. The device of claim 2, wherein W is one of:

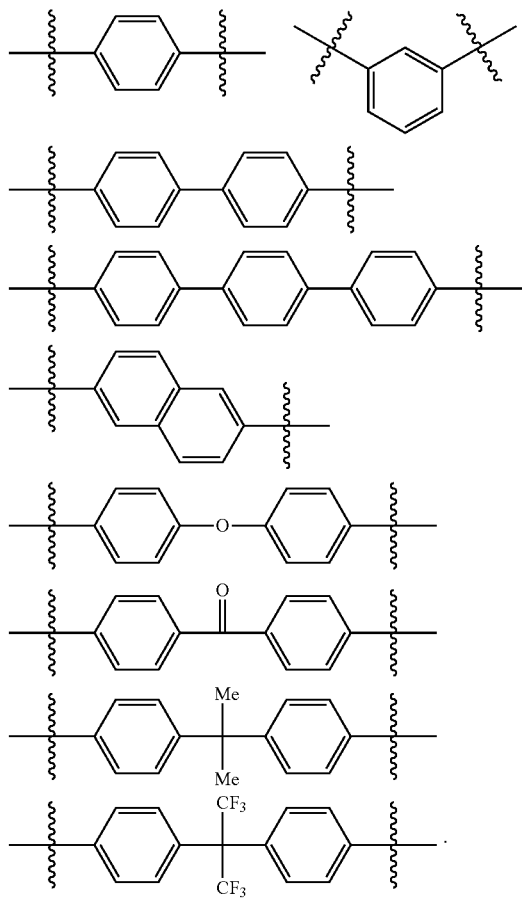

5. The device of claim 2, wherein the polymer having formula (I) is selected from the group consisting of:

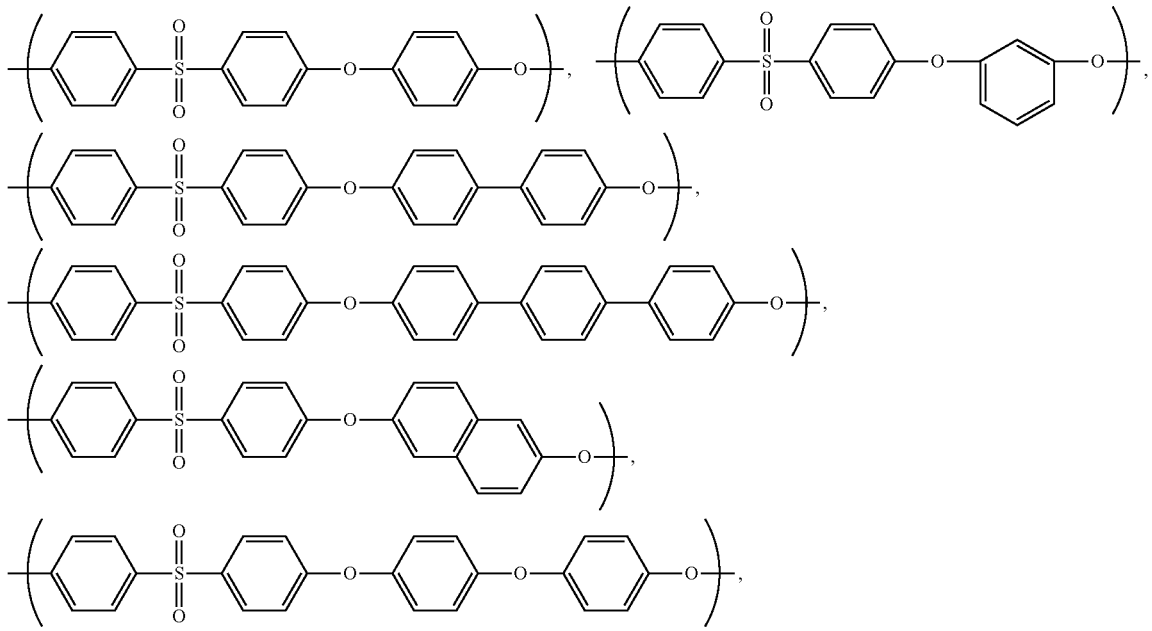

-continued

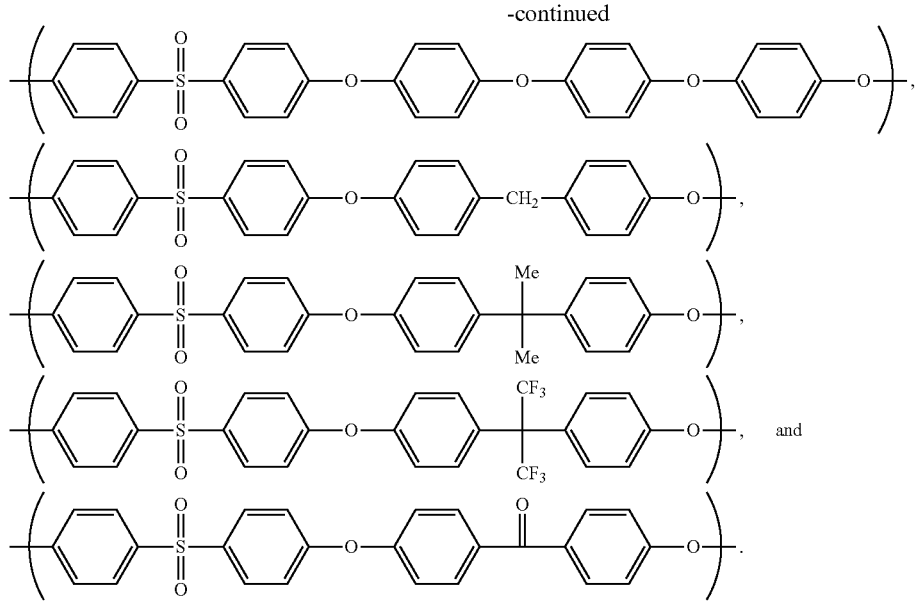

6. The device of claim 1, wherein the polysulfone-based material comprises a polymer having formula (II):

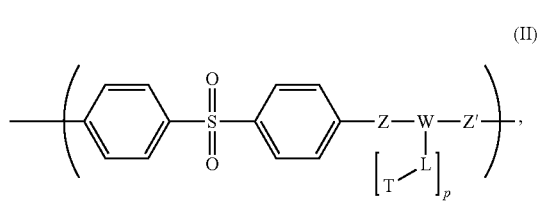

wherein:
L, at each occurrence, independently is selected from the group consisting of —O—, —S—, a divalent $C_{1-10}$ alkyl group, a divalent $C_{6-18}$ aryl group, and a covalent bond;
T is R, wherein R, at each occurrence, is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;
p is 1, 2, 3 or 4; and
W, Z and Z' are as defined in claim 1, provided that when T is H, L is not a covalent bond.

7. The device of claim 6, wherein the polymer having formula (II) is selected from the group consisting of:

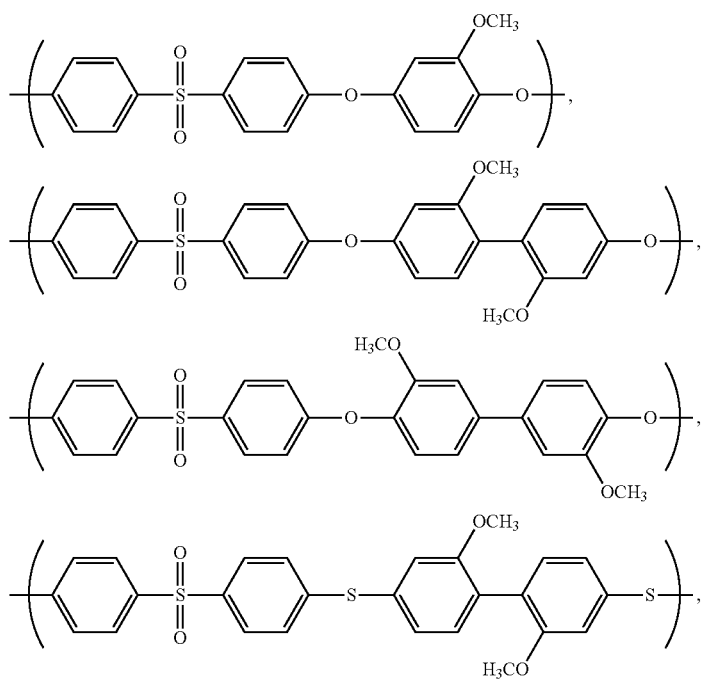

-continued
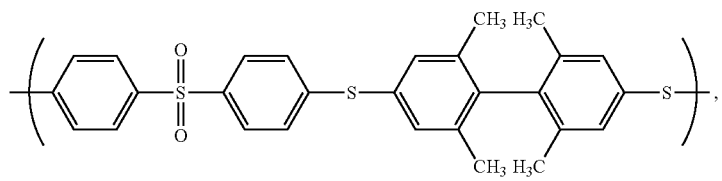
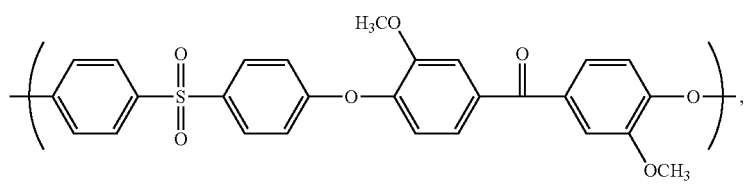
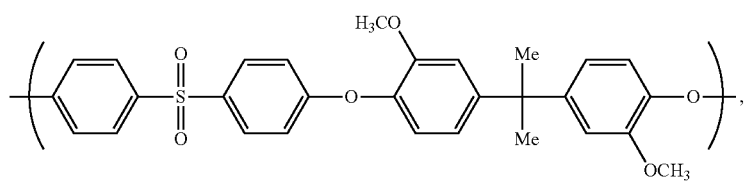
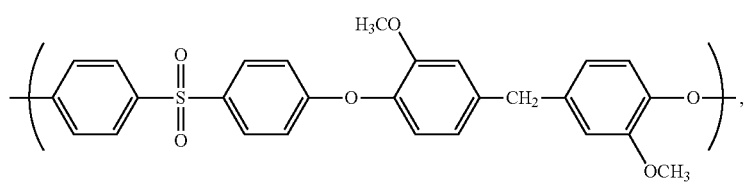
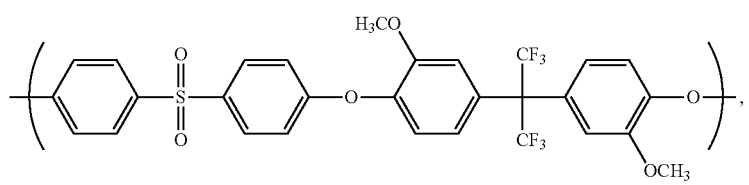
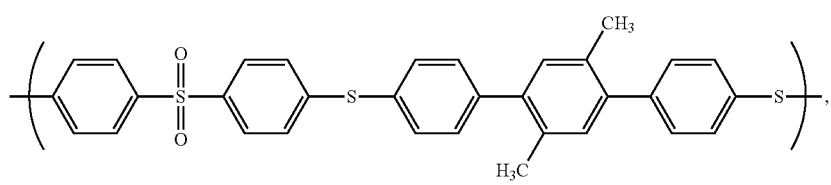
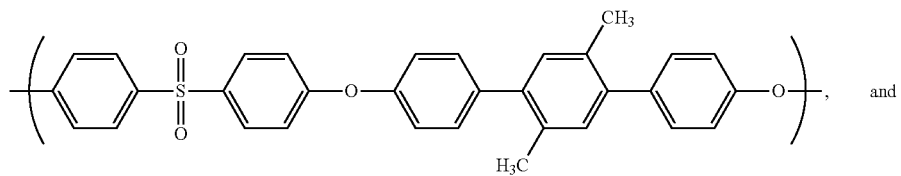, and
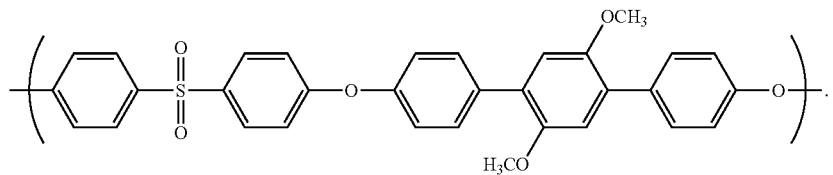

8. The device of claim 7, wherein W is a divalent diphenyl group including at least one substituted phenyl group.
9. The device of claim 8, wherein the polymer having formula (II) is selected from the group consisting of:
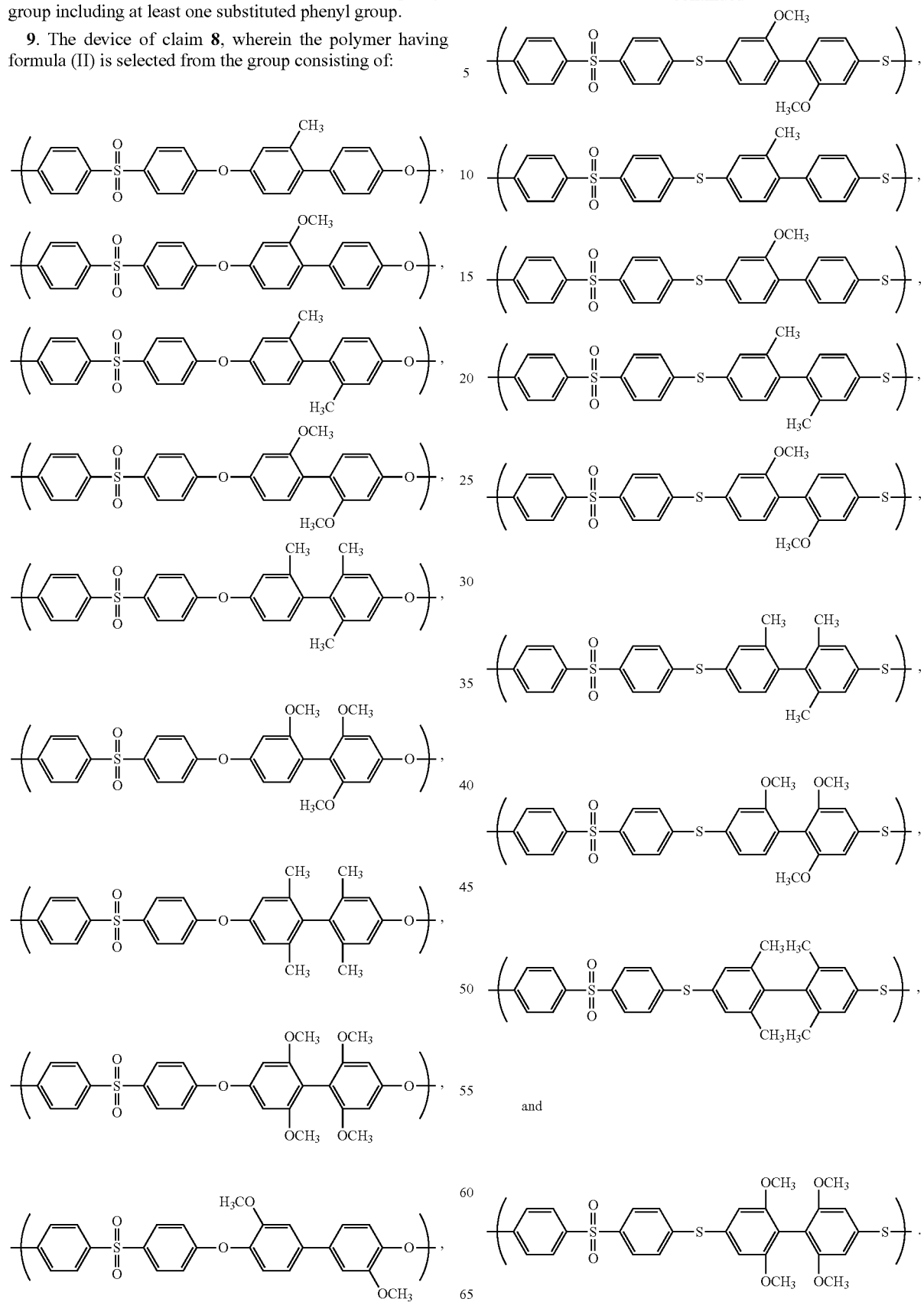
and 10. The device of claim 1, wherein the polysulfone-based material comprises a polymer having formula (III):

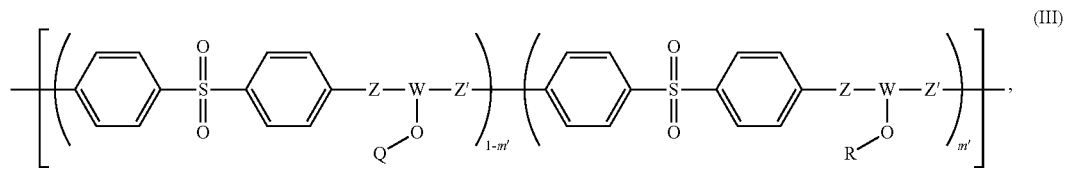

wherein:

L, at each occurrence, independently is selected from the group consisting of —O—, —S—, a divalent $C_{1-10}$ alkyl group, a divalent $C_{6-18}$ aryl group, and a covalent bond;

Q is a crosslinkable group comprising an ethenyl moiety, an ethynyl moiety, a dienyl moiety, an acrylate moiety, a coumarinyl moiety, or an epoxy moiety;

R is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;

$0 \leq m' < 1$; and

W, Z and Z' are as defined in claim 1.

11. The device of claim 10, wherein Q is selected from the group consisting of:

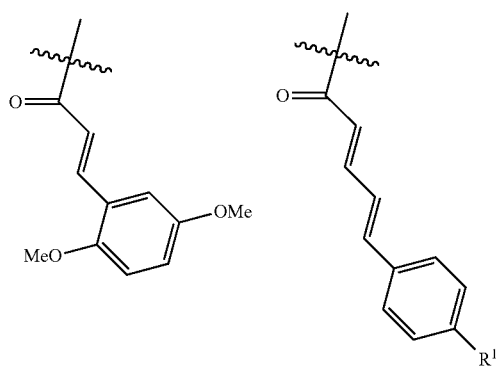

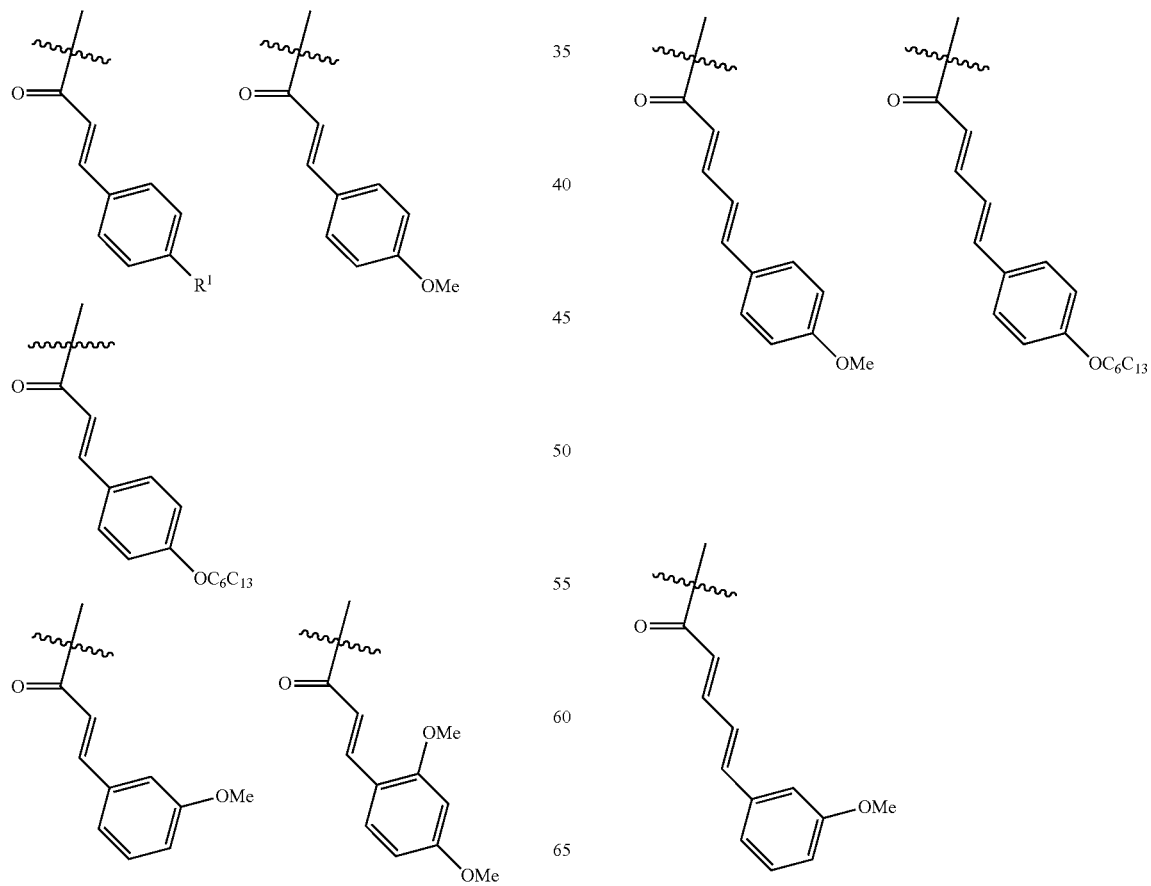

109
-continued
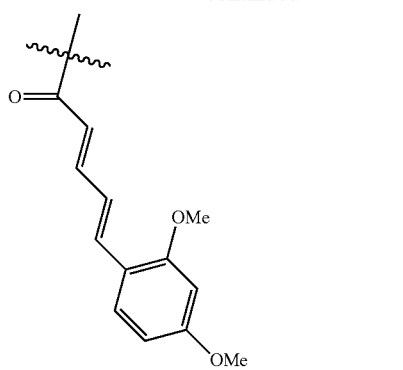
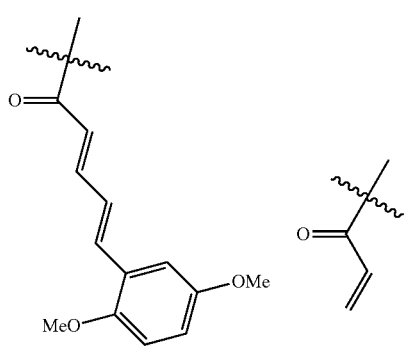
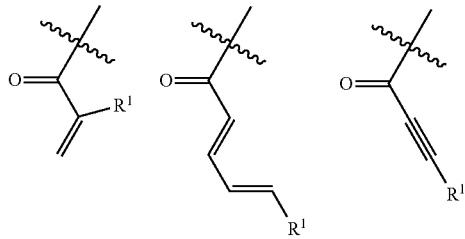
110
-continued
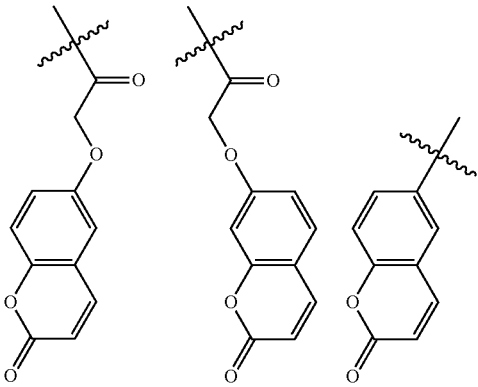
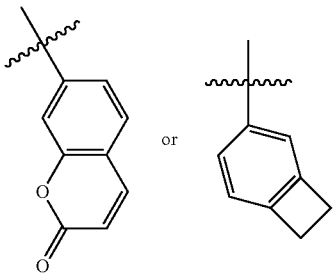
wherein $R^1$ is H or a $C_{1-20}$ alkyl group.
12. The device of claim 1, wherein the polysulfone-based material comprises a polymer having formula (V):
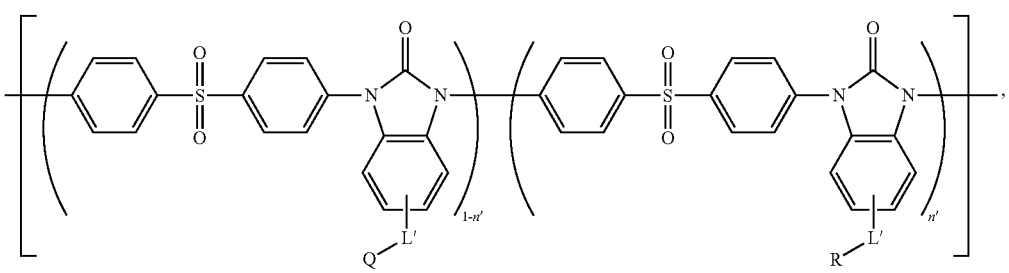

wherein:

L', at each occurrence, independently is selected from the group consisting of —O—, —S—, a divalent $C_{1-10}$ alkyl group, a divalent $C_{6-18}$ aryl group, and a covalent bond;

Q is a crosslinkable group comprising an ethenyl moiety, an ethynyl moiety, a dienyl moiety, an acrylate moiety, a coumarinyl moiety, or an epoxy moiety;

R is selected from the group consisting of H, a halogen, a $C_{1-10}$ alkyl group, a $C_{1-10}$ haloalkyl group, and a $C_{6-10}$ aryl group optionally substituted with 1 to 5 substituents independently selected from the group consisting of a halogen and CN;

$0 \leq n' < 1$.

13. The device of claim 12, wherein L' is —O— or a covalent bond; and Q is selected from the group consisting of:

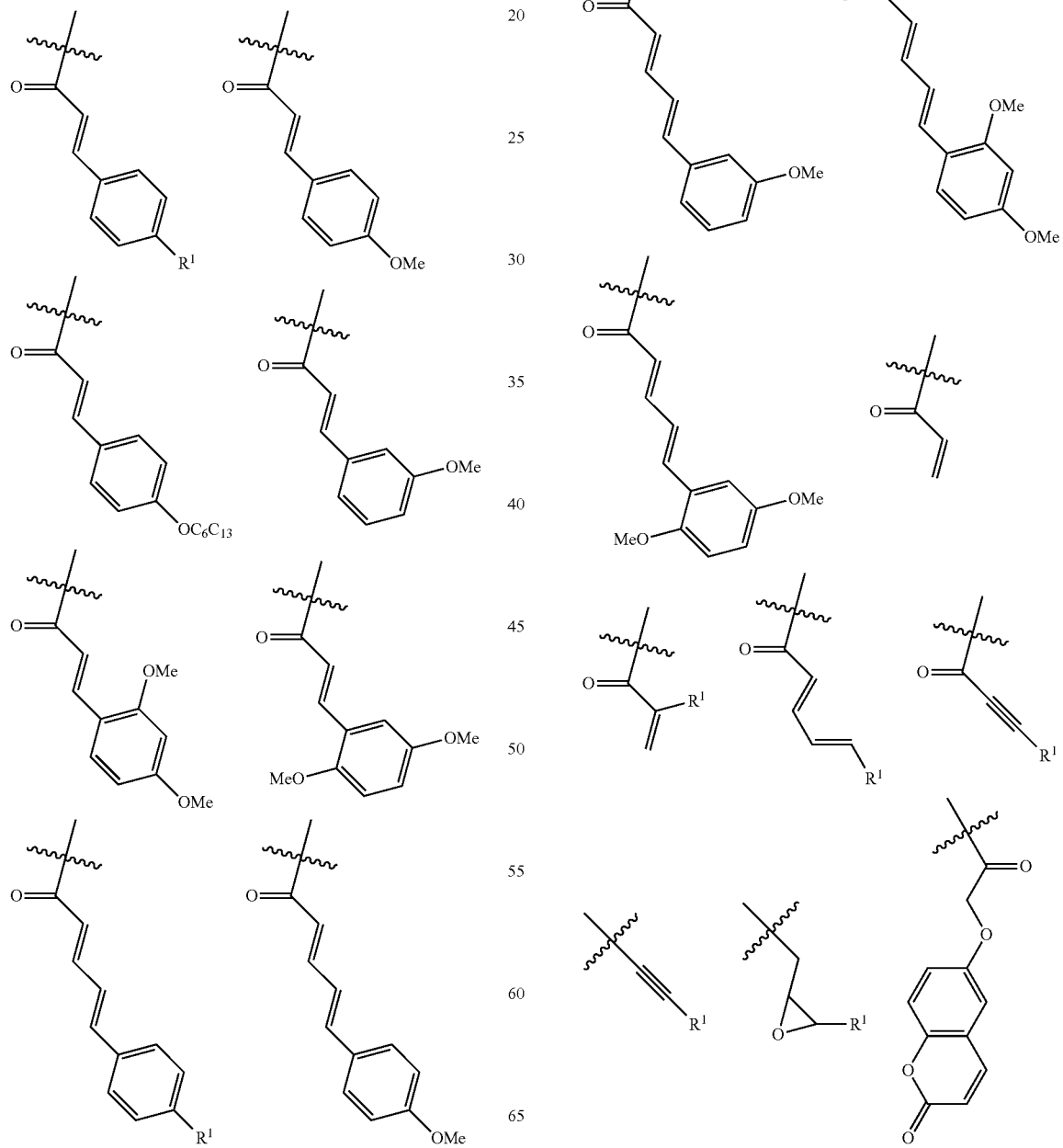

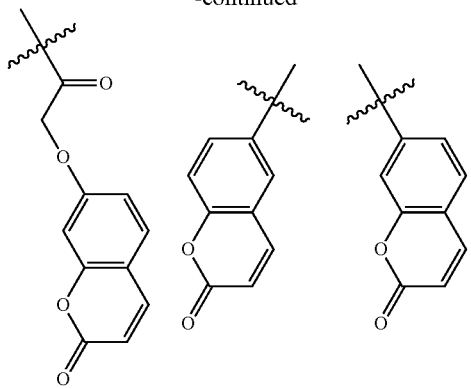 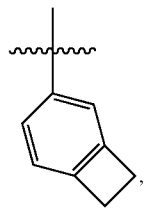
wherein R¹ is H or a $C_{1\text{-}20}$ alkyl group.
14. The device of claim 1, wherein the polysulfone-based material comprises a polymer having the formula:
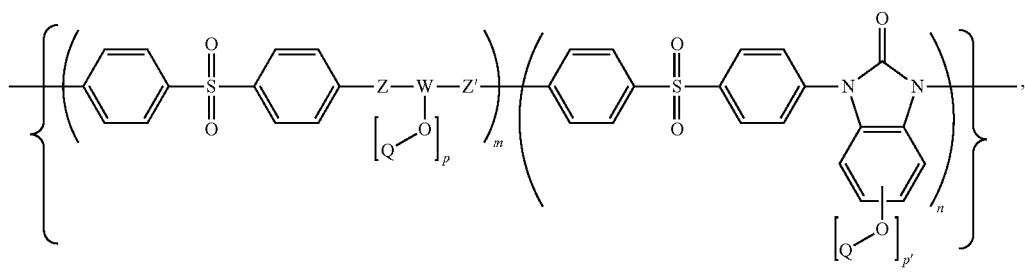
wherein Q, W, Z, Z', p, p', m and n are as defined in claim 1.
15. The device of claim 1, wherein the polysulfone-based material comprises a polymer having the formula:
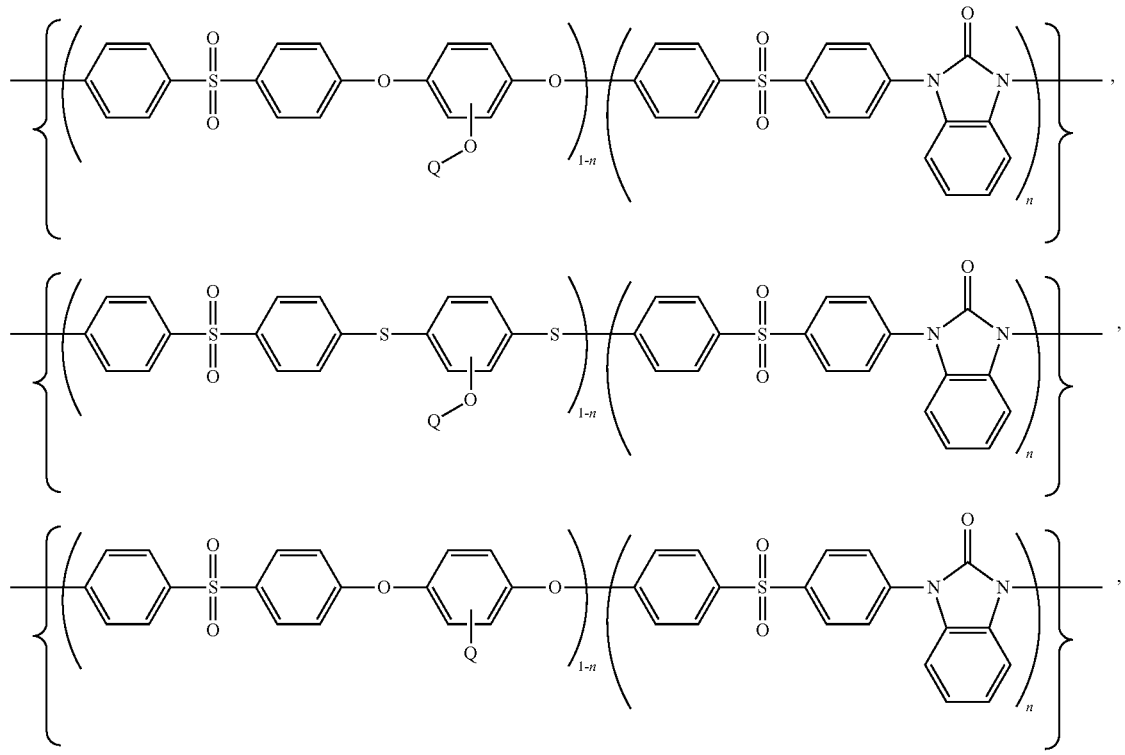

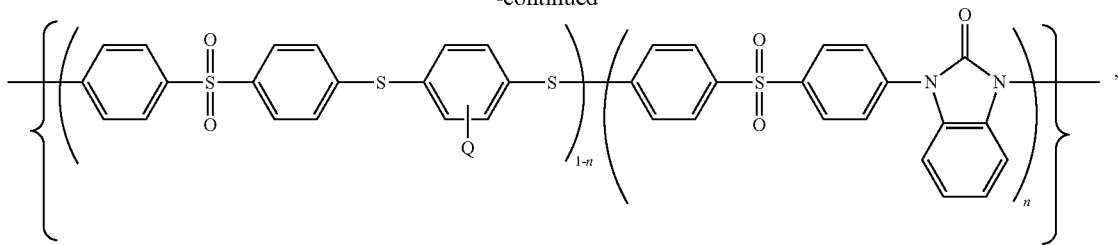
wherein 0<n<1, and Q is as defined in claim 1.
16. The device of claim 1, wherein the polysulfone-based material comprises a polymer having the formula:
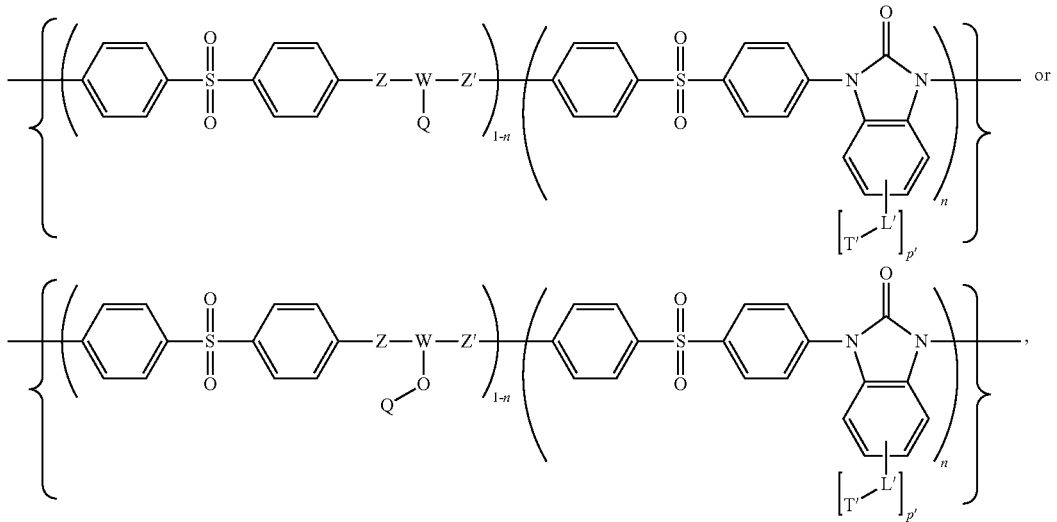
wherein 0<n<1, and L', Q, T', W, Z, Z' and p' are as defined in claim 1.
17. The device of claim 16, wherein Q is selected from the group consisting of:
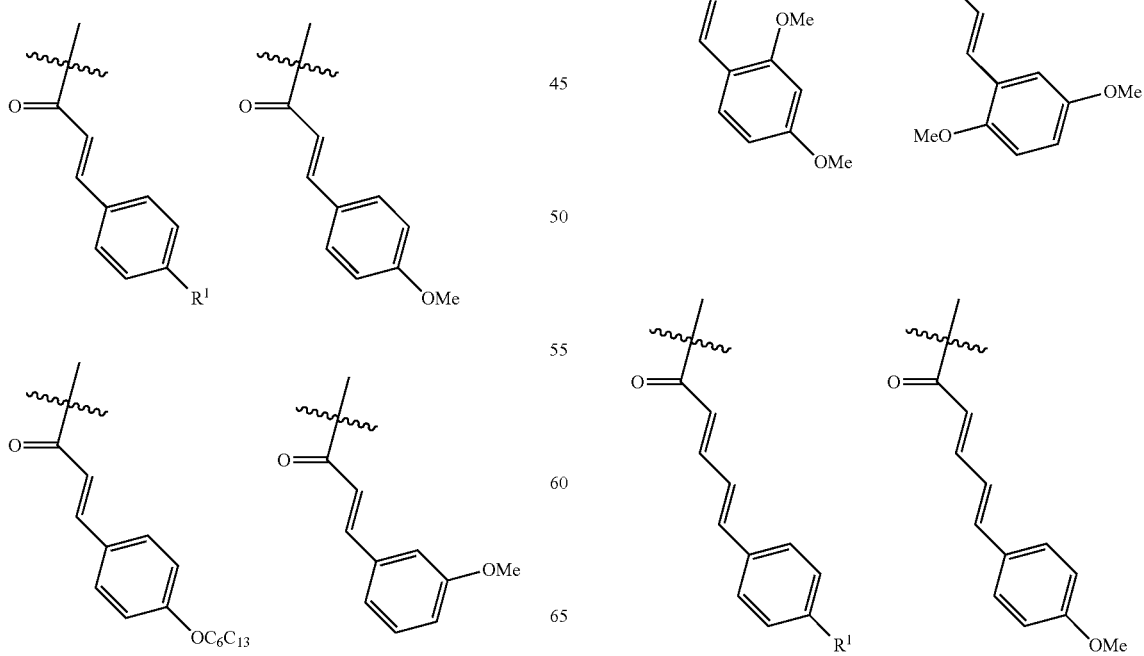

117
-continued
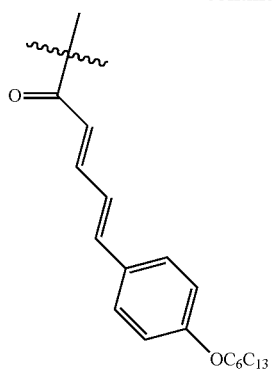
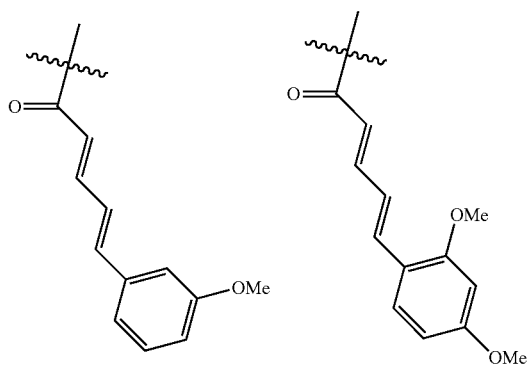
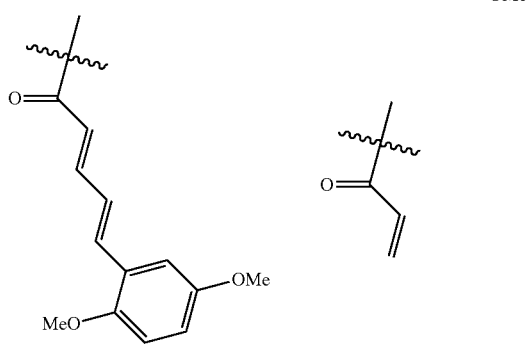
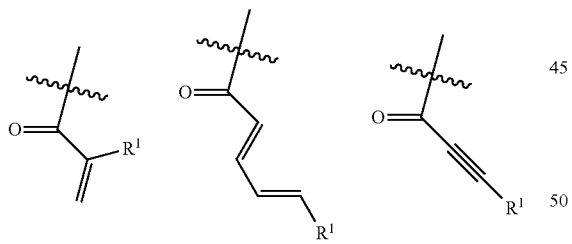
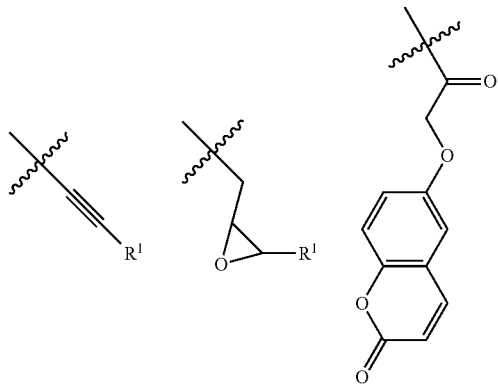
118
-continued
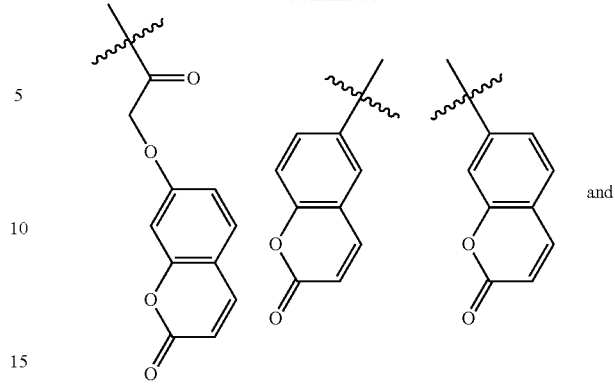
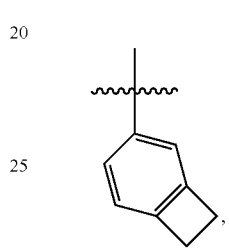
wherein $R^1$ is selected from the group consisting of H, F, CN, a $C_{1-10}$ alkyl group, a $C_{1-10}$ haloalkyl group, and a $C_{1-10}$ alkoxy group.
18. The device of claim 1, wherein the polysulfone-based material comprises a polymer having the formula:
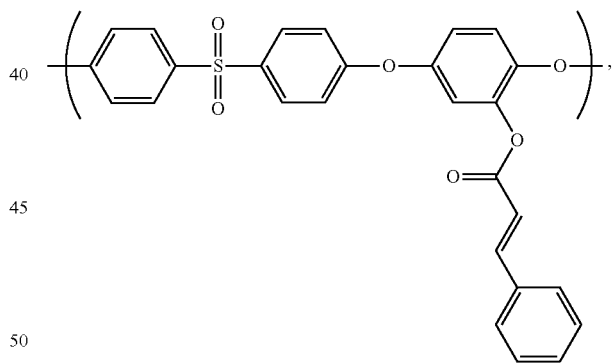
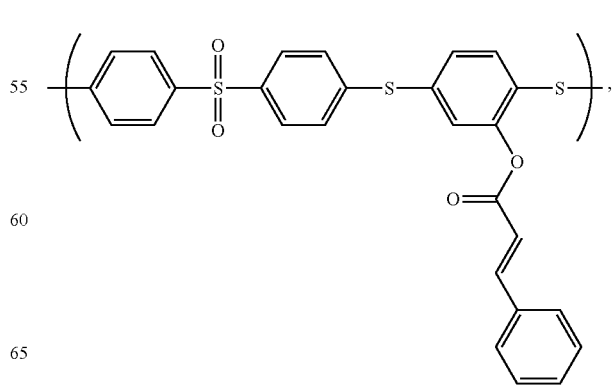

-continued
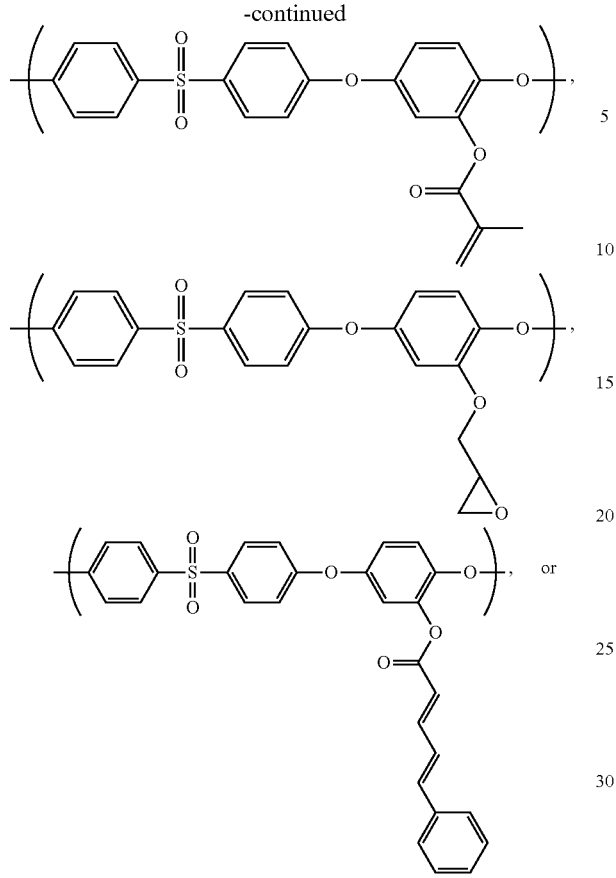
-continued
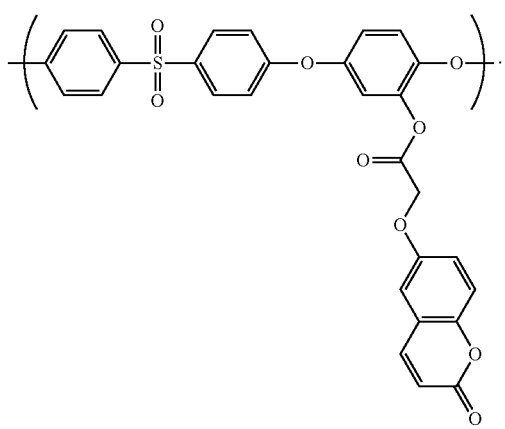
19. The device of claim 1, wherein the passivation layer comprises the polysulfone-based material.
20. The device of claim 1, wherein the channel layer comprises a metal oxide semiconductor comprising indium-gallium-zinc oxide.
* * * * *